United States Patent
Kim et al.

(10) Patent No.: US 10,872,879 B2
(45) Date of Patent: Dec. 22, 2020

(54) SEMICONDUCTOR PACKAGE AND MANUFACTURING METHOD THEREOF

(71) Applicant: Amkor Technology Singapore Holding Pte. Ltd., Singapore (SG)

(72) Inventors: Jin Seong Kim, Goyang-si (KR); Edwin J. Adlam, Phoenix, AZ (US); Ludovico E. Bancod, Chandler, AZ (US); Gi Jung Kim, Kyunggi-do (KR); Robert Lanzone, Chandler, AZ (US); Jae Ung Lee, Seoul (KR); Yung Woo Lee, Anyang-si (KR); Mi Kyeong Choi, Seoul (KR)

(73) Assignee: Amkor Technology Singapore Holding Pte. Ltd., Singapore (SG)

( * ) Notice: Subject to any disclaimer, the term of this patent is extended or adjusted under 35 U.S.C. 154(b) by 100 days.

(21) Appl. No.: 16/037,686

(22) Filed: Jul. 17, 2018

(65) Prior Publication Data
US 2018/0323170 A1     Nov. 8, 2018

Related U.S. Application Data

(63) Continuation-in-part of application No. 15/871,617, filed on Jan. 15, 2018, now Pat. No. 10,163,867, (Continued)

(30) Foreign Application Priority Data

Nov. 12, 2015 (KR) .......................... 10-2015-0159058

(51) Int. Cl.
*H01L 25/065* (2006.01)
*H01L 23/552* (2006.01)
(Continued)

(52) U.S. Cl.
CPC ...... *H01L 25/0652* (2013.01); *H01L 21/4853* (2013.01); *H01L 21/56* (2013.01);
(Continued)

(58) Field of Classification Search
CPC ..................................................... H01L 25/065
See application file for complete search history.

(56) References Cited

U.S. PATENT DOCUMENTS 8,420,437 B1   4/2013  Fan
8,901,718 B2  12/2014  Cho
(Continued)

FOREIGN PATENT DOCUMENTS

KR   10-2015-0000173   1/2013
KR   10-2013-0008666   1/2015
(Continued)

OTHER PUBLICATIONS

Search Report dated Nov. 3, 2019 of Taiwan Patent Application No. 105117130.
(Continued)

*Primary Examiner* — Marvin Payen
(74) *Attorney, Agent, or Firm* — McAndrews, Hein & Malloy, Ltd.

(57) ABSTRACT

A semiconductor package and a method of manufacturing a semiconductor package. As a non-limiting example, various aspects of this disclosure provide a semiconductor package, and method of manufacturing thereof, that comprises shielding on multiple sides thereof.

20 Claims, 26 Drawing Sheets

Related U.S. Application Data which is a continuation-in-part of application No. 15/149,144, filed on May 8, 2016, now Pat. No. 9,935,083.

(51) Int. Cl.

| | | |
|---|---|---|
| *H01L 23/31* | (2006.01) | |
| *H01L 21/56* | (2006.01) | |
| *H01L 21/48* | (2006.01) | |
| *H01L 23/498* | (2006.01) | |
| *H01L 25/00* | (2006.01) | |
| *H01L 23/00* | (2006.01) | |
| *H01L 23/538* | (2006.01) | |

(52) U.S. Cl.
CPC .......... *H01L 23/31* (2013.01); *H01L 23/3128* (2013.01); *H01L 23/49811* (2013.01); *H01L 23/552* (2013.01); *H01L 25/50* (2013.01); H01L 21/561 (2013.01); H01L 23/49827 (2013.01); H01L 23/5383 (2013.01); H01L 23/5384 (2013.01); H01L 24/16 (2013.01); H01L 24/32 (2013.01); H01L 24/48 (2013.01); H01L 24/73 (2013.01); H01L 24/97 (2013.01); H01L 2224/16227 (2013.01); H01L 2224/32145 (2013.01); H01L 2224/32225 (2013.01); H01L 2224/48091 (2013.01); H01L 2224/48227 (2013.01); H01L 2224/73204 (2013.01); H01L 2224/73253 (2013.01); H01L 2224/73265 (2013.01); H01L 2224/97 (2013.01); H01L 2225/0651 (2013.01); H01L 2225/06513 (2013.01); H01L 2225/06517 (2013.01); H01L 2225/06537 (2013.01); H01L 2225/06548 (2013.01); H01L 2225/06572 (2013.01); H01L 2924/15153 (2013.01); H01L 2924/15159 (2013.01); H01L 2924/19105 (2013.01); H01L 2924/19106 (2013.01); H01L 2924/3025 (2013.01)

(56) References Cited

U.S. PATENT DOCUMENTS

| | | |
|---|---|---|
| 9,070,693 B2 | 6/2015 | Cho |
| 9,935,083 B2 | 4/2018 | Kim et al. |
| 2013/0127025 A1 | 5/2013 | Cho |
| 2014/0299976 A1 | 10/2014 | Cho |
| 2017/0141081 A1 | 5/2017 | Lee et al. |
| 2018/0138155 A1 | 5/2018 | Kim et al. |

FOREIGN PATENT DOCUMENTS

| | | |
|---|---|---|
| KR | 20150000173 | 1/2015 |
| KR | 10-2015-0014568 | 2/2015 |

OTHER PUBLICATIONS

Korean Office Action dated Aug. 1, 2017 for Korean Patent Application No. 10-2017-0024100.
Korean Patent Office, Notice of Allowance in Application No. 10-2015-0159058, dated Jan. 6, 2017 (5 pages).
Korean Office Action dated Aug. 10, 2016 for Korean Patent Application No. 10-2015-0159058.

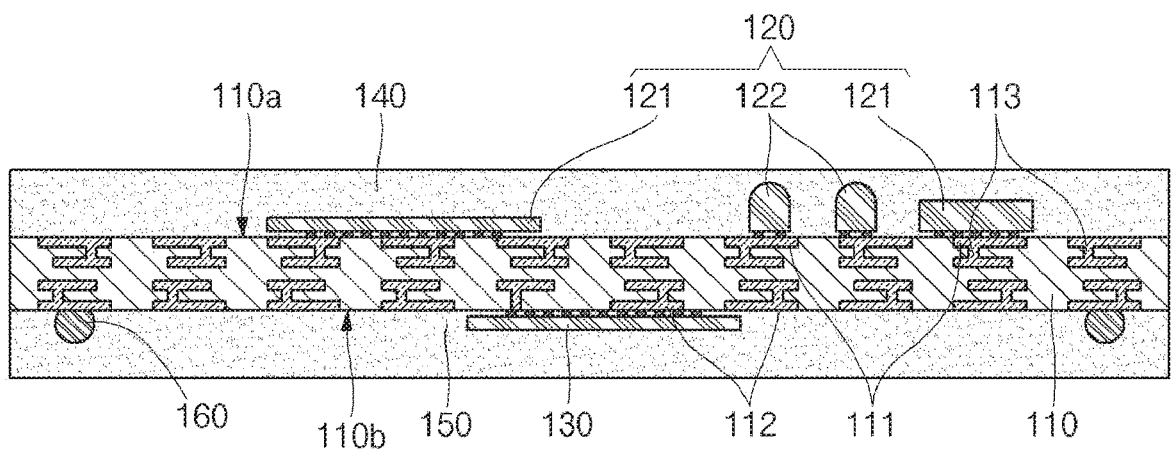
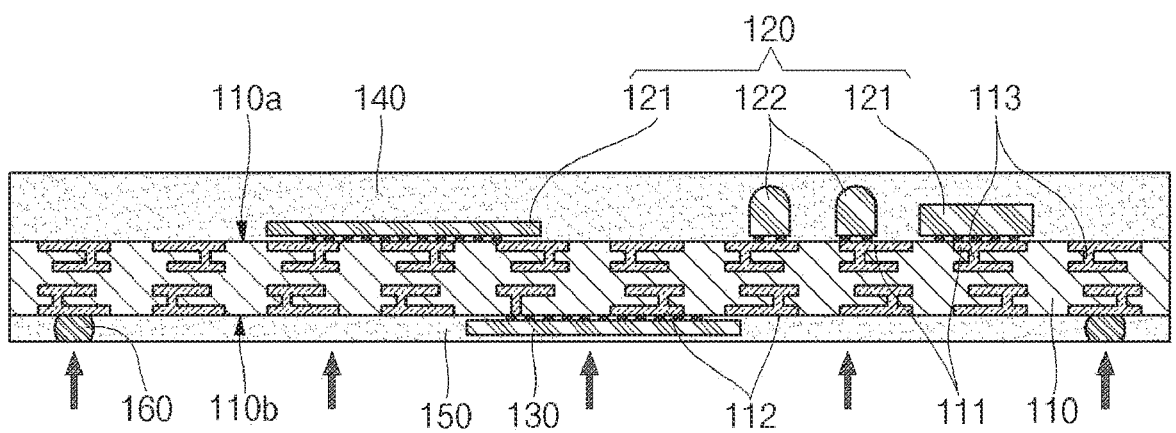

SEMICONDUCTOR PACKAGE AND MANUFACTURING METHOD THEREOF

CROSS-REFERENCE TO RELATED APPLICATIONS & INCORPORATION BY REFERENCE

The present application is a continuation-in-part of U.S. patent application Ser. No. 15/871,617, filed on Jan. 15, 2018, and titled "SEMICONDUCTOR PACKAGE AND MANUFACTURING METHOD THEREOF", which is a continuation-in-part of U.S. patent application Ser. No. 15/149,144, filed on May 8, 2016, and titled "SEMICONDUCTOR PACKAGE AND MANUFACTURING METHOD THEREOF" now U.S. Pat. No. 9,935,083, which makes reference to, claims priority to, and claims the benefit of Korean Patent Application No. 10-2015-0159058 filed on Nov. 12, 2015, in the Korean Intellectual Property Office and titled "SEMICONDUCTOR PACKAGE AND METHOD FOR MANUFACTURING THE SAME," the contents of each of which are incorporated herein by reference in their entirety.

BACKGROUND

Present semiconductor packages and methods for forming semiconductor packages are inadequate, for example resulting in excess cost, decreased reliability, inadequate shielding, package sizes that are too large, etc. Further limitations and disadvantages of conventional and traditional approaches will become apparent to one of skill in the art, through comparison of such approaches with the present disclosure as set forth in the remainder of the present application with reference to the drawings.

BRIEF DESCRIPTION OF THE DRAWINGS

FIGS. 3A to 3E are cross-sectional views illustrating various steps of the method for manufacturing the semiconductor package illustrated in FIG. 2.

SUMMARY

Figure 1:
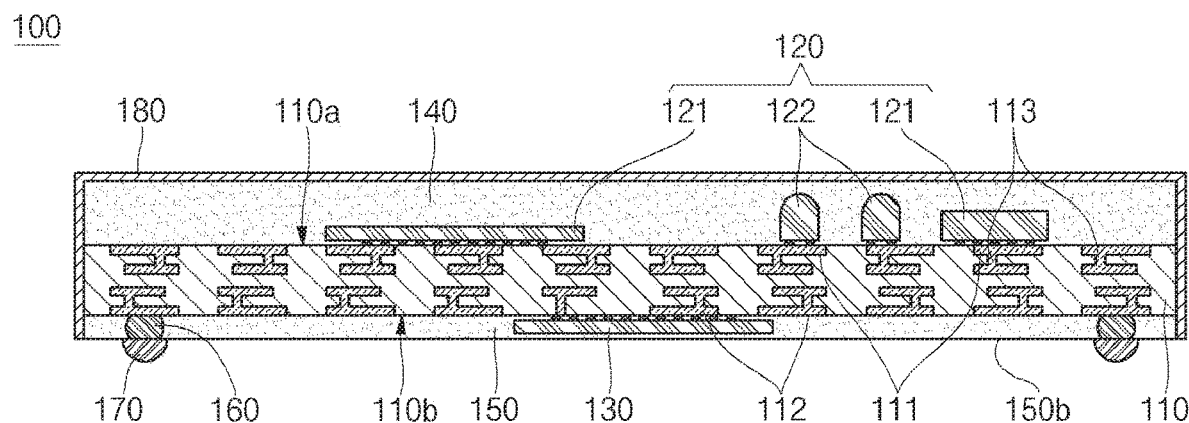
FIG. 1 is a cross-sectional view illustrating a semiconductor package according to an embodiment of the present disclosure.

Various aspects of this disclosure provide a semiconductor package and a method of manufacturing a semiconductor package. As a non-limiting example, various aspects of this disclosure provide a semiconductor package, and method of manufacturing thereof, that comprises shielding on multiple sides thereof.

DETAILED DESCRIPTION

The following discussion presents various aspects of the present disclosure by providing examples thereof. Such examples are non-limiting, and thus the scope of various aspects of the present disclosure should not necessarily be limited by any particular characteristics of the provided examples. In the following discussion, the phrases "for example," "e.g.," and "exemplary" are non-limiting and are generally synonymous with "by way of example and not limitation," "for example and not limitation," and the like.

As utilized herein, "and/or" means any one or more of the items in the list joined by "and/or". As an example, "x and/or y" means any element of the three-element set {(x), (y), (x, y)}. In other words, "x and/or y" means "one or both of x and y." As another example, "x, y, and/or z" means any element of the seven-element set {(x), (y), (z), (x, y), (x, z), (y, z), (x, y, z)}. In other words, "x, y and/or z" means "one or more of x, y, and z."

The terminology used herein is for the purpose of describing particular examples only and is not intended to be limiting of the disclosure. As used herein, the singular forms are intended to include the plural forms as well, unless the context clearly indicates otherwise. It will be further understood that the terms "comprises," "includes," "comprising," "including," "has," "have," "having," and the like when used in this specification, specify the presence of stated features, integers, steps, operations, elements, and/or components, but do not preclude the presence or addition of one or more other features, integers, steps, operations, elements, components, and/or groups thereof.

It will be understood that, although the terms first, second, etc. may be used herein to describe various elements, these elements should not be limited by these terms. These terms are only used to distinguish one element from another element. Thus, for example, a first element, a first component or a first section discussed below could be termed a second element, a second component or a second section without departing from the teachings of the present disclosure. Similarly, various spatial terms, such as "upper," "lower," "side," and the like, may be used in distinguishing one element from another element in a relative manner. It should be understood, however, that components may be oriented in different manners, for example a semiconductor device may be turned sideways so that its "top" surface is facing horizontally and its "side" surface is facing vertically, without departing from the teachings of the present disclosure.

In the drawings, the thickness or size of layers, regions, and/or components may be exaggerated for clarity. Accordingly, the scope of this disclosure should not be limited by such thickness or size. Additionally, in the drawings, like reference numerals may refer to like elements throughout the discussion. Elements numbered with an apostrophe (') can be similar to correspondingly numbered elements without apostrophe.

It will also be understood that when an element A is referred to as being "connected to" or "coupled to" an element B, the element A can be directly connected to the element B or indirectly connected to the element B (e.g., an intervening element C (and/or other elements) may be present between the element A and the element B).

Certain embodiments of the disclosure relate to a semiconductor package and a method for manufacturing the same.

Various electronic devices for exchanging signals as well as a plurality of semiconductor packages manufactured in various structures are integrated in various electronic systems, and thus electromagnetic interference (EMI) may be unavoidably generated while electrically operating the semiconductor packages and the electronic devices.

EMI may be generally defined as a synthetic radiation of an electric field and a magnetic field. The EMI may be generated by an electric field formed by the current flowing in a conducting material and a magnetic field.

If the EMI is generated from the semiconductor packages and the electronic devices densely packed on a motherboard, other neighboring semiconductor packages may be directly or indirectly affected by the EMI and may be damaged.

Various aspects of the present disclosure provide a semiconductor package and a method for manufacturing the same, which can prevent warpage by forming a molding on both surfaces of a substrate and can shield electromagnetic interference (EMI) by an EMI shielding layer formed to cover the molding and the substrate.

According to an aspect of the present disclosure, there is provided a semiconductor package including a substrate having a first surface and a second surface opposite to the first surface, at least one first electronic device formed on the first surface and electrically connected to the substrate, a first molding formed on the first surface to cover the first electronic device, a second molding formed to cover the second surface, a plurality of first conductive bumps formed on the second surface and electrically connected to the substrate and passing through the second molding, an electromagnetic interference (EMI) shielding layer formed to surround surfaces of the substrate, the first molding and the second molding to be spaced apart from the first conductive bumps, and a plurality of second conductive bumps formed on one surface of the second molding to be electrically connected to the plurality of first conductive bumps, respectively.

According to another aspect of the present disclosure, there is provided a method for manufacturing a semiconductor package including a substrate having a first surface and a second surface opposite to the first surface, at least one first electronic device formed on the first surface and electrically connected to the substrate, and a plurality of first conductive bumps formed on the second surface and electrically connected to the substrate, the method including forming a first molding on the first surface to cover the first electronic device and forming a second molding on the second surface to cover the first conductive bumps, grinding the second molding to expose the plurality of first conductive bumps to the outside, forming a plurality of second conductive bumps electrically connected to the exposed plurality of first conductive bumps, respectively, placing a jig under the second molding to surround the plurality of second conductive bumps, and forming an EMI shielding layer to cover surfaces of the substrate, the first molding and the second molding, which are exposed to the outside through the jig.

According to still another aspect of the present disclosure, there is provided a method for manufacturing a semiconductor package including a substrate having a first surface and a second surface opposite to the first surface, at least one first electronic device formed on the first surface and electrically connected to the substrate, and a plurality of first conductive bumps formed on the second surface and electrically connected to the substrate, the method including forming a first molding on the first surface to cover the first electronic device and forming a second molding on the second surface to cover the first conductive bumps, grinding the second molding to expose the plurality of first conductive bumps to the outside, forming an EMI shielding layer to entirely cover surfaces of the substrate, the first molding and the second molding, forming a plurality of exposing holes in the EMI shielding layer to expose the plurality of first conductive bumps to the outside, and forming a plurality of second conductive bumps electrically connected to the exposed plurality of first conductive bumps through the plurality of exposing holes, respectively.

In one example, a method of manufacture can include providing a substrate comprising: a substrate top surface having a substrate top first pad and a substrate top second pad, a substrate bottom surface having a substrate bottom first pad and a substrate bottom second pad, and a substrate lateral surface. The method can also include attaching a first electronic device to the substrate top surface, the first electronic device coupled to the substrate top first pad and comprising a first device first surface facing the substrate top surface, a first device lateral surface, and a first device second surface facing away from the substrate top surface. The method can also include coupling a first passive component to the substrate top second pad, and applying a first encapsulant to encapsulate the substrate top surface, the first passive component, and the first electronic device, where the first encapsulant has a first encapsulant top surface, and a first encapsulant lateral surface. The method can also include attaching a second electronic device to the substrate bottom surface, the second electronic device coupled to the substrate bottom first pad and comprising a second device first surface facing the substrate bottom side, a second device lateral surface, and a second device second surface facing away from the substrate bottom surface. The method can also include providing a first external interconnect coupled to the substrate bottom second pad, and applying a second encapsulant to encapsulate the substrate bottom surface and the second electronic device, the second encapsulant comprising a second encapsulant lateral surface. In one example, the method can also include applying a first electromagnetic interference (EMI) shield as a layer that bounds at least: the first encapsulant top surface, the first encapsulant lateral surface, and the substrate lateral surface, wherein the first EMI shield is spaced apart from the external interconnect. In the same or another example, the method can also include applying an electromagnetic interference (EMI) shield surrounding a perimeter of the second device, in contact with the second encapsulant, and exclusive of sheet metal.

In one example, a semiconductor package can include a substrate having a substrate top surface having a substrate top first pad and a substrate top second pad, a substrate bottom surface having a substrate bottom first pad and a substrate bottom second pad, and a substrate lateral surface. The package can also include a first electronic device on the substrate top surface and coupled to the substrate top first pad, the first electronic device comprising: a first device first surface facing the substrate top surface, a first device lateral surface, and a first device second surface facing away from the substrate top surface. The package can also include a first passive component coupled to the substrate top second pad, and a first encapsulant that encapsulates the substrate top surface, the passive component, and the first electronic device, the first encapsulant having a first encapsulant top surface, and a first encapsulant lateral surface. The package can also include a second electronic device on the substrate bottom surface and coupled to the substrate bottom first pad, the second electronic device comprising: a second device first surface facing the substrate bottom surface, a second device lateral surface, and a second device second surface facing away from the substrate bottom surface. The package can also include a first external interconnect coupled to the substrate bottom second pad and comprising a first external interconnect height, and a second encapsulant that encapsulates the substrate bottom surface and the second electronic device, the second encapsulant comprising: a second encapsulant lateral surface, and a second encapsulant height, where the first external interconnect height protrudes further than the second encapsulant height. The package can also include a first electromagnetic interference (EMI) shield that bounds at least: the first encapsulant top surface, the first encapsulant lateral surface, and the substrate lateral surface, wherein the first EMI shield is spaced apart from the external interconnect.

In one example, a method of manufacture can comprise providing a substrate having a substrate top surface having a substrate top first pad and a substrate top second pad, a substrate bottom surface having a substrate third pad and a substrate interconnect pad, and a substrate lateral surface; providing a first device on the substrate top surface and coupled to the substrate top first pad, the first device comprising a first device bottom surface facing the substrate top surface, a first device lateral surface, and a first device top surface facing away from the substrate top surface; providing a second device component coupled to the substrate top second pad; providing a first encapsulant to encapsulate the substrate top surface, the first device, and the second device, the first encapsulant having: a first encapsulant top surface, and a first encapsulant lateral surface; attaching a third device to the substrate third pad on the substrate bottom surface, the third device comprising: a third device top surface facing the substrate bottom surface, a third device lateral surface, and a third device bottom surface facing away from the substrate bottom surface; providing a first interconnect on the substrate bottom surface and coupled to the substrate interconnect pad, the first interconnect comprising an interconnect protruded section and providing external interface to the semiconductor package; and applying a second encapsulant to encapsulate the substrate bottom surface and at least partially the third device and the first interconnect, the second encapsulant comprising: a second encapsulant bottom surface, and a second encapsulant lateral surface; wherein the interconnect protruded section protrudes past the second encapsulant bottom surface; at least one of the first, second, or third devices is an electronic device; and at least one of the first, second, or third devices is a passive component.

In one example, a semiconductor package can comprise a substrate having a substrate top surface having a substrate top first pad and a substrate top second pad, a substrate bottom surface having a substrate third pad and a substrate interconnect pad, and a substrate lateral surface; a first device on the substrate top surface and coupled to the substrate top first pad, the first device comprising: a first device bottom surface facing the substrate top surface, a first device lateral surface, and a first device top surface facing away from the substrate top surface; a second device component coupled to the substrate top second pad; a first encapsulant that encapsulates the substrate top surface, the first device, and the second device, the first encapsulant having a first encapsulant top surface, and a first encapsulant lateral surface; a third device on the substrate bottom surface and coupled to the substrate third pad, the third device comprising: a third device top surface facing the substrate bottom surface, a third device lateral surface, and a third device bottom surface facing away from the substrate bottom surface; a first interconnect on the substrate bottom surface and coupled to the substrate interconnect pad, the first interconnect comprising an interconnect protruded section and providing external interface to the semiconductor package; a second encapsulant that encapsulates the substrate bottom surface and at least partially the third device and the first interconnect, the second encapsulant comprising a second encapsulant bottom surface, and a second encapsulant lateral surface; and a first electromagnetic interference (EMI) shield that bounds at least the first encapsulant top surface, the first encapsulant lateral surface, and the substrate lateral surface; wherein the third device bottom surface is exposed from the second encapsulant; the interconnect protruded section protrudes past the second encapsulant bottom surface; at least one of the first, second, or third devices is an electronic device; and at least one of the first, second, or third devices is a passive component.

In one example, a method can comprise providing an upper device attached to a substrate, the substrate having a substrate top side to which the upper device is attached, a substrate lateral surface, and a substrate bottom side opposite the substrate top side; the upper device having an upper device bottom side attached to the substrate top side, an upper device lateral surface, and an upper device top side opposite the upper device bottom side; providing a first encapsulant that encapsulates the substrate top side and the upper device top side; providing a lower device attached to the substrate bottom side, the lower device comprising a lower device top side having a bump coupled to the substrate bottom surface, a lower device lateral surface, and a lower device bottom side opposite the substrate bottom side; providing a first interconnect attached to the substrate bottom side and laterally displaced from the lower device; providing a second encapsulant that encapsulates the substrate bottom side, the lower device, and the first interconnect; and providing a first electromagnetic interference (EMI) shield that bounds at least a portion of the first encapsulant top surface, and a portion of the first encapsulant lateral surface, wherein the lower device bottom surface is exposed from the second encapsulant; the upper device lateral surface is vertically greater than the lower device lateral surface; at least one of the upper device or the lower device is an electronic device; and at least one of the upper device or the lower device is a passive component.

As described above, in the semiconductor package and the method for manufacturing the same according to the present disclosure, warpage can be prevented by forming a molding on both surfaces of a substrate and electromagnetic interference (EMI) can be shielded by an EMI shielding layer formed to cover the molding and the substrate.

Further embodiments, features, and advantages of the present disclosure, as well as the structure and operation of the various embodiments of the present disclosure, are described in detail below with reference to the accompanying drawings.

Referring to FIG. 1, a cross-sectional view illustrating a semiconductor package according to an embodiment of the present disclosure is illustrated.

As illustrated in FIG. 1, the semiconductor package 100 includes a substrate 110, a first electronic device 120, a second electronic device 130, a first molding 140, a second molding 150, first conductive bumps 160, second conductive bumps 170 and an electric-magnetic interference (EMI) shielding layer 180.

The substrate 110 is shaped of a panel, which has a first surface 110a and a second surface 110b opposite to the first surface 110a. Here, the first surface 110a of the substrate 110 may be a top surface and the second surface 110b may be a bottom surface, and vice versa. The substrate 110 includes a plurality of first wire patterns 111 formed on the first surface 110a and a plurality of second wire patterns 112 formed on the second surface 110b. In addition, the substrate 110 may further include a plurality of conductive patterns 113 electrically connecting the first wire patterns 111 formed on the first surface 110a of the substrate 110 and the second wire patterns 112 formed on the second surface 110b. The conductive patterns 113 may be configured to penetrate between the first surface 110a and the second surface 110b of the substrate 110 or to partially penetrate to connect a plurality of wire patterns formed of multiple layers. That is to say, in a case where the substrate 110 is a single layer, the conductive patterns 113 may directly connect the first wire patterns 111 and the second wire patterns 112 or may connect the first wire patterns 111 and the second wire patterns 112 using additional wire patterns. That is to say, the first wire patterns 111, the second wire patterns 112 and the conductive patterns 113 of the substrate 110 may be implemented in various structures and types, but aspects of the present disclosure are not limited thereto.

The first electronic device(s) 120 is mounted on the first surface 110a of the substrate 110 to be electrically connected to the first wire patterns 111 of the substrate 110. The first electronic device(s) 120 may include semiconductor dies 121 and passive elements 122, which may be modified in various manners according to the type of the semiconductor package 100, but aspects of the present disclosure are not limited thereto. In the following description, the first electronic device 120(s) including two semiconductor dies 121 and two passive elements 122 will be described by way of example. In addition, the semiconductor dies 121 are formed in a flip chip type and may be mounted such that conductive bumps of the semiconductor dies 121 are welded to the first wire patterns 111 of the substrate 110. The semiconductor dies 121 may include bond pads and may be connected to the first wire patterns 111 by wire bonding. However, the present disclosure does not limit the connection relationship between the semiconductor dies 121 and the first wire patterns 111 to that disclosed herein.

The second electronic device(s) 130 is mounted on the second surface 110b of the substrate 110 to be electrically connected to the second wire patterns 112 formed on the substrate 110. The second electronic device 130(s) consisting of a single semiconductor die is illustrated. However, the second electronic device(s) 130 may consist of a plurality of semiconductor dies or may further include a passive element, but aspects of the present disclosure are not limited thereto.

The first molding 140 may be formed on the first surface 110a of the substrate 110 to cover the first electronic device(s) 120 mounted on the first surface 110a of the substrate 110. The first molding 140 may be made of a general molding compound resin, for example, an epoxy-based resin, but the scope of this disclosure is not limited thereto. The first molding 140 may protect the first electronic device 120 from external circumstances.

The second molding 150 may be formed on the second surface 110b of the substrate 110 to cover the second electronic device(s) 130 mounted on the second surface 110b of the substrate 110. The second molding 150 exposes the first conductive bumps 160 formed on the second surface 110b of the substrate 110 to the outside while completely covering the second electronic device(s) 130. The second molding 150 and the first conductive bumps 160 may have the same height. The second molding 150 and the first molding 140 may be made of the same material. The second molding 150 may protect the second electronic device 130 from external circumstances.

The first conductive bumps 160 may include a plurality of first conductive bumps formed on the second surface 110b of the substrate 110 to be electrically connected to the second wire patterns 112 formed on the substrate 110. The first conductive bumps 160 are configured such that side portions thereof are surrounded by the second molding 150 and portions of bottom surfaces thereof are exposed to the outside through the second molding 150. The exposed first conductive bumps 160 are electrically connected to the second conductive bumps 170. That is to say, the first conductive bumps 160 electrically connect the second conductive bumps 170 and the second wire patterns 112 formed on the substrate 110. The first conductive bumps 160 may include conductive pillars, copper pillars, conductive balls or copper balls, but aspects of the present disclosure are not limited thereto.

The second conductive bumps 170 may be formed on a bottom surface of the second molding 150 to be electrically connected to the first conductive bumps 160 exposed to the outside through the second molding 150. In a case where the semiconductor package 100 is mounted on an external device, such as a motherboard, the second conductive bumps 170 may be used in electrically connecting the semiconductor package 100 to the external device.

The EMI shielding layer 180 may be formed to a predetermined thickness enough to entirely cover the semiconductor package 100, except for the bottom surface of the second molding 150. That is to say, the EMI shielding layer 180 is formed to cover all of the top surface and four side surfaces of the semiconductor package 100. In addition, the EMI shielding layer 180 may be made of a conductive material and may be electrically connected to a ground of the semiconductor package 100 or an external ground. The EMI shielding layer 180 may shield EMI induced to (or generated by) the semiconductor package 100. In addition, the semiconductor package 100 may include the first and second moldings 140 and 150 to cover both of the first and second surfaces 110a and 110b of the substrate 110, thereby preventing warpage of the semiconductor package 100, which may occur when a molding is formed only on one surface of the substrate 110.

Figure 2:
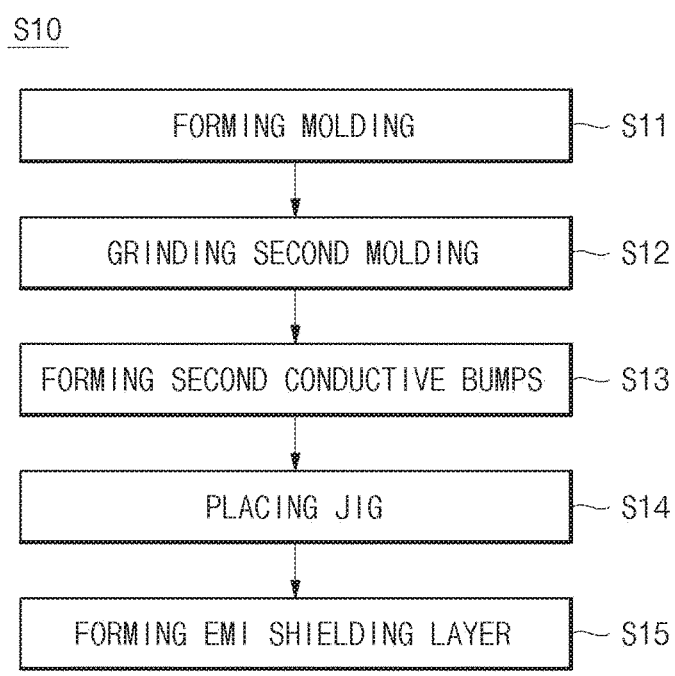
FIG. 2 is a flowchart illustrating a method for manufacturing the semiconductor package illustrated in FIG. 1.

Referring to FIG. 2, a flowchart illustrating a method for manufacturing the semiconductor package illustrated in FIG. 1 is illustrated. As illustrated in FIG. 2, the method for manufacturing the semiconductor package 100 (S10) includes forming a molding (S11), grinding a second molding (S12), forming second conductive bumps (S13), placing a jig (S14) and forming an EMI shielding layer (S15).

Referring to FIGS. 3A to 3E, cross-sectional views illustrating various steps of the method for manufacturing the semiconductor package illustrated in FIG. 2 are illustrated.

First, before the forming of the molding (S11), the first electronic device 120 is mounted on the first surface 110a of the substrate 110 to be electrically connected to the first wire patterns 111, the second electronic device 130 is mounted on the second surface 110b of the substrate 110 to be electrically connected to the second wire patterns 112, and the plurality of first conductive bumps 160 are then formed on the second surface 110b of the substrate 110 to be electrically connected to the second wire patterns 112.

As illustrated in FIG. 3A, in the forming of the molding (S11), the first molding 140 is formed to cover the first surface 110a of the substrate 110 and the first electronic device 120, and the second molding 150 is formed to cover the second surface 110b of the substrate 110, the second electronic device 130 and the plurality of first conductive bumps 160. The first molding 140 and the second molding 150 may be formed at the same time. For example, a mold is placed to surround the substrate 110 including the first electronic device 120, the second electronic device 130 and the first conductive bumps 160, and a molding resin is injected into a space in the mold, thereby forming the first molding 140 and the second molding 150 at the same time. Here, in a state in which the first electronic device 120, the second electronic device 130, the first conductive bumps 160 and the substrate 110 are spaced apart from the inner surface of the mold so as not to contact the inner surface of the mold, the molding resin is injected into the mold, thereby forming the first molding 140 and the second molding 150. That is to say, the first molding 140 is formed to entirely cover the first surface 110a of the substrate 110 and the first electronic device 120, and the second molding 150 is formed to entirely cover the second surface 110b of the substrate 110, the second electronic device 130 and the first conductive bumps 160.

As illustrated in FIG. 3B, in the grinding of the second molding (S12), a bottom surface of the second molding 150 is grinded to expose the first conductive bumps 160 to the outside of the second molding 150. That is to say, in the grinding of the second molding (S12), the second molding 150 is grinded to expose the first conductive bumps 160 to the outside. At this time, bottom portions of the first conductive bumps 160 may also be partially grinded. Bottom surfaces of the first conductive bumps 160 and the bottom surface of the second molding 150 may be coplanar. In addition, the second electronic device 130 may be positioned within the second molding 150 and the second electronic device 130 may, for example, not be exposed to the outside. The grinding may be performed using, for example, a diamond grinder and an equivalent thereof, but aspects of the present disclosure are not limited thereto.

Figure 3C:
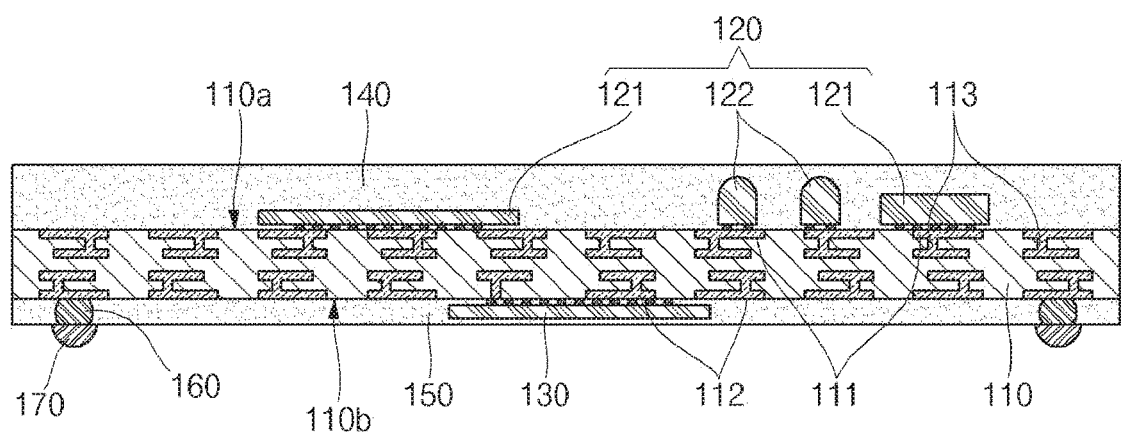

As illustrated in FIG. 3C, in the forming of the second conductive bumps (S13), the plurality of second conductive bumps 170 are formed to be electrically connected to the plurality of first conductive bumps 160 exposed to the outside in the grinding of the second molding (S12), respectively. The second conductive bumps 170 may be formed using one of ball dropping, screen printing, electroplating, vacuum evaporation, plating and equivalents thereof, but aspects of the present disclosure are not limited thereto. In addition, the second conductive bumps 170 may be made of a metallic material, such as lead/tin (Pb/Sn) or leadless Sn, and equivalents thereof, but aspects of the present disclosure are not limited thereto.

Figure 3D:
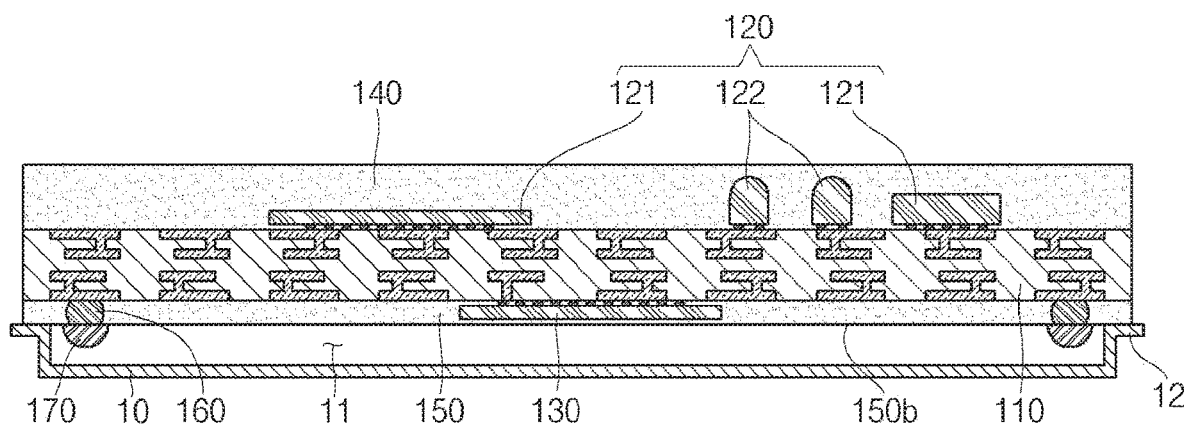

As illustrated in FIG. 3D, in the placing of the jig (S14), the jig 10 is loaded and placed to cover the bottom surface 150b of the second molding 150. The jig 10 is shaped of a substantially rectangular frame and may have an internal space 11 having a predetermined depth in a top-to-bottom direction and a planar part 12 outwardly extending a predetermined length along the outer circumference. The planar part 12 may be brought into contact with the outer circumference of the bottom surface 150b of the second molding 150 to then be fixed, the second conductive bumps 170 formed on the bottom surface 150b of the second molding 150 may be inserted into the internal space 11. That is to say, in the placing of the jig (S14), the jig 10 is placed to cover the bottom surface 150b of the second molding 150, and the first molding 140, the side surface of the substrate 110 and the side surface of the second molding 150 are exposed to the outside.

Figure 3E:
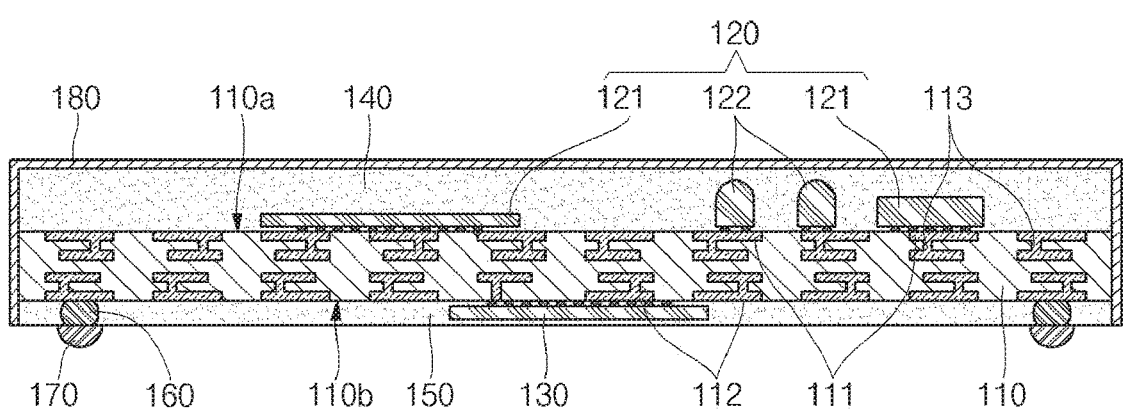

As illustrated in FIG. 3E, in the forming of the EMI shielding layer (S15), EMI shielding layer 180 is formed on the first molding 140, the side surface of the substrate 110 and the side surface of the second molding 150, which are exposed to the outside in the placing of the jig (S14). The EMI shielding layer 180 is formed to entirely cover all of the first molding 140, the side surface of the substrate 110 and the side surface of the second molding 150, except for the bottom surface 150b of the second molding 150 covered by the jig 10. That is to say, the EMI shielding layer 180 is formed to entirely cover four side surfaces and the top surface of the semiconductor package 100, except for the bottom surface of the semiconductor package 100. The EMI shielding layer 180 may be formed to a predetermined thickness by plasma deposition or spraying, but aspects of the present disclosure are not limited thereto. In addition, after the forming of the EMI shielding layer (S15), in order to remove metal residuals produced in the forming of the EMI shielding layer 180 made of a conductive material, cleaning may further be performed. In addition, after the EMI shielding layer 180 is formed and the cleaning is performed, the jig 10 positioned under the second molding 150 is separated to complete the semiconductor package 100 having the EMI shielding layer 180. In FIGS. 3A to 3E, a single semiconductor package 100 is manufactured, but a plurality of semiconductor packages may be formed on the substrate 110 to then be divided through a singulation process into a discrete semiconductor package 100.

Figure 4:
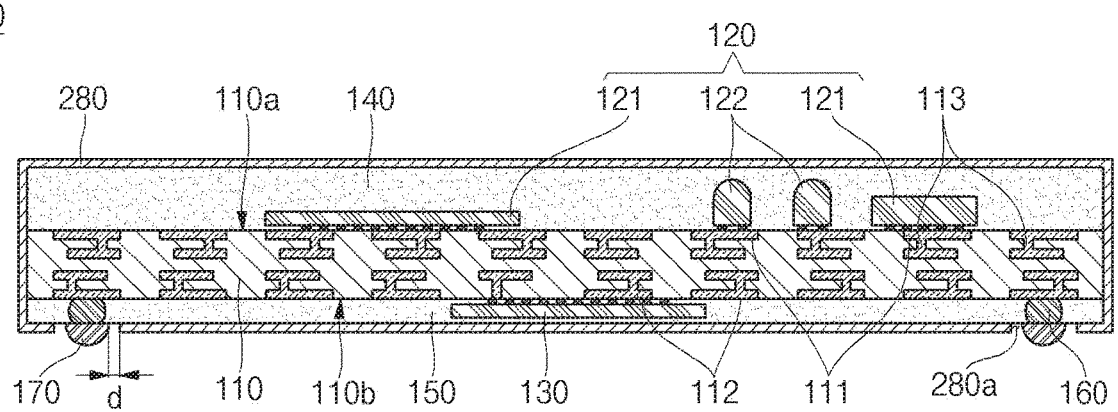
FIG. 4 is a cross-sectional view illustrating a semiconductor package according to another embodiment of the present disclosure.

Referring to FIG. 4, a cross-sectional view illustrating a semiconductor package according to another embodiment of the present disclosure is illustrated.

As illustrated in FIG. 4, the semiconductor package 200 includes a substrate 110, a first electronic device 120, a second electronic device 130, a first molding 140, a second molding 150, first conductive bumps 160, second conductive bumps 170 and an EMI shielding layer 280. The semiconductor package 200, including the substrate 110, the first electronic device 120, the second electronic device 130, the first molding 140, the second molding 150, the first conductive bumps 160 and the second conductive bumps 170, has the same configuration with the semiconductor package 100 illustrated in FIG. 1. Therefore, the following description of the semiconductor package 200 will focus on the EMI shielding layer 280, which is a different feature from the semiconductor package 100 illustrated in FIG. 1.

The EMI shielding layer 280 is formed to cover a top surface, four side surfaces and a bottom surface of the semiconductor package 200 to a predetermined thickness and may expose second conductive bumps 170 to the outside. That is to say, the EMI shielding layer 280 may be formed to entirely cover the semiconductor package 200, except for the second conductive bumps 170. In addition, the EMI shielding layer 280 may be made of a conductive material and may be electrically connected to a ground of the semiconductor package 200 or an external ground.

The EMI shielding layer 280 may include a plurality of exposing holes 280a. The second conductive bumps 170 may be exposed to the outside of the EMI shielding layer 280 through the exposing holes 280a. That is to say, the exposing holes 280a of the EMI shielding layer 280 may be located to correspond to the second conductive bumps 170.

In addition, the exposing holes 280a may have larger widths than diameters of the second conductive bumps 170. That is to say, the EMI shielding layer 280 may be spaced a predetermined distance (d) apart from the second conductive bumps 170 by the exposing holes 280a and may be electrically disconnected from the second conductive bumps 170 made of a conductive material. Here, portions surrounding the second conductive bumps 170 in the second molding 150 may be exposed to the outside of the exposing holes 280a of the EMI shielding layer 280.

The EMI shielding layer 280 is formed to cover all surfaces of the semiconductor package 200, except for the second conductive bumps 170 as external terminals, thereby shielding EMI induced from (or induced upon) the semiconductor package 200.

Figure 5A:
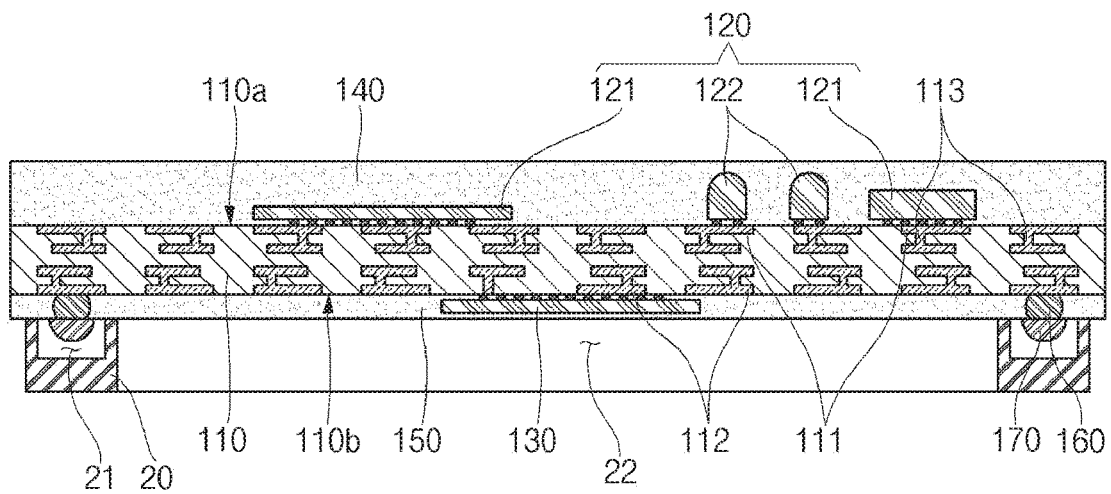
FIGS. 5A and 5B are cross-sectional views illustrating various steps in manufacturing the semiconductor package illustrated in FIG. 4 by the semiconductor package manufacturing method illustrated in FIG. 2.
Figure 5B:
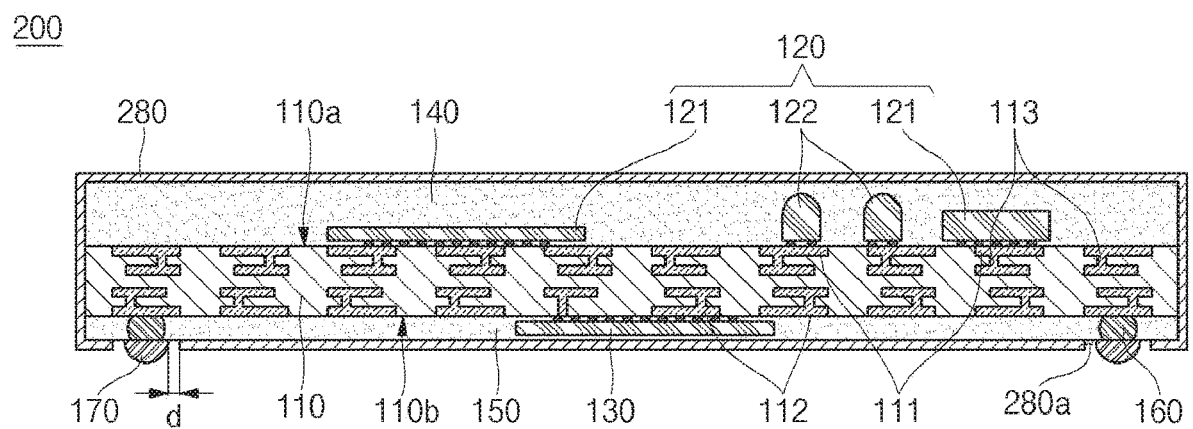

The semiconductor package 200 illustrated in FIG. 4 may be manufactured by the semiconductor package manufacturing method illustrated in FIG. 2. Referring to FIGS. 5A and 5B, cross-sectional views illustrating various steps in the method for manufacturing the semiconductor package illustrated in FIG. 4 by the semiconductor package manufacturing method illustrated in FIG. 2 are illustrated. Hereinafter, the method for manufacturing the semiconductor package 200 will be described with reference to FIGS. 2, 5A and 5B.

As illustrated in FIG. 2, the method for manufacturing the semiconductor package 200 (S10) includes forming a molding (S11), grinding a second molding (S12), forming second conductive bumps (S13), placing a jig (S14) and forming an EMI shielding layer (S15). Here, the forming of the molding (S11), the grinding of the second molding (S12) and the forming of the second conductive bumps (S13) are the same as the corresponding steps in the method for manufacturing the semiconductor package 100 illustrated in FIGS. 3A to 3C. Therefore, the following description of the method for manufacturing the semiconductor package 200 (S10) will focus on the placing of the jig (S14) and the forming of the EMI shielding layer (S15), which are different features from the method for manufacturing the semiconductor package 100 illustrated in FIGS. 3A to 3C, with reference to FIGS. 5A and 5B.

Figure 6:
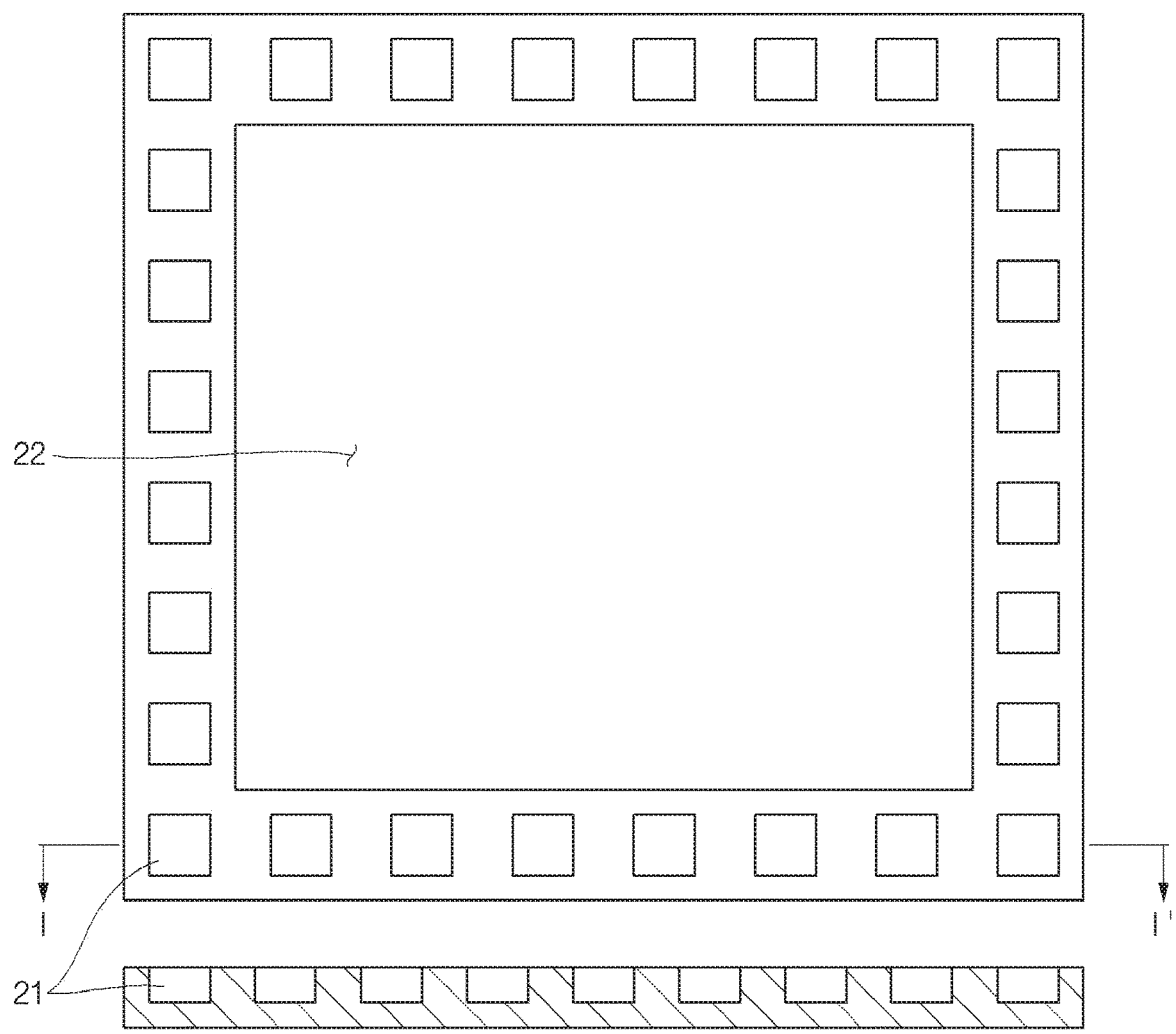
FIG. 6 illustrates a plan view and a cross-sectional view illustrating a structure of a jig illustrated in FIG. 5A.

As illustrated in FIG. 5A, in the placing of the jig (S14), the jig 20 is loaded and placed to cover a bottom portion of the second molding 150. As illustrated in FIG. 6, the jig 20 is shaped of a substantially rectangular frame and may have a plurality of grooves 21 having a depth in a top-to-bottom direction. The jig 20 may include the plurality of grooves 21 located to correspond to second conductive bumps 170 of the semiconductor package 200 and the second conductive bumps 170 may be inserted into the plurality of grooves 21, respectively. That is to say, the second conductive bumps 170 may be surrounded by the jig 20. Here, in order to allow the second conductive bumps 170 into the plurality of grooves 21 of the jig 20, the plurality of grooves 21 preferably have larger diameters than the second conductive bumps 170.

In addition, the jig 20 is shaped of a rectangular ring having its central portion opened by a centrally formed hole 22. That is to say, a central portion of the bottom surface 150b of the second molding 150, which is not adjacent to (or immediately adjacent to) the second conductive bumps 170, is exposed to the outside through the hole 22 of the jig 20. The EMI shielding layer 280 may also be formed on a bottom surface of the semiconductor package 200 through the hole 22 of the jig 20.

In the placing of the jig (S14), the jig 20 is placed under the second molding 150 to cover the second conductive bumps 170 and exposes a first molding 140, a substrate 110 and the second molding 150 to the outside.

As illustrated in FIG. 5B, in the forming of the EMI shielding layer (S15), the EMI shielding layer 280 is formed on the first molding 140, the substrate 110 and the second molding 150, which are exposed to the outside in the placing of the jig (S14). That is to say, in the forming of the EMI shielding layer (S15), the EMI shielding layer 280 is formed to cover a top surface, four side surfaces and a bottom surface of the semiconductor package 200, except for the second conductive bumps 170, using the jig 20 as a mask. The EMI shielding layer 280 may be formed to a predetermined thickness by plasma deposition or spraying, but aspects of the present disclosure are not limited thereto. In addition, after the forming of the EMI shielding layer (S15), in order to remove metal residuals produced in the forming of the EMI shielding layer 280 made of a conductive material, cleaning may further be performed. In addition, after the EMI shielding layer 280 is formed and the cleaning is performed, the jig 20 positioned under the second molding 150 is separated to complete the semiconductor package 200 having the EMI shielding layer 280. In addition, once the jig 20 is separated, since the EMI shielding layer 280 is not formed on the second conductive bumps 170 surrounded by the jig 20 and portions around the second conductive bumps 170, exposing holes 280a exposing the second conductive bumps 170 are provided in the EMI shielding layer 280. Then, the EMI shielding layer 280 may be electrically disconnected from the second conductive bumps 170 by the exposing holes 280a and may be spaced a predetermined distance (d) apart from the second conductive bumps 170.

Figure 7:
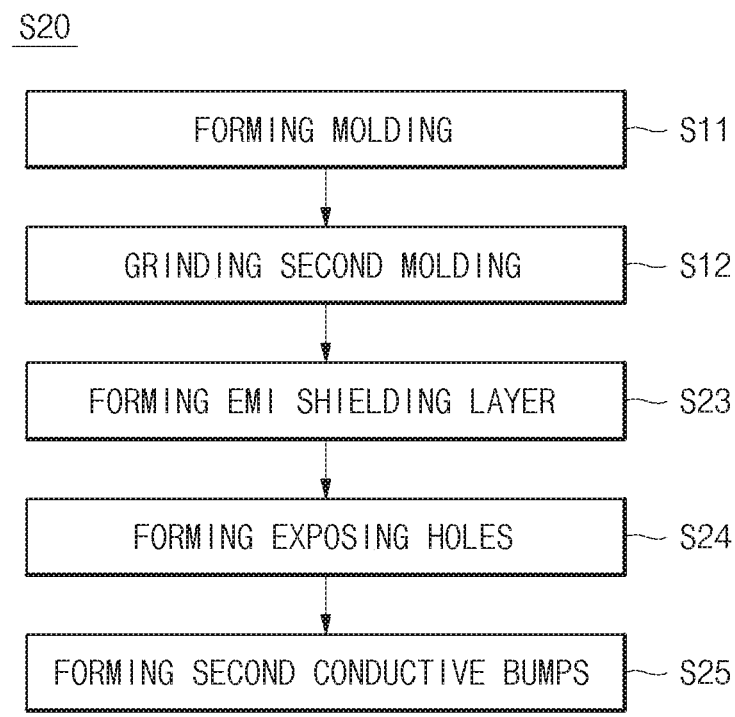
FIG. 7 is a flowchart illustrating a method for manufacturing the semiconductor package illustrated in FIG. 4 according to another embodiment of the present disclosure.

Referring to FIG. 7, a flowchart illustrating a method for manufacturing the semiconductor package illustrated in FIG. 4 according to another embodiment of the present disclosure is illustrated. As illustrated in FIG. 7, the method for manufacturing the semiconductor package 200 (S20) includes forming a molding (S11), grinding a second molding (S12), forming an EMI shielding layer (S23), forming exposing holes (S24) and forming second conductive bumps (S25). Here, the forming of the molding (S11) and the grinding of the second molding (S12) illustrated in FIG. 7 are the same as the corresponding steps in the method for manufacturing the semiconductor package 100 illustrated in FIGS. 2, 3A and 3B.

Figure 8A:
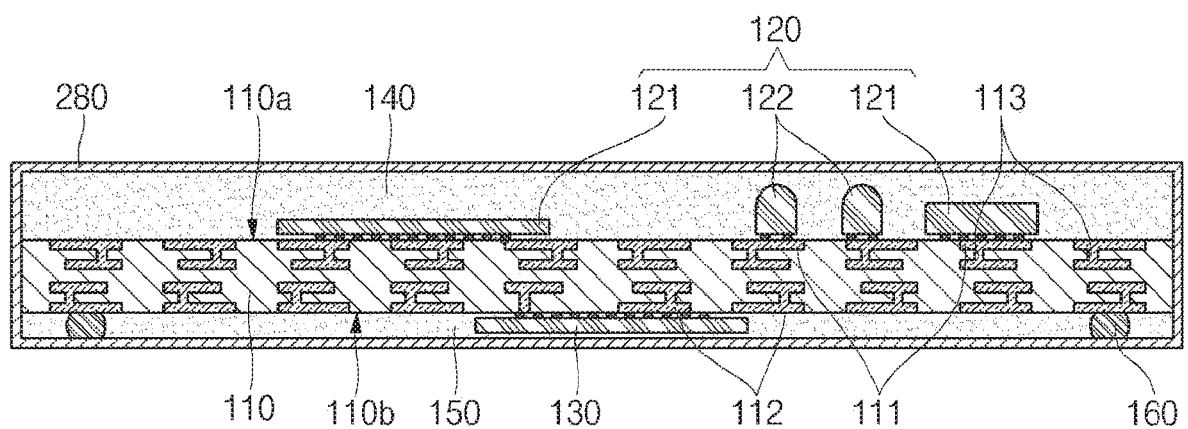
FIGS. 8A to 8C are cross-sectional views illustrating various steps of the method for manufacturing the semiconductor package illustrated in FIG. 7.
Figure 8B:
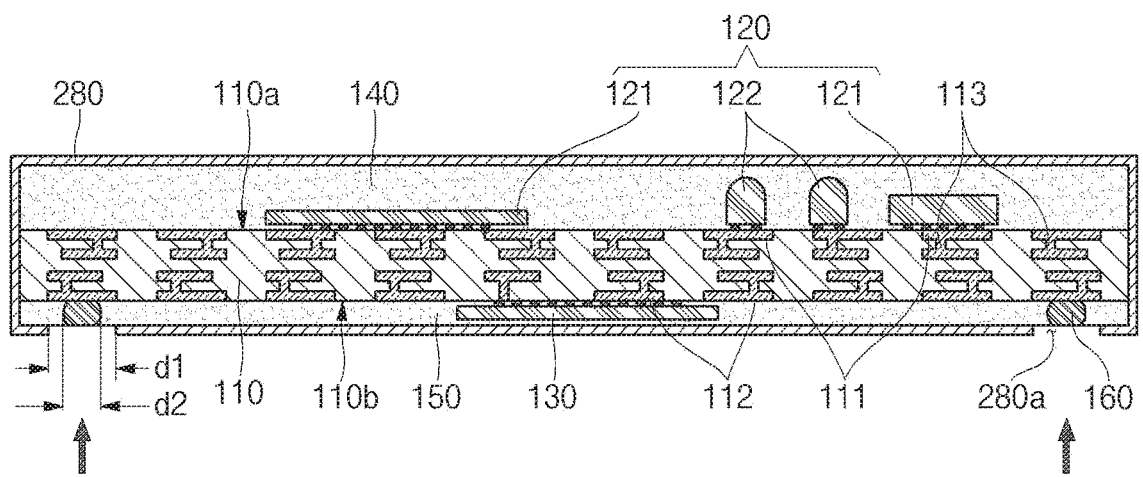
Figure 8C:
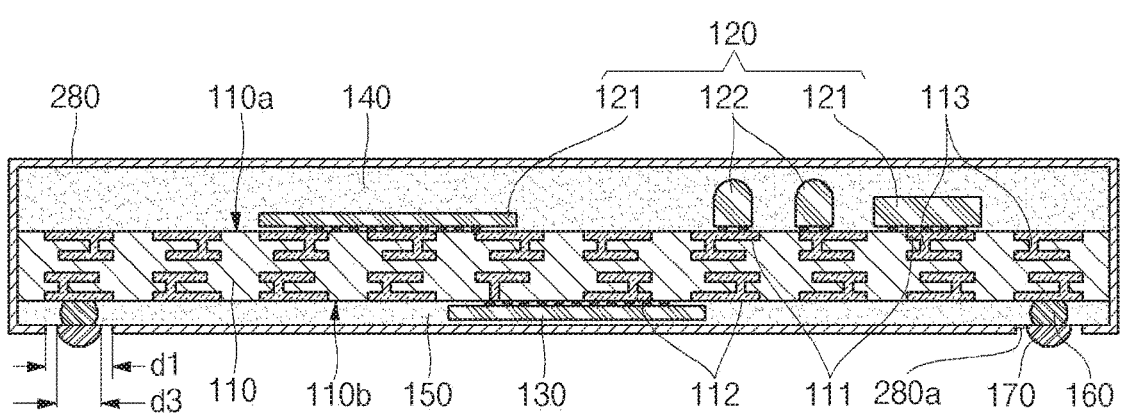

Referring to FIGS. 8A to 8C, cross-sectional views illustrating the steps of forming an EMI shielding layer (S23), forming exposing holes (S24) and forming second conductive bumps (S25) of FIG. 7 are illustrated. Therefore, the method for manufacturing the semiconductor package 200 (S20) will be described with reference to FIGS. 7 and 8A to 8C.

As illustrated in FIG. 8A, in the forming of the EMI shielding layer (S23), the EMI shielding layer 280 is formed to entirely cover the substrate 110, the first molding 140 and the second molding 150. The EMI shielding layer 280 may be formed to a predetermined thickness by plasma deposition or spraying, but aspects of the present disclosure are not limited thereto.

As illustrated in FIG. 8B, in the forming of the exposing holes (S24), the EMI shielding layer 280 may be partially removed to expose the first conductive bumps 160 to the outside. That is to say, the first conductive bumps 160 are exposed to the outside by forming a plurality of exposing holes 280a in the EMI shielding layer 280. The plurality of exposing holes 280a of the EMI shielding layer 280 are formed by removing a portion of the EMI shielding layer 280 by etching or laser. In addition, the forming of the exposing holes 280a may be performed by any process known in the art so long as an EMI shielding material can be patterned in a desired pattern, but not limited to etching or laser as disclosed herein. As illustrated in FIG. 8B, a width (d1) of each of the exposing holes 280a is preferably larger than a diameter (d2) of each of the first conductive bumps 160. In order to electrically disconnect the first conductive bumps 160 from second conductive bumps 170 to be described later, the exposing holes 280a are preferably formed to have a sufficient large width (i.e., d1). In addition, after the forming of the exposing holes 280a, a cleaning process for removing metal residuals may further be performed.

As illustrated in FIG. 8C, in the forming of the second conductive bumps (S25), the second conductive bumps 170 are formed to be electrically connected to the first conductive bumps 160 exposed to the outside by the exposing holes 280a. The second conductive bumps 170 are preferably formed to have a larger diameter (d3) than the width (d1) of the exposing holes 280a. That is to say, the second conductive bumps 170 may be spaced a predetermined distance apart from the EMI shielding layer 280 to be electrically disconnected from the EMI shielding layer 280.

Figure 9A:
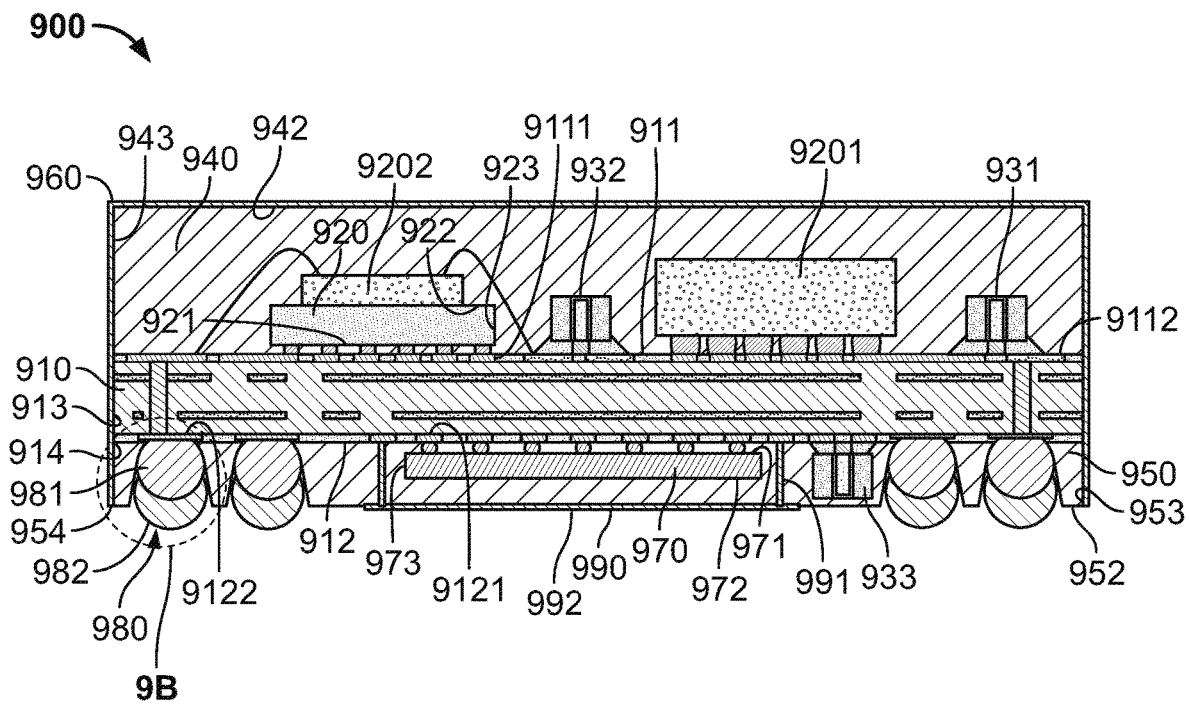
FIG. 9A illustrates a cross-section view of a semiconductor package according to one example.
Figure 9B:
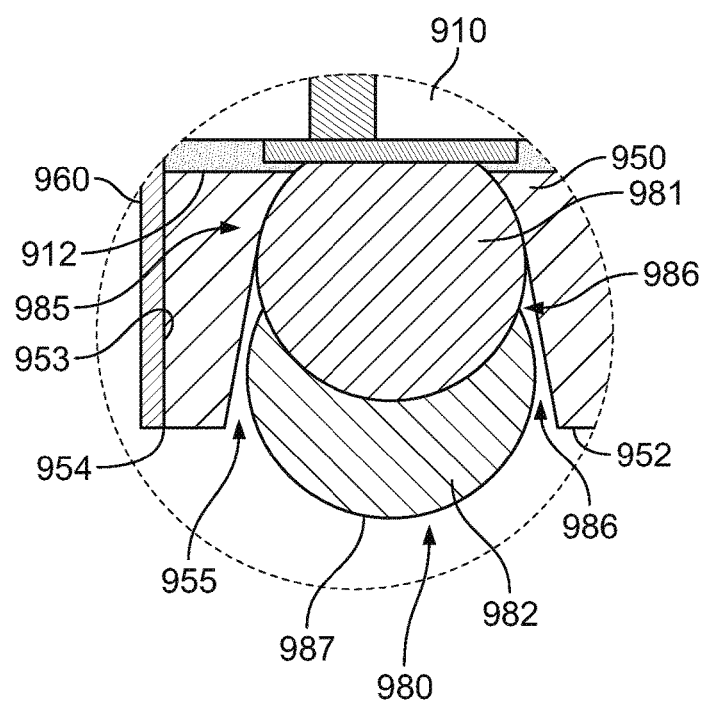
FIG. 9B illustrates a magnified portion of the semiconductor package from FIG. 9A.

FIG. 9A illustrates a cross-section view of semiconductor package 900 according to one example. FIG. 9B illustrates a magnified portion of semiconductor package 900 from FIG. 9A. Semiconductor package 900 and its elements can be similar to any one or more of the other semiconductor packages or their corresponding elements described herein, and characteristics of semiconductor package 900 are further described below.

Semiconductor package 900 comprises substrate 910 having substrate top surface 911, substrate bottom surface 912, and substrate lateral surface 913 therebetween. Substrate 910 also comprises substrate top first pad 9111 at substrate top surface 911, and substrate bottom first pad 9121 at substrate bottom surface 912. Substrate 910 can be similar to any of the substrates described herein, such as substrate 110. In the same or other examples, substrate 910 can comprise a redistribution structure (RDS) having one or more dielectric layers of dielectric material and one or more conductive layers between and through the dielectric layers. Such conductive layers can define pads, traces and vias through which electrical signals or voltages can be distributed horizontally and vertically across the RDS.

Semiconductor package 900 also comprises electronic device 920 attached to substrate top surface 911 and coupled to substrate top first pad 9111. Electronic device 920 can include one or more transistors, and can comprise a microcontroller device, a radio-frequency (RF) device, a wireless (WiFi, WLAN, etc.) switch, a power amplifier device, a low noise amplifier (LNA) device, etc. There can also be examples where electronic device 920 can comprise a MEMS (Micro-Electro-Mechanical-System) device that can include one or more transducers. Electronic device 920 comprises device surface 921 facing substrate top surface 911, device surface 922 facing away from substrate top surface 911, and device lateral surface 923 therebetween. In the present example, electronic device 920 comprises a semiconductor die having bumps at device surface 921, and is flip-chip mounted onto substrate top surface 911 such that one of such bumps contacts substrate top first pad 9111. The term "bumps" can refer to ball bumps, such as solder bumps or solder-coated copper-core bumps, and/or can refer to metallic post bumps such as copper pillars with or without solder tips. In other examples, electronic device 920 can comprise a semiconductor die with its inactive surface facing towards substrate top surface 911 and with one or more wirebonds extending from its active surface to one or more pads at substrate top surface 911. There can also be examples where electronic device 920 can comprise a packaged device having one or more semiconductor die within, and optionally having another substrate coupling such one or more semiconductor die together, where such packaged device can couple to one or more pads at substrate top surface 911.

In the present example, semiconductor package 900 also comprises one or more passive components coupled to substrate top surface 911, such as passive component 931 that is coupled to substrate top second pad 9112. In some examples, such one or more passive components can comprise capacitors, inductors, and/or resistors. Although in the present example passive component 931 is presented as a surface-mount-technology (SMT) device coupled to substrate top second pad 9112 via SMT joints, there can be other examples where passive component 931 can be packaged or mounted differently, such as via wirebonds or bumps.

Several configurations of different devices and components can be coupled to substrate top surface 911. For example, besides electronic device 920 and passive component 931, FIG. 9 shows electronic device 9201, electronic device 9202, and passive component 932 coupled to substrate 910 at substrate top surface 911. Electronic device 9201 and/or electronic device 9202 can be similar to one or more of the different device options described with respect to electronic device 920. As an example, electronic device 920 can comprise a microcontroller device, while electronic device 9201 can comprise a MEMS device, such as a gyroscope, a microphone, a pressure sensor, or a gas sensor, among others. Although electronic device 9201 is shown bonded to substrate top surface 910 through bumps, there can be other embodiments where electronic device 9201 can be wirebonded instead. Furthermore, as an option, electronic device 9202 is shown coupled to substrate top surface 910 via wirebonds, while stacked atop electronic device 920. Passive component 932 can be similar to passive component 931, and is shown coupled to substrate top surface 911 between electronic device 920 and electronic device 9201.

Encapsulant 940 is shown at FIG. 9 encapsulating substrate top surface 911, along with all components coupled to it, including electronic devices 920, 9201, and 9202, and passive components 931 and 932. Although the present example shows encapsulant 940 covering both lateral and top surfaces of such devices and components, there can be examples where the top surfaces of one or more of such devices or components may be left exposed by encapsulant 940.

FIG. 9 also presents electronic device 970 attached to substrate bottom surface 912 and coupled to substrate bottom first pad 9121. Electronic device 970 can be similar to one or more of the different device options described with respect to electronic device 920, and comprises device surface 971 facing substrate bottom surface 912, device surface 972 facing away from substrate bottom surface 912, and device lateral surface 973 therebetween. In the present example, electronic device 970 comprises a semiconductor die having bumps at device surface 971, and is flip-chip mounted onto substrate bottom surface 912 such that one of such bumps contacts substrate bottom first pad 9121. In other examples, electronic device 970 can comprise a semiconductor die with its inactive surface facing towards substrate bottom surface 912 and with one or more wirebonds extending from its active surface to one or more pads at substrate bottom surface 912. There can also be examples where electronic device 970 can comprise a packaged device having one or more semiconductor die within, and optionally having another substrate coupling such one or more semiconductor die together, where such packaged device can couple to one or more pads at substrate bottom surface 912.

Semiconductor package 900 also comprises external interconnects, such as external interconnect 980, configured to interface or attach semiconductor package 900 to an external device, such as to an external substrate or board part of a larger electronic apparatus. External interconnect 980 is coupled to substrate bottom second pad 9122 of substrate 910, and protrudes from substrate bottom surface 912 further than device surface 972 of electronic device 970. External interconnect 980 is shown comprising interconnect inner portion 981 adjacent substrate bottom surface 912, and interconnect distal portion 982 disposed distally from substrate bottom surface 912. Although both interconnect inner portion 981 and interconnect distal portion 982 are presented as stacked conductive solder balls in the present example, there can be other examples where one or both of them can be, for instance, a solder-encapsulated copper or metallic core ball, or a conductive post plated, wirebonded, or otherwise attached to substrate bottom surface 912. As another option, external interconnect 980 can be a single conductive structure instead of stacked conductive structures, such as a single solder ball, or a single conductive post or pillar.

Encapsulant 950 is shown at FIG. 9 encapsulating substrate bottom surface 912, along with any components coupled to it, including electronic device 970 and passive component 933. Although the present example shows encapsulant 950 covering both lateral and bottom surfaces of such devices and components, there can be examples where the bottom surfaces of one or more of such devices or components may be left exposed by encapsulant 950. Encapsulant 950 bounds external interconnect 980 while leaving the distal end of external interconnect 980 exposed and protruded from encapsulant bottom surface 952. In some examples, the material of encapsulant 950 can be similar to one or more of the materials described for encapsulant 940. For instance, encapsulant 940 can comprise a layer of a mold material, and encapsulant 940 can comprise a layer of the same mold material, whether applied concurrently or integrally with the layer of encapsulant 940 or not.

FIG. 9B includes a magnified view that presents details of external interconnect 980 relative to encapsulant 950. As seen in the magnified view, encapsulant 950 comprises through-via 955 that reveals different portions of external interconnect 980. For example, interconnect encapsulated section 985 is attached to substrate bottom surface 912 and is bounded by and in contact with encapsulant 950. Interconnect exposed section 986 is depressed within through-via 955 and bounded by, but detached from, encapsulant 950. Interconnect protruded section 987 not only is exposed from encapsulant 950, but also protrudes further than encapsulant bottom surface 952.

FIG. 9 further shows electromagnetic interference (EMI) shield 960 that covers encapsulant top surface 942 and encapsulant lateral surface 943 of encapsulant 940, and substrate lateral surface 913 of substrate 910. EMI shield 960 also covers encapsulant lateral surface 953 of encapsulant 950 in the present example, and leaves at least a portion of encapsulant bottom surface 952 exposed such that EMI shield 960 remains spaced apart from external interconnect 980. In the present example, EMI shield 960 comprises a layer of continuous conformal coating that conforms to respective contours, including any surface irregularities or coarseness, of and/or between encapsulant top surface 942, encapsulant lateral surface 943, substrate lateral surface 913, and encapsulant lateral surface 953.

Semiconductor package 900 also comprises in the present example compartment shield 990, which can be an EMI shield configured to provide EMI protection within a compartment area encompassing one or more components, such as electronic device 970. Compartment shield 990 comprises compartment lateral barrier 991 that bounds device lateral surface 973 along a perimeter of electronic device 970, and also comprises compartment bottom barrier 992 that bounds device surface 972.

In some examples, compartment lateral barrier 991 can be a plurality of conductive posts, such as pillars or wires, whether plated, wirebonded, soldered, or otherwise coupled, that are lined up in one or more rows adjacent at least a portion of the perimeter of electronic device 970. Compartment bottom barrier 992 covers the area under device surface 972 and contacts compartment lateral barrier 991.

Compartment bottom barrier 992 can be a metallic plate or a conformal coating similar to the conformal coating of EMI shield 960. In some examples, compartment bottom barrier 992 can be a portion of the layer of conformal coating of EMI shield 960, but there can be other examples where compartment bottom barrier 992 can be formed independently of and/or sequentially to EMI shield 960. The conductive posts of compartment lateral barrier 991 are exposed at encapsulant bottom surface 952 to permit contact with compartment bottom barrier 992 and, as seen in the present example, can protrude past encapsulant bottom surface 952 such that lateral portions of such conductive post protrusions can be covered by the material of compartment bottom barrier 992.

There can also be examples where compartment lateral barrier 991 and compartment bottom barrier 992 of compartment shield 990 can comprise a single continuous piece of material that bounds both device surface 972 and device lateral surface 973 of electronic device 970, such as a metallic can or cover, or such as one or more wires wire-bonded as a wire cage to substrate bottom surface 912 from one side to a different side of electronic device 970. Some examples can also comprise compartment shield(s) similar to compartment shield 990 shielding devices or components other than, or in addition to, electronic device 970.

Figure 10A:
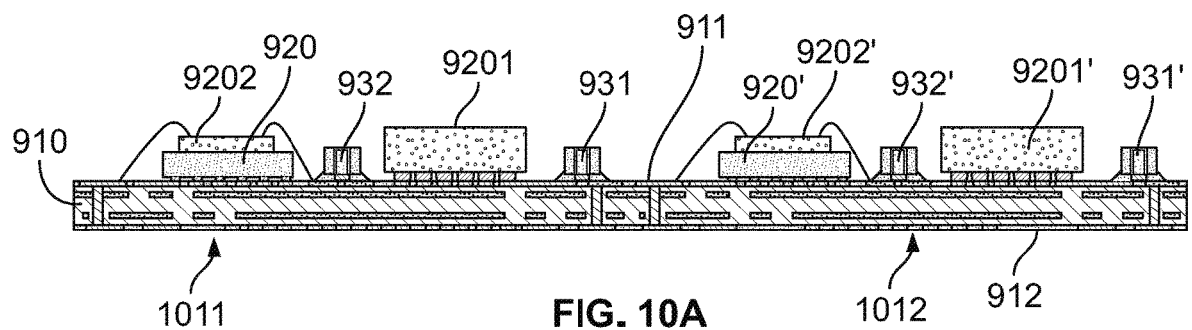
FIGS. 10A-10C illustrate various initial semiconductor package assembly stages.
Figure 10B:
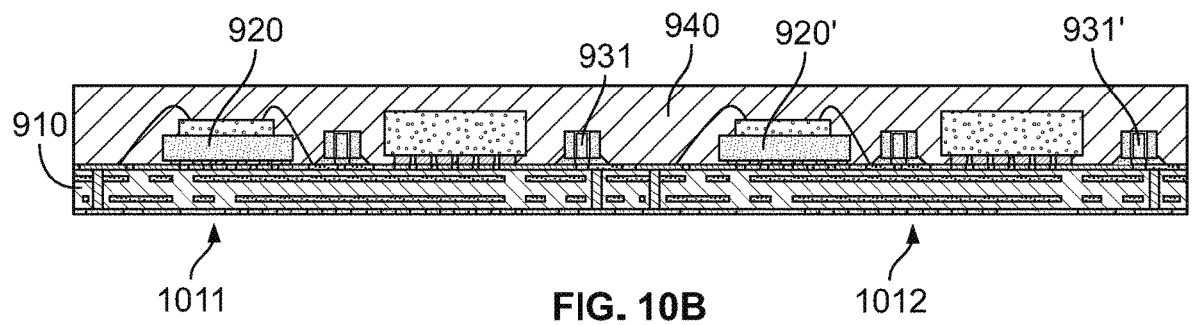
Figure 10C:
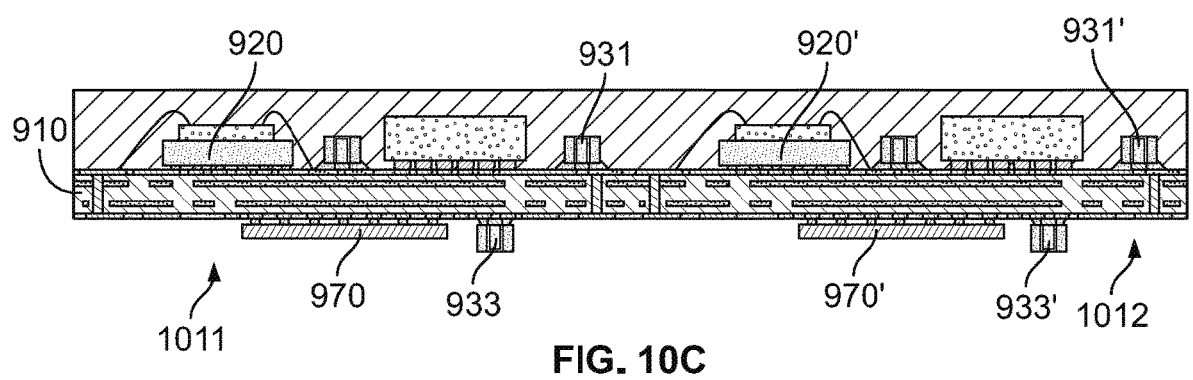
Figure 17A:
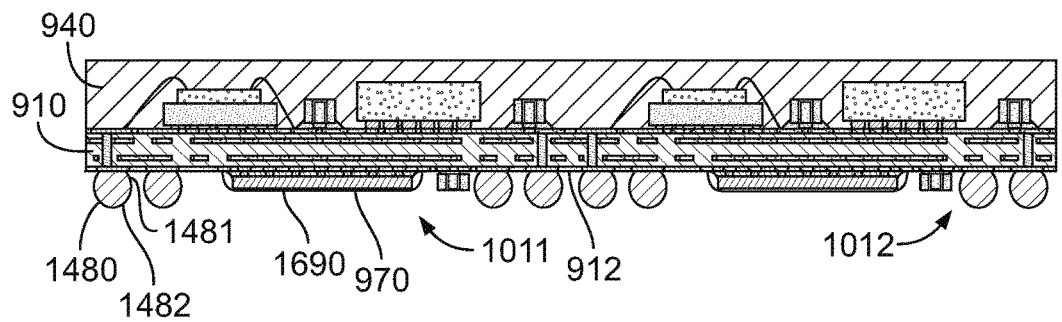
FIGS. 17A-17C illustrate various later semiconductor package assembly leading to the semiconductor package of FIG. 16.
Figure 17B:
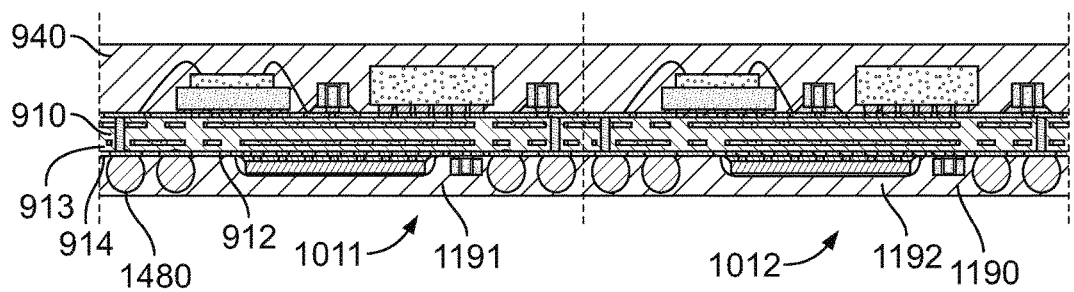
Figure 17C:
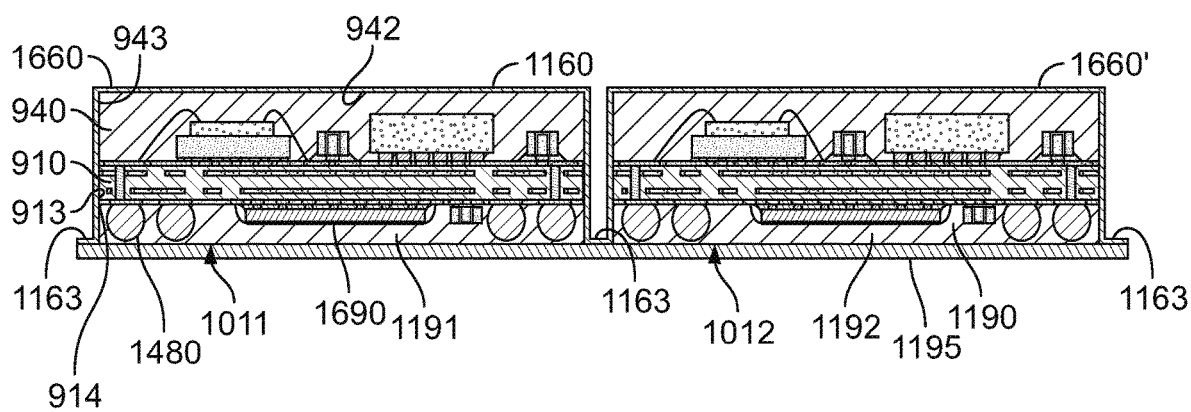
Figure 18:
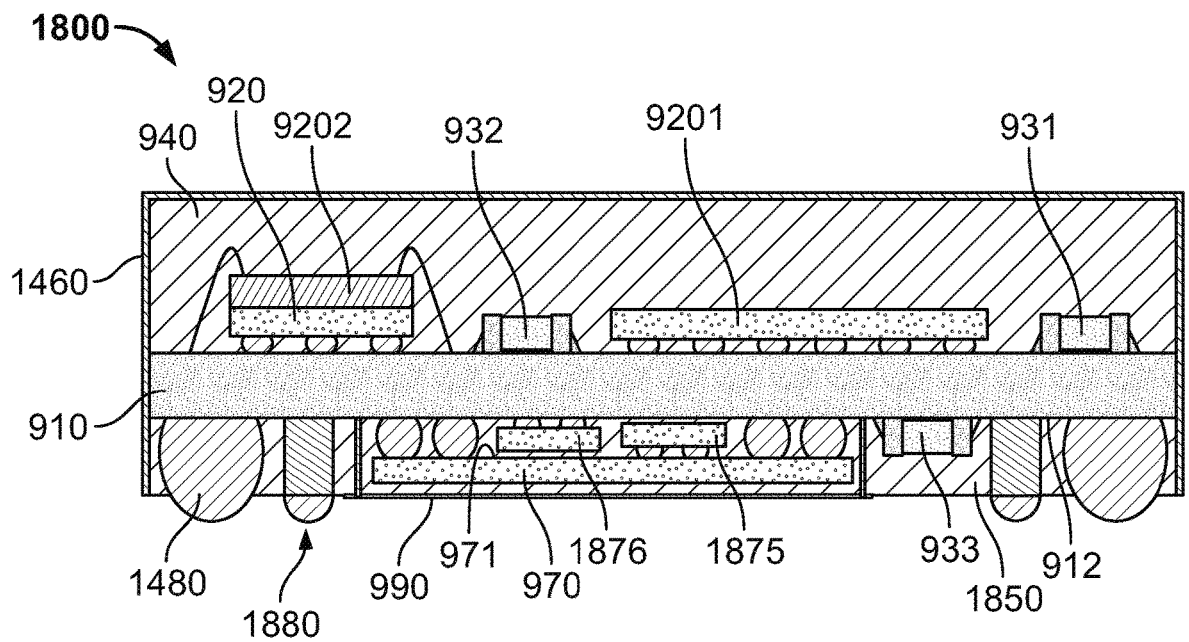
FIG. 18 illustrates a cross-section view of a semiconductor package according to one example.

FIGS. 10A-10C illustrate various initial stages of assembly for a semiconductor package similar to one or more of those described here, such as for example semiconductor package 900 (FIGS. 9, 11), semiconductor package 1200 (FIGS. 12-13), semiconductor package 1400 (FIGS. 14-15), semiconductor package 1600 (FIGS. 16-17), and/or semiconductor package 1800 (FIG. 18). FIG. 10A presents substrate 910 prior to singulation, including multiple sections defining adjacent portions that can be subsequently singulated into individual packages, such as unit portion 1011 and unit portion 1012.

In some examples, substrate 910 can be prefabricated and can comprise a laminate substrate, such as a printed circuit board, and which may be in the form of a strip or a panel. In the same or other examples, substrate 910 can include a core layer, such as fiberglass or other rigid nonconductive material, between the dielectric layers of its RDS to add structural rigidity. There can be other examples, however, where substrate 910 can be a build-up substrate instead of prefabricated, and/or can be coreless. In such examples, the different dielectric layers and conductive layers of the RDS of substrate 910 can built-up by layering and pattering on each other while supported by a removable carrier located under substrate bottom surface 912. Such carrier can be a wafer or panel comprising semiconductor, glass, or metallic material.

Unit portion 1011 of substrate 910 comprises electronic devices 920, 9201, 9202 and passive components 931 and 932 coupled to substrate top surface 911. Correspondingly, unit portion 1012 of substrate 910 comprises electronic devices 920', 9201', 9202' and passive components 931' and 932' are coupled to substrate top surface 911.

FIG. 10B presents a subsequent stage of assembly where encapsulant 940 is applied to encapsulate all devices and components coupled to substrate top surface 911 across and between both unit portion 1011 and unit portion 1012. Encapsulant 940 comprises a single layer of non-conductive material, such as a resin, a polymer composite material, a polymer having a filler, an epoxy resin, an epoxy resin, an epoxy acrylate having a filler such as silica or other inorganic material, a mold compound, a silicone resin, and/or a resin-impregnated B-stage pre-preg film, among others. In examples where encapsulant 940 comprises a mold compound, such material can be applied via any of several ways, such as through compression molding, injection molding, or film-assisted molding.

FIG. 10C illustrates a subsequent stage of assembly where components are added to substrate bottom surface 912. For example, electronic devices 970 and passive component 933 are coupled to substrate bottom surface 912 at unit portion 1011 of substrate 910. Correspondingly, electronic device 970' and passive component 933' are coupled to substrate bottom surface 912 at unit portion 1012 of substrate 910.

Figure 11A:
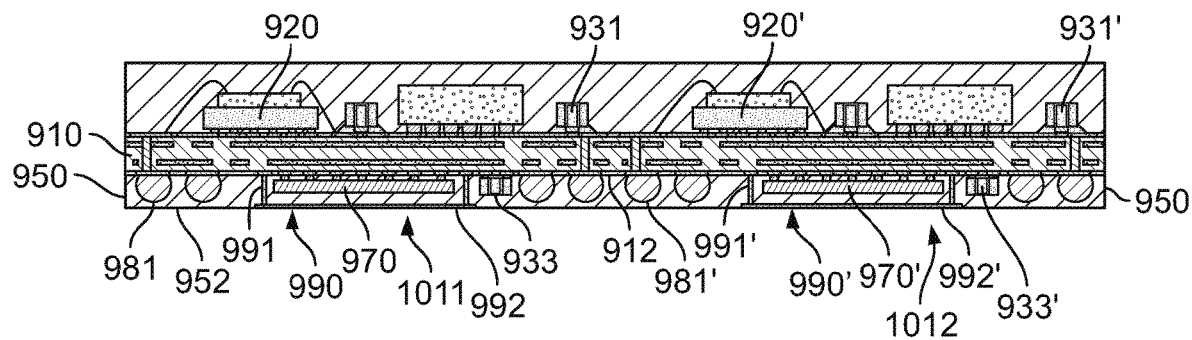
FIGS. 11A-11E illustrate various later semiconductor package assembly leading to the semiconductor package of FIG. 9.

FIGS. 11A-11E illustrate various later stages of assembly subsequent to those of FIGS. 10A-C and leading to semiconductor package 900 (FIG. 9). FIG. 11A presents interconnect inner portion 981 of external interconnect 980 attached to substrate bottom surface 912 at unit portion 1011, and presents interconnect inner portion 981' of external interconnect 980' attached to substrate bottom surface 912 at unit portion 1012. In some examples, interconnect inner portions 981 and 981' can be applied using a solder drop or ball drop process, a screen-printing process, or a plating process. In the same or other examples, interconnect inner portions 981 and 981' can be at least partially reflowed once attached.

FIG. 11A also presents encapsulant 950 applied across and between unit portion 1011 and unit portion 1012 to encapsulate substrate bottom surface 912 and all elements coupled to it, including electronic devices 970 and 970', passive components 933 and 933', and interconnect inner portions 981 and 981'. In the present example, encapsulant 950 is applied such that encapsulant bottom surface 952 fully encapsulates interconnect inner portion 981, electronic device 970, and passive component 933, but there can be examples where encapsulant 950 can be applied leaving the bottom of one or more of such elements exposed.

FIG. 11A further presents compartment shields 990 and 990' respectively shielding electronic devices 970 and 970' at unit portions 1011 and 1012. In some implementations, compartment lateral barriers 991 and 991' can be attached to substrate bottom surface 912 adjacent a periphery of respective electronic devices 970 and 970' and at least partially encapsulated by encapsulant 950. Compartment bottom barriers 992 and 992' can be applied on encapsulant 950, respectively attached to compartment lateral barriers 991 and 991'.

Figure 11B:
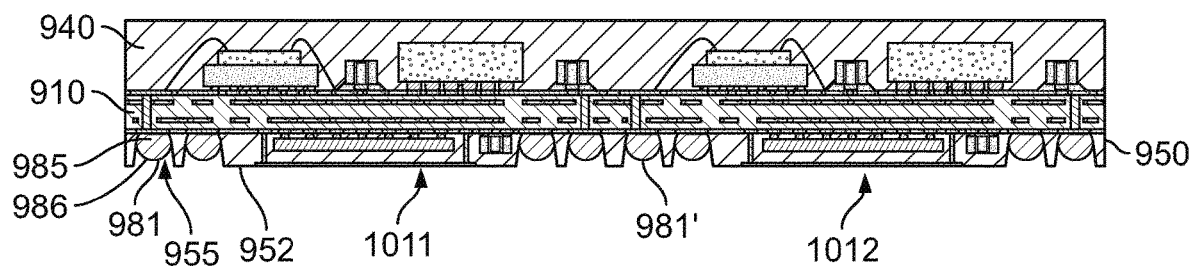

FIG. 11B presents a subsequent stage of assembly where respective sections of encapsulant 950 are removed to expose interconnect inner portions 981 and 981'. Such removal of encapsulant 950 can correspond to through-via 955, thus defining respective portions of interconnect encapsulated section 985 and interconnect exposed section 986. In some examples, through-via 955 can be formed into encapsulant 950 by a laser ablation, by mechanical ablation, and/or or by etching through the material of encapsulant 950.

Figure 11C:
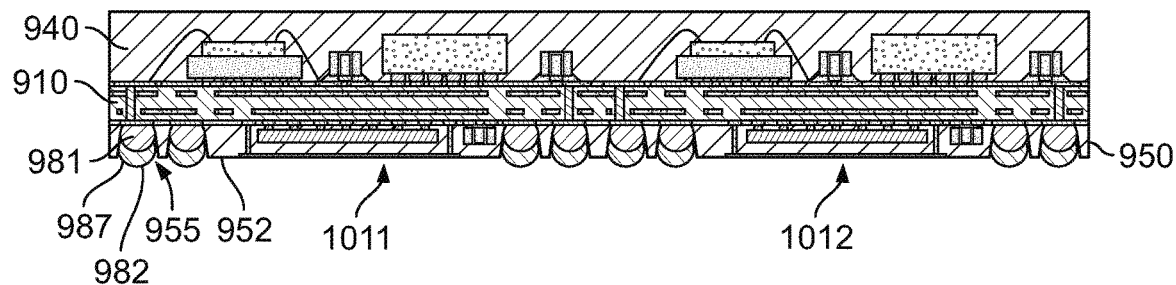

FIG. 11C presents a subsequent stage of assembly where interconnect distal portion 982 is coupled to interconnect inner portion 981 as exposed in through-via 955, such that interconnect distal portion 982 protrudes further than encapsulant bottom surface 952. In some examples, interconnect distal portion 982 can be applied using a solder drop or ball drop process, a screen-printing process, or a plating process. In the same or other examples, interconnect distal portion 982 can be at least partially reflowed once attached.

Figure 11D:
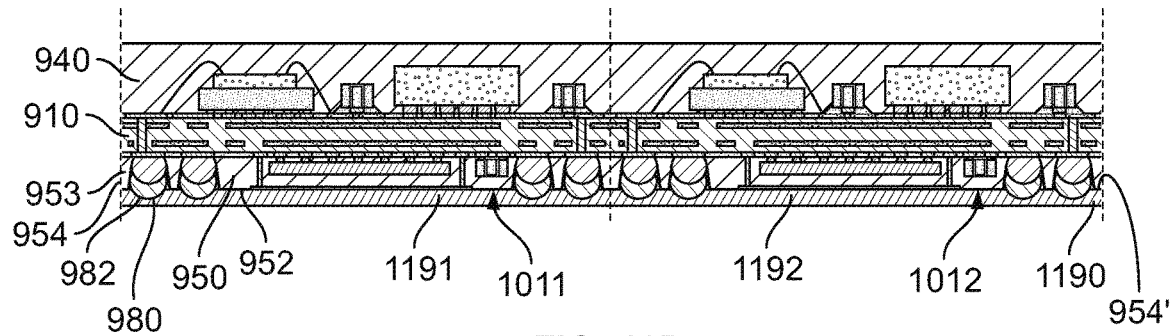

FIG. 11D presents a subsequent stage of assembly where primary tape 1190 is attached. Primary tape 1190 comprises a primary adhesive across its top surface, such that primary tape portion 1191 is adhered under unit portion 1011 and primary tape portion 1192 is adhered under unit portion 1012. Accordingly, the primary adhesive is sealed to encapsulant bottom surface 952 and to external interconnect 980, where in the present example interconnect distal portion 982 protrudes into and/or is encapsulated by a thickness of primary tape 1190. Primary tape 1190 can also comprise a base layer on which the primary adhesive is carried.

Subsequent to attachment of primary tape 1190, singulation along the dotted lines shown in FIG. 11D, through encapsulant 940, through substrate 910, and through primary tape 1190, can separate unit portions 1011 and 1012 from each other. Singulation defines encapsulant perimeter edge 954 of unit portion 1011 at the junction of encapsulant bottom surface 952 and encapsulant lateral surface 953. Primary tape portion 1191 remains attached to unit portion 1011 after singulation, with its primary adhesive still hermetically sealed to the bottom of encapsulant bottom surface 952 and to encapsulant perimeter edge 954. Similarly, primary tape portion 1192 remains attached to unit portion 1012 after singulation, with its primary adhesive still hermetically sealed to the bottom of encapsulant bottom surface 952 and to encapsulant perimeter edge 954'.

Figure 11E:
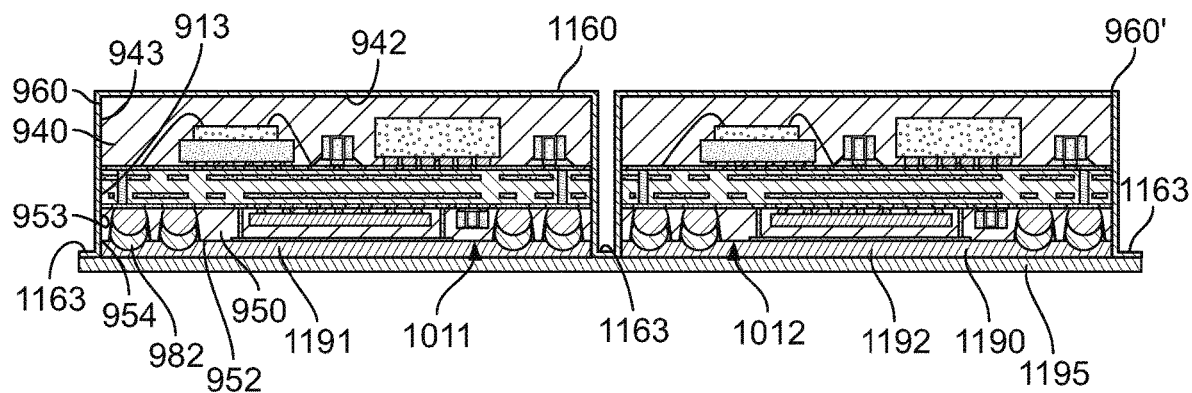

FIG. 11E presents a subsequent stage of assembly where unit portions 1011 and 1012 are attached to a secondary adhesive of secondary tape 1195. Secondary tape 1195 can be supported by a carrier structure, and unit portions 1011 and 1012, along with corresponding primary tape portions 1191 and 1192, can be pick & placed adjacent to each other on secondary tape 1195 such that the bottom of each of primary tape portions 1191 and 1192 is sealed against the secondary adhesive of secondary tape 1195. Secondary tape 1195 is exposed at a gap that separates primary tape portions 1191 from 1192, and unit portions 1011 from 1012. Secondary tape 1195 can also comprise a base layer on which the secondary adhesive is carried. In some examples, the base layers of primary tape 1190 or of secondary tape 1195 can comprise a polyethylene terephthalate and/or a polyimide material.

With the pick & place operation complete, EMI shield layer 1160 is applied. In the present example, EMI shield layer 1160 is applied as a continuous coating that comprises EMI shield 960, EMI shied 960', and remainder EMI shield 1163. EMI shield 960 covers unit portion 1011, including encapsulant top surface 942, encapsulant lateral surface 943, substrate lateral surface 913, and encapsulant lateral surface 953. EMI shield 960' covers corresponding elements of unit portion 1012. Remainder EMI shield 1163 covers a sidewall of primary tape portion 1191, a sidewall of primary tape portion 1192, and portions of secondary tape 1195. In the present example, secondary tape 1195 is covered by remainder EMI shield 1163 wherever exposed from primary tape portions 1191 or 1192, including over the gap that separates primary tape portions 1191 from 1192.

Because the sidewall of primary tape portion 1191 is coplanar with encapsulant lateral surface 953, EMI shield layer 1160 does not bend at encapsulant perimeter edge 954 but rather continues in a substantially straight plane from encapsulant lateral surface 953 to the sidewall of primary tape portion 1191. Without such bend, which would normally happen if the interface between primary tape 1190 and encapsulant lateral surface 953 were instead at a right angle, EMI shield layer 1160 does not accumulate or bulge adjacent encapsulant perimeter edge 954. Accordingly, the thickness of EMI shield layer 1160 remains substantially constant at encapsulant perimeter edge 954 and across the interface with the primary adhesive of primary tape portion 1191.

In some examples, EMI shield layer 1160, including EMI shield 960, EMI shield 960', and remainder EMI shield 1163 can comprise one or more layers or alloys of electrically conductive material such as copper (Cu), nickel (Ni), gold (Au), silver (Ag), platinum (Pt), cobalt (Co), titanium (Ti), chrome (Cr), zirconium (Zr), molybdenum (Mo), ruthenium (Ru), hafnium (Hf), tungsten (W), rhenium (Re), or graphite. In some examples, the EMI shield layer 1160 can comprise a binder to allow internal metal particles to be bonded to one another and to be bonded to encapsulant 140, substrate 910, and/or to encapsulant 150. In other examples, EMI shield layer 1160 can comprise a conductive polymer doped with a metal or a metal oxide, such as polyacetylene, polyaniline, polypyrrole, polythiophene or poly sulfur nitride. In other examples, EMI shield layer 1160 can comprise a conductive ink prepared by mixing conductive materials, such as carbon black, graphite or silver. Example procedures for forming EMI shield layer 1160 can comprise using spin coating, spraying, electrolytic plating, electroless plating, or sputtering. The thickness of EMI shield layer 1160 can range from about 3 microns (μm) to about 7 microns.

With EMI shield layer 1160 applied as shown in FIG. 11E, unit portion 1011 can be pulled from primary tape portion 1191, revealing encapsulant bottom surface 952 and interconnect distal portion 982, and bringing EMI shield 960 along to yield semiconductor package 900 (FIG. 9). During such removal, primary tape portion 1191 remains attached to secondary tape 1195, and EMI shield layer 1160 ruptures precisely along its interface with the primary adhesive of primary tape portion 1191 to thereby separate EMI shield 960 from remainder EMI shield 1163. Unit portion 1012 can be similarly pulled from primary tape portion 1192, such that remainder EMI shield 1163 remains attached to primary tape portions 1191 and 1192, and to secondary tape 1195.

The adhesive strength of the secondary adhesive of secondary tape 1195 that is sealed to the base of primary tape portion 1191 can be greater than the adhesive strength of the primary adhesive of primary tape portion 1191 that is sealed to unit portion 1011. Accordingly, the secondary adhesive can prevent separation of primary tape portion 1191 from secondary tape 1195. This can permit controlled rupturing through the substantially constant thickness of EMI shield layer 1160 throughout encapsulant perimeter edge 954, along the interface between encapsulant lateral surface 953 and the primary adhesive of primary tape portion 1191, to thereby define EMI shield 960. Such constant thickness and controlled rupturing of the EMI shield can permit increased and consistent coverage of encapsulant lateral surface 953, such that no more than an exposed height of 0 to 50 μm, measured vertically from encapsulant bottom surface 952 and along encapsulant lateral surface 953, is exposed from EMI shield 960. This avoids issues such as where EMI shield layer 1160 ruptures past encapsulant perimeter edge 954, leaving a dangling portion of EMI shield 960, and also avoids issues where EMI shield layer 1160 ruptures too far above encapsulant perimeter edge 954, leaving encapsulant lateral surface 953 excessively exposed from EMI shield 960.

Figure 12A:
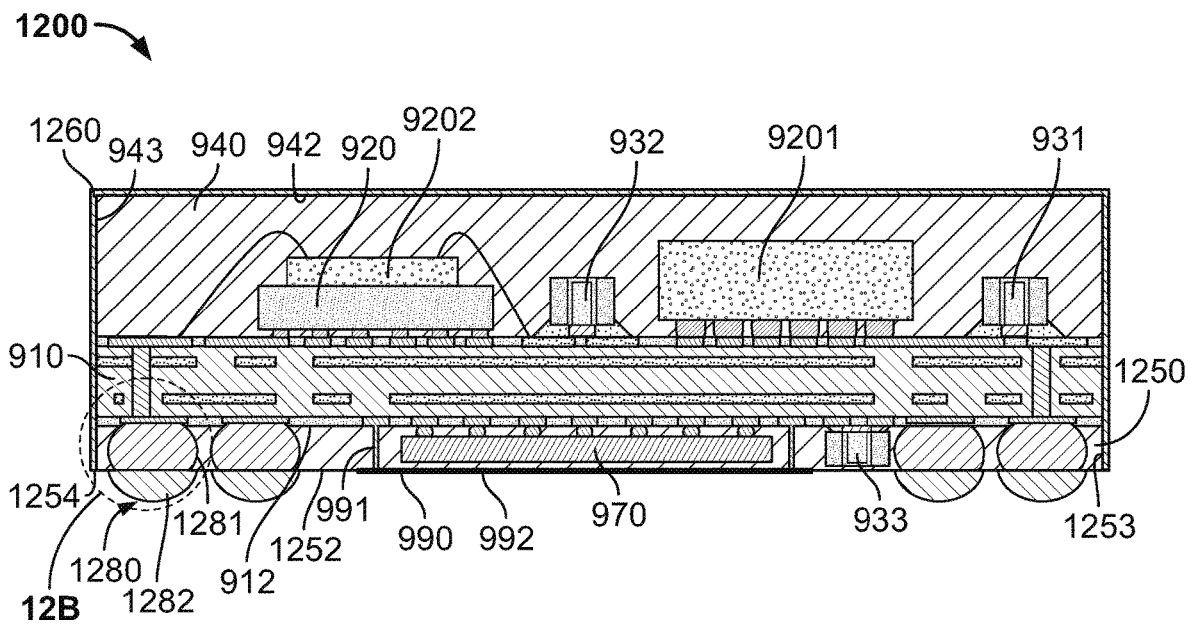
FIG. 12A illustrates a cross-section view of a semiconductor package according to one example.
Figure 12B:
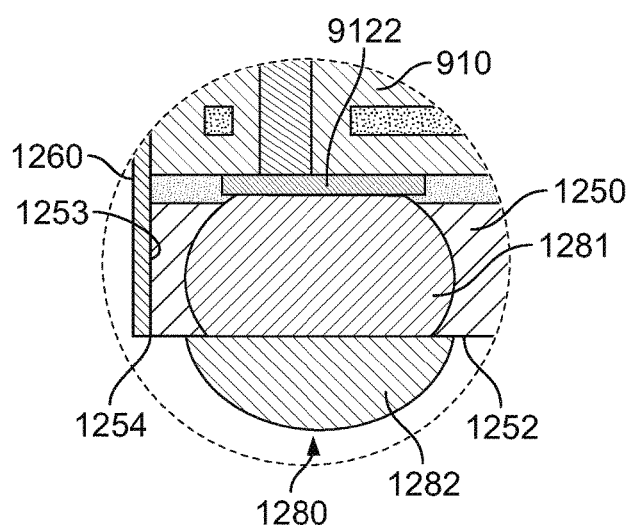
FIG. 12B illustrates a magnified portion of the semiconductor package from FIG. 12A.

FIG. 12A illustrates a cross-section view of semiconductor package 1200 according to one example. FIG. 12B illustrates a magnified portion of semiconductor package 1200 from FIG. 12A. Semiconductor package 1200 and its elements can be similar to any one or more of the other semiconductor packages or their corresponding elements described herein, and characteristics of semiconductor package 1200 are further described below. For example, semiconductor package 1200 can be related to semiconductor package 900 described above, comprising substrate 910, electronic devices 920, 9201, 9202, and 970, passive components 931, 932, and 933, and encapsulant 940, along with corresponding portions and parts of each, and amongst other corresponding features or elements described above with respect to semiconductor package 900. There can be embodiments where semiconductor package 1200 can comprise different combinations of such elements.

Semiconductor package 1200 also comprises external interconnect 1280 having interconnect inner portion 1281 and interconnect distal portion 1282, which can be correspondingly similar to external interconnect 980, interconnect inner portion 981 and interconnect distal portion 982 described above. Furthermore, semiconductor package 1200 comprises encapsulant 1250 that can be similar to encapsulant 950 and its respective elements and portions described above.

Encapsulant 1250 is shown at FIG. 12 encapsulating substrate bottom surface 912, along with any components coupled to it, including electronic device 970 and passive component 933. Although the present example shows encapsulant 1250 covering both lateral and bottom surfaces of such devices and components, there can be examples where the bottom surfaces of one or more of such devices or components may be left exposed by encapsulant 1250. Furthermore, encapsulant 1250 bounds external interconnect 1280 while leaving the distal end of external interconnect 1280 exposed and protruded from encapsulant bottom surface 1252.

FIG. 12B includes a magnified view that presents details of external interconnect 1280 relative to encapsulant 1250. In the present example, encapsulant bottom surface 1252 is coplanar with the bottom of interconnect inner portion 1281, and a top periphery of interconnect distal portion 1282 rests against the portion of encapsulant bottom surface 1252 that bounds the bottom of interconnect inner portion 1281.

FIG. 12 further shows electromagnetic interference (EMI) shield 1260 which is similar to EMI shield 960 described above. EMI shield 1260 covers encapsulant top surface 942 and encapsulant lateral surface 943 of encapsulant 940, and substrate lateral surface 913 of substrate 910. EMI shield 1260 also covers encapsulant lateral surface 1253 of encapsulant 1250 in the present example, and leaves at least a portion of encapsulant bottom surface 1252 exposed such that EMI shield 1260 remains spaced apart from external interconnect 1280.

Semiconductor package 1200 also comprises in the present example compartment shield 990 with compartment lateral barrier 991 and compartment bottom barrier 992, which as described above can be an EMI shield configured to provide EMI protection within a compartment area encompassing one or more components, such as electronic device 970.

Semiconductor package 1200 can be assembled through various stages of assembly, including the initial stages of assembly shown in FIG. 10A-10C. FIGS. 13A-13E illustrate various later stages of assembly subsequent to those of FIGS. 10A-C and leading to semiconductor package 1200 (FIG. 12).

Figure 13A:
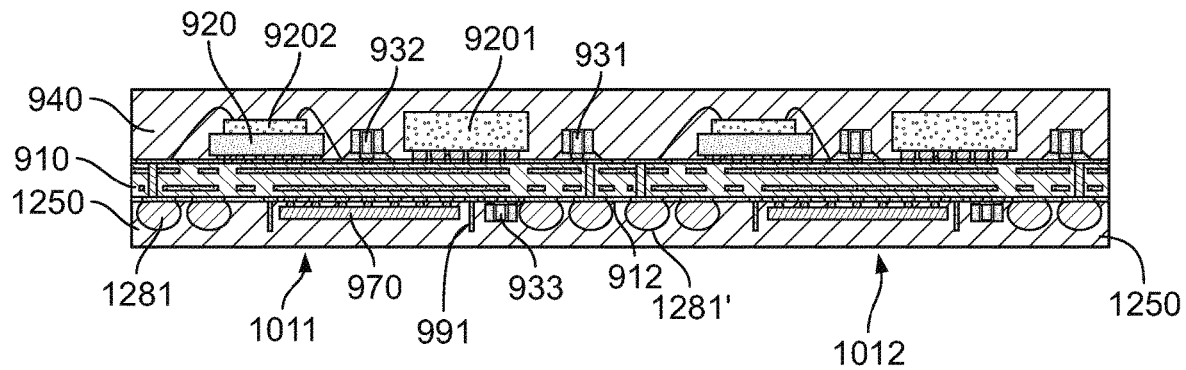
FIGS. 13A-13E illustrate various later semiconductor package assembly leading to the semiconductor package of FIG. 12.

FIG. 13A describes a stage of assembly similar to that of FIG. 11A, but for semiconductor package 1200 (FIG. 12). Interconnect inner portion 1281 of external interconnect 1280 is attached to substrate bottom surface 912 at unit portion 1011, and interconnect inner portion 1281' is attached to substrate bottom surface 912 at unit portion 1012. FIG. 13A also presents encapsulant 1250 applied across and between unit portion 1011 and unit portion 1012 to encapsulate substrate bottom surface 912 and all elements coupled to it, including electronic devices 970 and 970', passive components 933 and 933', and interconnect inner portions 1281 and 1281'. In the present example, encapsulant 1250 is applied to fully encapsulate interconnect inner portion 1281, electronic device 970, and passive component 933, but there can be examples where encapsulant 1250 can be applied leaving the bottom of one or more of such elements exposed. FIG. 13A further presents compartment lateral barriers 991 and 991' attached to substrate bottom surface 912 adjacent a periphery of respective electronic devices 970 and 970' and at least partially encapsulated by encapsulant 1250.

Figure 13B:
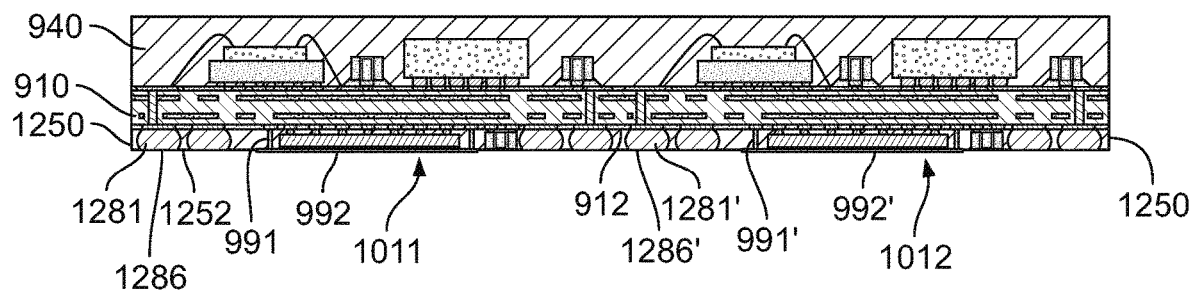

FIG. 13B describes a subsequent stage of assembly, similar to that of FIG. 11B, but for semiconductor package 1200 (FIG. 12). Encapsulant 1250 is partially removed or thinned to expose the bottom of interconnect inner portions 1281 and 1281'. A thinning or planarization process reduces the thickness of encapsulant 1250 until interconnect exposed sections 1286 and 1286' of interconnect inner portions 1281 and 1281' are revealed, being exposed from and coplanar with encapsulant bottom surface 1252 in the present example. In some implementations, the planarization can involve a mechanical grinding process and/or one or more etching stages. In the present example, the planarization also reveals the bottom of compartment lateral barriers 991 and 991'. Compartment bottom barriers 992 and 992' can be applied after such planarization process, respectively covering the areas under electronic device 970 and 970' and respectively in contact with the revealed bottoms of compartment lateral barriers 991 and 991'.

Figure 13C:
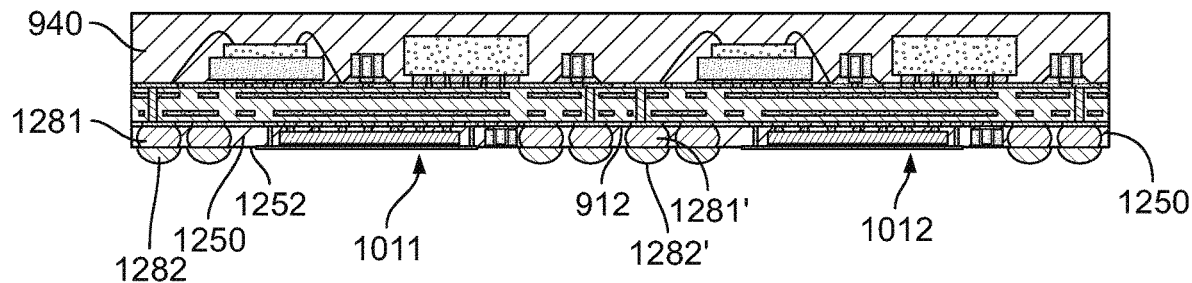

FIG. 13C presents a subsequent stage of assembly, similar to that of FIG. 11C, but for semiconductor package 1200 (FIG. 12). Interconnect distal portions 1282 and 1282' are coupled to interconnect inner portions 1281 and 1281' as exposed by the planarization process of FIG. 13B, and thus protrude further than encapsulant bottom surface 1252. In some examples, interconnect distal portions 1282 and 1282' can be applied using a solder drop or ball drop process, a screen-printing process, or a plating process. In the same or other examples, interconnect distal portions 1282 and 1282' can be at least partially reflowed once attached.

Figure 13D:
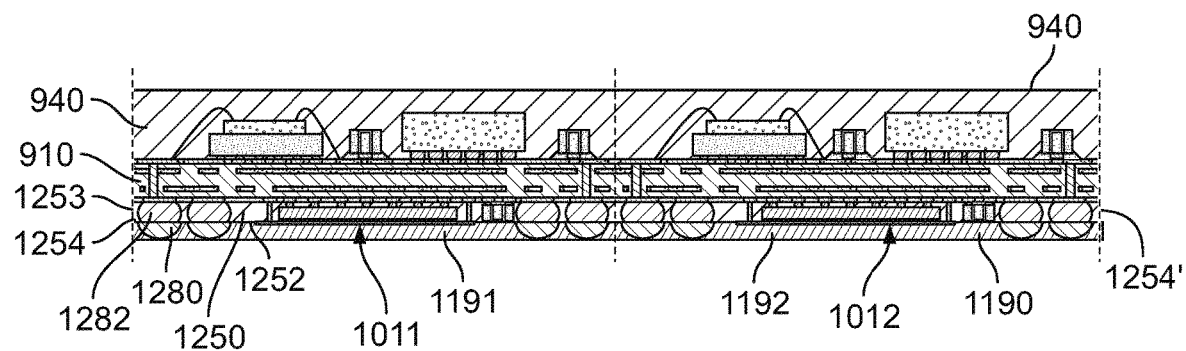

FIG. 13D presents a subsequent stage of assembly, similar to that of FIG. 11D, but for semiconductor package 1200 (FIG. 12). Primary tape 1190 comprises a primary adhesive across its top surface, such that primary tape portion 1191 is adhered under unit portion 1011 and primary tape portion 1192 is adhered under unit portion 1012. Accordingly, the primary adhesive is sealed to encapsulant bottom surface 1252 and to external interconnect 1280, where in the present example interconnect distal portion 1282 protrudes into and/or is encapsulated by a thickness of primary tape 1190.

Subsequent to attachment of primary tape 1190, singulation along the dotted lines shown in FIG. 13D, through encapsulant 940, through substrate 910, and through primary tape 1190, can separate unit portions 1011 and 1012 from each other. Singulation defines encapsulant perimeter edge 1254 of unit portion 1011 at the junction of encapsulant bottom surface 1252 and encapsulant lateral surface 1253. Primary tape portion 1191 remains attached to unit portion 1011 after singulation, with its primary adhesive still hermetically sealed to the bottom of encapsulant bottom surface 1252 and to encapsulant perimeter edge 1254.

Figure 13E:
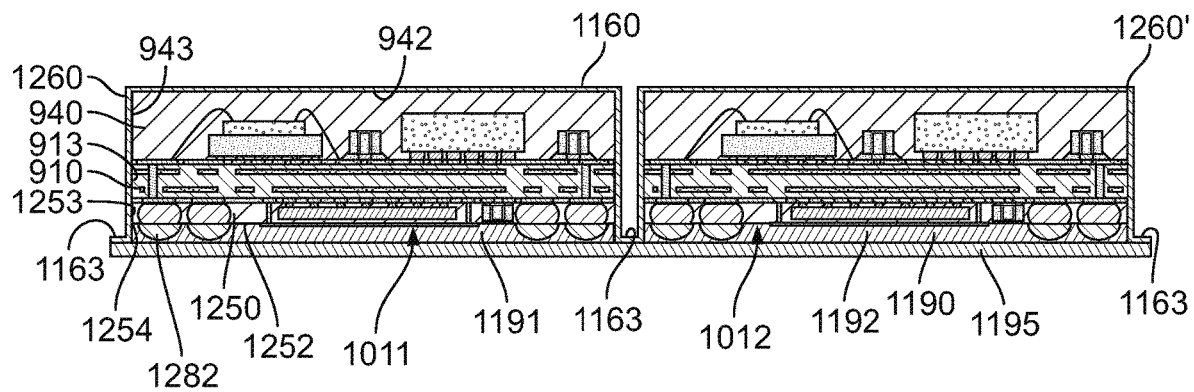

FIG. 13E presents a subsequent stage of assembly, similar to that of FIG. 11E, but for semiconductor package 1200 (FIG. 12). Unit portions 1011 and 1012 are attached to a secondary adhesive of secondary tape 1195. Secondary tape 1195 can be supported by a carrier structure, and unit portions 1011 and 1012, along with corresponding primary tape portions 1191 and 1192, can be pick & placed adjacent to each other on secondary tape 1195 such that the bottom of each of primary tape portions 1191 and 1192 is sealed against the secondary adhesive of secondary tape 1195. Secondary tape 1195 is exposed at a gap that separates primary tape portions 1191 from 1192, and unit portions 1011 from 1012.

With the pick & place operation complete, EMI shield layer 1160 is applied. In the present example, EMI shield layer 1160 is applied as a continuous coating that comprises EMI shield 1260, EMI shied 1260', and remainder EMI shield 1163. EMI shield 1260 covers unit portion 1011, including encapsulant top surface 942, encapsulant lateral surface 943, substrate lateral surface 913, and encapsulant lateral surface 1253. EMI shield 1260' covers corresponding elements of unit portion 1012. Remainder EMI shield 1163 covers a sidewall of primary tape portion 1191, a sidewall of primary tape portion 1192, and secondary tape 1195. In the present example, secondary tape 1195 is covered by remainder EMI shield 1163 wherever exposed from primary tape portions 1191 or 1192, including over the gap that separates primary tape portions 1191 from 1192.

Such an arrangement provides benefits similar to those described above with respect to FIG. 11E, such that the thickness of EMI shield layer 1160 does not bulge but rather remains substantially constant at encapsulant perimeter edge 1254 and across the interface with the primary adhesive of primary tape portion 1191.

With EMI shield layer 1160 applied as shown in FIG. 13E, unit portion 1011 can be pulled from primary tape portion 1191, revealing encapsulant bottom surface 1252 and interconnect distal portion 1282, and bringing EMI shield 1260 along to yield semiconductor package 1200 (FIG. 12). During such removal, primary tape portion 1191 remains attached to secondary tape 1195, and EMI shield layer 1160 ruptures precisely along its interface with the primary adhesive of primary tape portion 1191 to thereby separate EMI shield 1260 from remainder EMI shield 1163. Unit portion 1012 can be similarly pulled from primary tape portion 1192, such that remainder EMI shield 1163 remains attached to primary tape portions 1191 and 1192, and to secondary tape 1195.

The characteristics of primary tape 1190 and secondary tape 1195 remain as described above with respect to FIG. 11E to achieve the constant thickness and controlled rupturing of EMI shield layer 1160, thus permitting increased and consistent coverage of encapsulant lateral surface 1253. Accordingly, no more than an exposed height of 0 to 50 μm, measured vertically from encapsulant bottom surface 1252 and along encapsulant lateral surface 1253, is exposed from EMI shield 1260. This avoids issues where EMI shield layer 1160 ruptures past encapsulant perimeter edge 1254, leaving a dangling portion of EMI shield 1260, and also avoids issues where EMI shield layer 1160 ruptures too far above encapsulant perimeter edge 1254, leaving encapsulant lateral surface 1253 excessively exposed from EMI shield 1260.

Figure 14A:
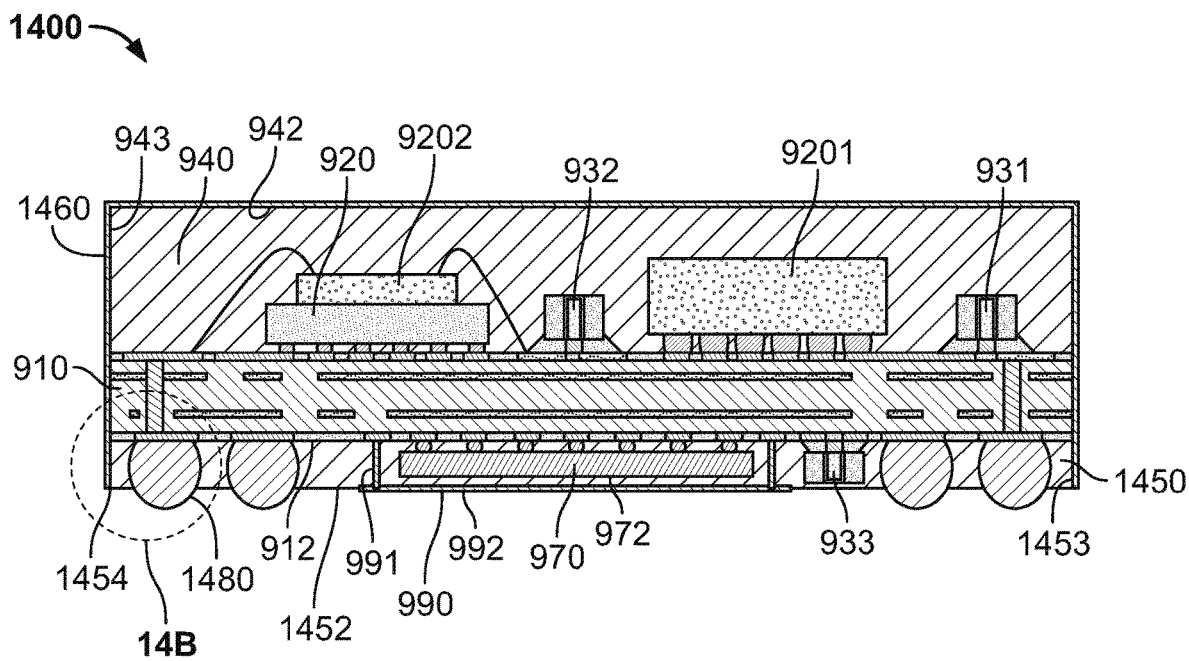
FIG. 14A illustrates a cross-section view of a semiconductor package according to one example.
Figure 14B:
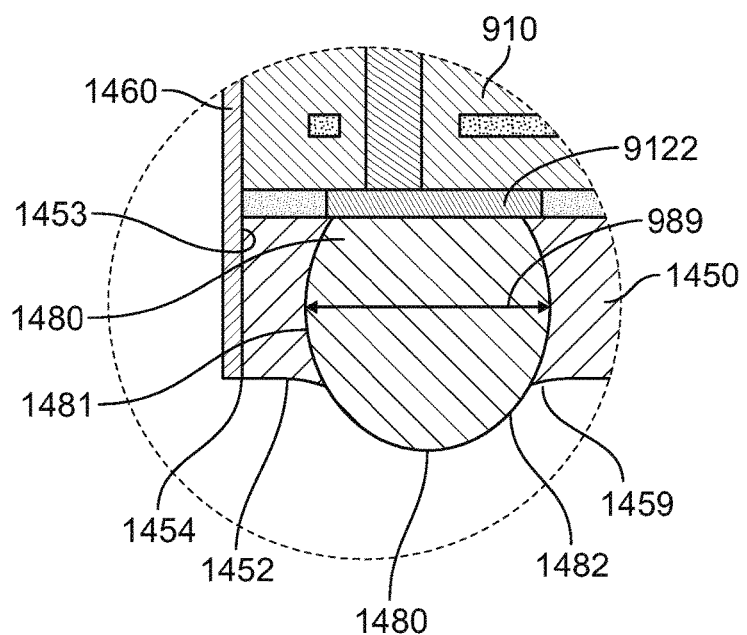
FIG. 14B illustrates a magnified portion of the semiconductor package from FIG. 14A.

FIG. 14A illustrates a cross-section view of semiconductor package 1400 according to one example. FIG. 14B illustrates a magnified portion of semiconductor package 1400 from FIG. 14A. Semiconductor package 1400 and its elements can be similar to any one or more of the other semiconductor packages or their corresponding elements described herein, and characteristics of semiconductor package 1400 are further described below. For example, semiconductor package 1400 can be related to semiconductor package 900 described above, comprising substrate 910, electronic devices 920, 9201, 9202, and 970, passive components 931, 932, and 933, and encapsulant 940, along with corresponding portions and parts of each, and amongst other corresponding features or elements described above with respect to semiconductor package 900. There can be embodiments where semiconductor package 1400 can comprise different combinations of such elements.

Semiconductor package 1400 also comprises external interconnect 1480, which can be similar to external interconnect 980 (FIGS. 9, 11). However, in the present example external interconnect 1480 is shown as a single bump instead of a configuration with dual stacked bumps. Nevertheless, there can be embodiments where external interconnect 1480 can comprise a different configuration, such as dual stacked bumps.

Semiconductor package 1400 also comprises encapsulant 1450 that can be similar to encapsulant 950 (FIGS. 9, 11) and its respective elements and portions described above. Encapsulant 1450 is shown at FIG. 14 encapsulating substrate bottom surface 912, along with any components coupled to it, including electronic device 970 and passive component 933. Although the present example shows encapsulant 1450 covering both lateral and bottom surfaces of such devices and components, there can be examples where the bottom surfaces of one or more of such devices or components may be left exposed by encapsulant 1450. Furthermore, encapsulant 1450 bounds external interconnect 1480 while leaving the distal end of external interconnect 1480 exposed and protruded from encapsulant bottom surface 1452.

FIG. 14 includes a magnified view that presents details of external interconnect 1480 relative to encapsulant 1450. In the present example encapsulant 1450 covers a majority of external interconnect 1480, such that encapsulant bottom surface 1452 extends from substrate bottom surface 912 past a maximum width 1489 of external interconnect 1480. In other examples encapsulant 1450 can cover a minority of external interconnect 1480, such that encapsulant bottom surface extends from substrate bottom surface 912 but does not reach the maximum width of external interconnect 1480. Encapsulant 1450 also exhibits skirt 1459 as a protrusion of encapsulant bottom surface 1452 that bounds the exposed distal end of external interconnect 1480.

FIG. 14 further shows electromagnetic interference (EMI) shield 1460 which is similar to EMI shield 960 described above. EMI shield 1460 covers encapsulant top surface 942 and encapsulant lateral surface 943 of encapsulant 940, and substrate lateral surface 913 of substrate 910. EMI shield 1460 also covers encapsulant lateral surface 1453 of encapsulant 1450 in the present example, and leaves at least a portion of encapsulant bottom surface 1452 exposed such that EMI shield 1460 remains spaced apart from external interconnect 1480.

Semiconductor package 1400 also comprises in the present example compartment shield 990 with compartment lateral barrier 991 and compartment bottom barrier 992, which as described above can be an EMI shield configured to provide EMI protection within a compartment area encompassing one or more components, such as electronic device 970.

Semiconductor package 1400 can be assembled through various stages of assembly, including the initial stages of assembly shown in FIG. 10A-10C. FIGS. 15A-15D illustrate various later stages of assembly subsequent to those of FIGS. 10A-C and leading to semiconductor package 1400 (FIG. 14).

Figure 15A:
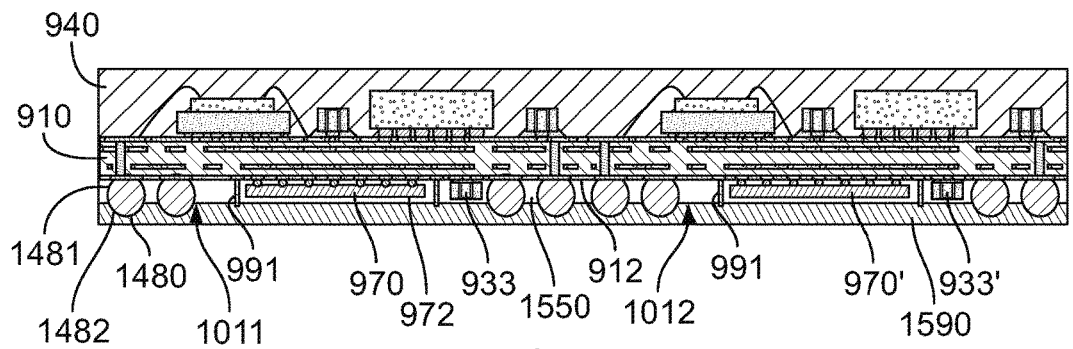
FIGS. 15A-15D illustrate various later semiconductor package assembly leading to the semiconductor package of FIG. 14.

FIG. 15A describes a later stage of assembly for semiconductor package 1400 (FIG. 14). Compartment lateral barriers 991 and 991' are attached to substrate bottom surface 912 adjacent a periphery of respective electronic devices 970 and 970'. External interconnect 1480 are also attached, comprising interconnect inner portion 1481 proximate substrate 910, and interconnect distal portion 1482 distal substrate 910. Film 1590 is applied or suspended under substrate bottom surface 912, covering interconnect distal portion 1482, leaving interconnect inner portion 1481 uncovered, and defining gap 1550 between film 1590 and substrate bottom surface 912. In some implementations, film 1590 also contacts device surface 972 of electronic device 970 when applied. In some examples, film 1590 can comprise a layer or membrane configured to enable film-assist molding.

Figure 15B:
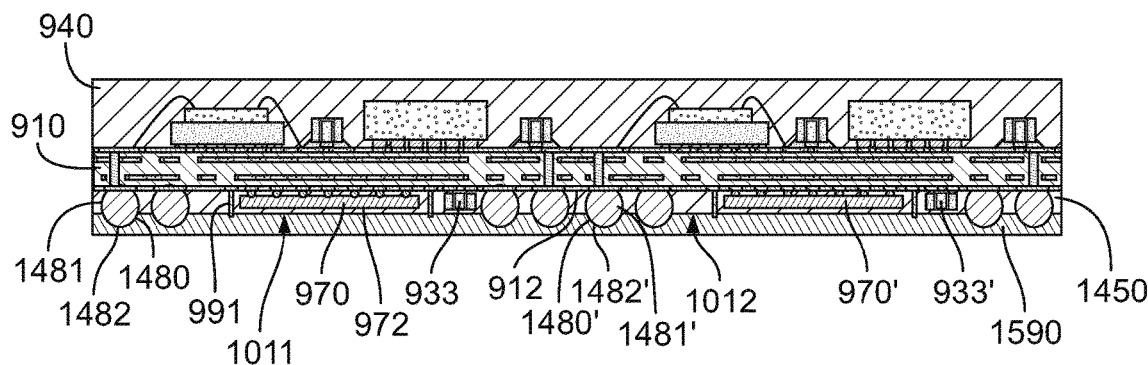

FIG. 15B describes a subsequent stage of assembly for semiconductor package 1400 (FIG. 14). Encapsulant 1450 is applied to fill gap 1550 between film 1590 and substrate bottom surface 912 in a film-assisted molding process. Encapsulant 1450 extends across and between unit portion 1011 and unit portion 1012 to encapsulate substrate bottom surface 912 and all elements coupled to it, including electronic devices 970 and 970', passive components 933 and 933', and interconnect inner portions 1481 and 1481', but leaving interconnect distal portions 1482 and 1482' protruded. Thus, as measured from substrate bottom surface 912, the maximum thickness of encapsulant 1450 remains less than the height of interconnect 1480. In the present example, encapsulant 1450 is applied to fully encapsulate electronic device 970 and passive component 933, but there can be examples where encapsulant 1450 can be applied leaving the bottom of one or more of such elements exposed. For instance, in examples where film 1590 contacts electronic device 970, device surface 972 is left exposed from encapsulant 1450. FIG. 15B further presents compartment lateral barriers 991 and 991' attached to substrate bottom surface 912 and encapsulated by encapsulant 1450.

Figure 15C:
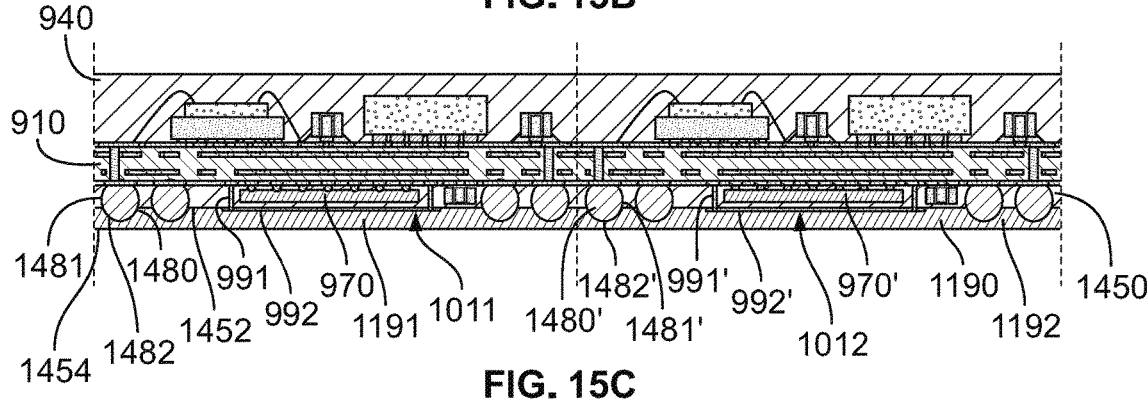

FIG. 15C describes a subsequent stage of assembly, similar to that of FIG. 11D, but for semiconductor package 1400 (FIG. 14). Film 1590 is removed, and compartment bottom barriers 992 and 992' are applied respectively covering the areas under electronic device 970 and 970' and respectively in contact with the revealed ends of compartment lateral barriers 991 and 991'. Primary tape 1190 is shown attached, with its primary adhesive sealed to encapsulant bottom surface 1452 of encapsulant 1450, and to interconnect distal portions 1482 and 1482'. Primary tape 1190 comprises primary tape portion 1191 adhered under unit portion 1011, and primary tape portion 1192 adhered under unit portion 1012. Accordingly, the primary adhesive is sealed to encapsulant bottom surface 1452 and to external interconnect 1480, where in the present example interconnect distal portion 1482 protrudes into and/or is encapsulated by a thickness of primary tape 1190.

Subsequent to attachment of primary tape 1190, singulation along the dotted lines shown in FIG. 15C, through encapsulant 940, through substrate 910, and through primary tape 1190, can separate unit portions 1011 and 1012 from each other. Singulation defines encapsulant perimeter edge 1454 of unit portion 1011 at the junction of encapsulant bottom surface 1452 and encapsulant lateral surface 1453. Primary tape portion 1191 remains attached to unit portion 1011 after singulation, with its primary adhesive still hermetically sealed to the bottom of encapsulant bottom surface 1452 and to encapsulant perimeter edge 1454.

Although FIG. 15C presents primary tape 1190 as distinct from film 1590, there can be examples where film 1590 can comprise or otherwise be the same as primary tape 1190. In such examples, film 1590 need not be removed and replaced with primary tape 1190, since both would be the same.

Figure 15D:
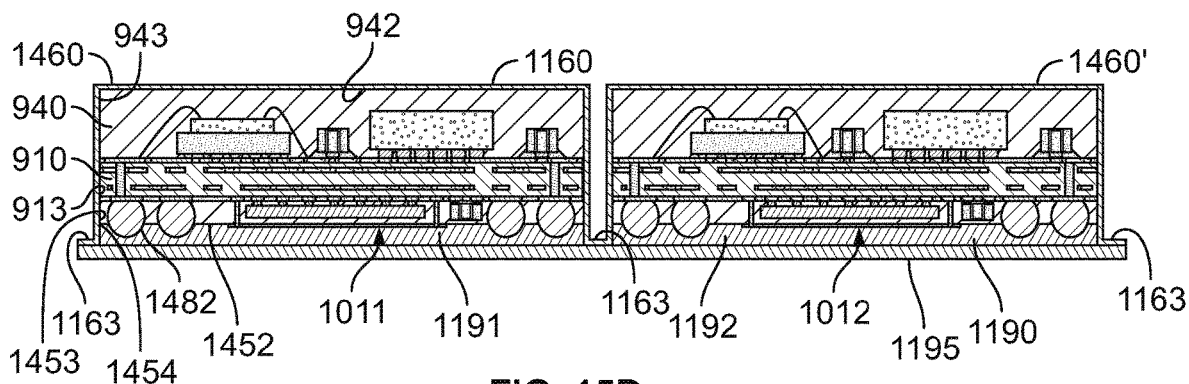

FIG. 15D presents a subsequent stage of assembly, similar to that of FIG. 11E, but for semiconductor package 1400 (FIG. 14). Unit portions 1011 and 1012 are attached to a secondary adhesive of secondary tape 1195. Secondary tape 1195 can be supported by a carrier structure, and unit portions 1011 and 1012, along with corresponding primary tape portions 1191 and 1192, can be pick & placed adjacent to each other on secondary tape 1195 such that the bottom of each of primary tape portion 1191 and 1192 is sealed against the secondary adhesive of secondary tape 1195. Secondary tape 1195 is exposed at a gap that separates primary tape portions 1191 from 1192, and unit portions 1011 from 1012.

With the pick & place operation complete, EMI shield layer 1160 is applied. In the present example, EMI shield layer 1160 is applied as a continuous coating that comprises EMI shield 1460, EMI shied 1460', and remainder EMI shield 1163. EMI shield 1460 covers unit portion 1011, including encapsulant top surface 942, encapsulant lateral surface 943, substrate lateral surface 913, and encapsulant lateral surface 1453. EMI shield 1460' covers corresponding elements of unit portion 1012. Remainder EMI shield 1163 covers a sidewall of primary tape portion 1191, a sidewall of primary tape portion 1192, and secondary tape 1195. In the present example, secondary tape 1195 is covered by remainder EMI shield 1163 wherever exposed from primary tape portions 1191 or 1192, including over the gap that separates primary tape portions 1191 from 1192.

Such an arrangement provides benefits similar to those described above with respect to FIG. 11E, such that the thickness of EMI shield layer 1160 does not bulge but rather remains substantially constant at encapsulant perimeter edge 1454 and across the interface with the primary adhesive of primary tape portion 1191.

With EMI shield layer 1160 applied as shown in FIG. 15D, unit portion 1011 can be pulled from primary tape portion 1191, revealing encapsulant bottom surface 1452 and interconnect distal portion 1482, and bringing EMI shield 1460 along to yield semiconductor package 1400 (FIG. 14). During such removal, primary tape portion 1191 remains attached to secondary tape 1195, and EMI shield layer 1160 ruptures precisely along its interface with the primary adhesive of primary tape portion 1191 to thereby separate EMI shield 1460 from remainder EMI shield 1163. Unit portion 1012 can be similarly pulled from primary tape portion 1192, such that remainder EMI shield 1163 remains attached to primary tape portions 1191 and 1192, and to secondary tape 1195.

The characteristics of primary tape 1190 and secondary tape 1195 remain as described above with respect to FIG. 11E to achieve the constant thickness and controlled rupturing of EMI shield layer 1160, thus permitting increased and consistent coverage of encapsulant lateral surface 1453. Accordingly, no more than an exposed height of 0 to 50 µm, measured vertically from encapsulant bottom surface 1452 and along encapsulant lateral surface 1453, is exposed from EMI shield 1460. This avoids issues where EMI shield layer 1160 ruptures past encapsulant perimeter edge 1454, leaving a dangling portion of EMI shield 1460, and also avoids issues where EMI shield layer 1160 ruptures too far above encapsulant perimeter edge 1454, leaving encapsulant lateral surface 1453 excessively exposed from EMI shield 1460.

Figure 16:
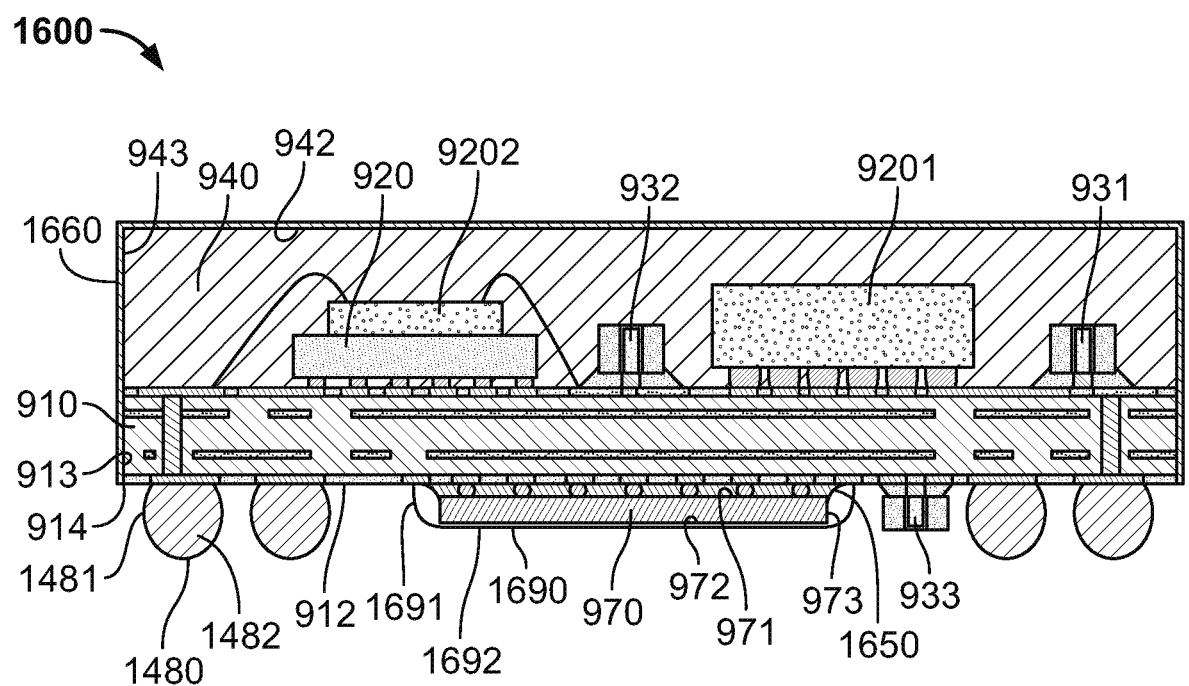
FIG. 16 illustrates a cross-section view of a semiconductor package according to one example.

FIG. 16 illustrates a cross-section view of semiconductor package 1600 according to one example. Semiconductor package 1600 and its elements can be similar to any one or more of the other semiconductor packages or their corresponding elements described herein, and characteristics of semiconductor package 1600 are further described below. For example, semiconductor package 1600 can be related to semiconductor package 900 described above, comprising substrate 910, electronic devices 920, 9201, 9202, and 970, passive components 931, 932, and 933, and encapsulant 940, along with corresponding portions and parts of each, and amongst other corresponding features or elements described above with respect to semiconductor package 900. There can be embodiments where semiconductor package 1600 can comprise different combinations of such elements.

Semiconductor package 1600 also comprises external interconnect 1480, as described above with respect to FIG. 14-15. Although external interconnect 1480 is shown as a single bump, there can be embodiments where it can comprise a different configuration, such as dual stacked bumps.

Semiconductor package 1400 also comprises encapsulant 1650 in the present example, which can be similar in some respects to encapsulant 950 (FIGS. 9, 11) and its respective elements and portions described above. However, encapsulant 1650 differs in the present example by encapsulating the gap between substrate bottom surface 912 and device surface 971 of electronic device 970, along with the bumps of electronic device 970, but being spaced apart from external interconnect 1480. In the present example, encapsulant 1650 also extends partially along device lateral surface 973, and there can be examples where encapsulant 1650 can further fully cover device lateral surface 973 and/or device surface 972 of electronic device 970.

Encapsulant 1650 can comprise one or more materials, such as an epoxy, a thermoplastic material, a thermally curable material, polyimide, polyurethane, a polymeric material, and/or one or more of the materials described above with respect to encapsulant 950. In some examples, encapsulant 1650 can be referred as an underfill, such as a capillary underfill that flows due to capillary action, or a molded underfill that is injected or otherwise applied in a molding process. There can also be examples where encapsulant 1650 can be a pre-applied underfill, such as a non-conductive paste (NCP) or non-conductive film (NCF), that can be applied (e.g., printed, sprayed, adhered) prior to coupling electronic device 970.

FIG. 16 further shows electromagnetic interference (EMI) shield 1660 which is similar to EMI shield 960 described above. EMI shield 1660 covers encapsulant top surface 942 and encapsulant lateral surface 943 of encapsulant 940, and substrate lateral surface 913 of substrate 910.

Semiconductor package 1600 also comprises in the present example compartment shield 1690, similar to compartment shield 990, which as described above can be an EMI shield configured to provide EMI protection within a compartment area encompassing one or more components, such as electronic device 970. Compartment shield 1690 is defined by compartment lateral barrier 1691 and compartment bottom barrier 1692, which in the present example comprise a continuous piece of material that bounds both device surface 972 and device surface 973 of electronic device 970. In some examples, compartment shield 1690 can comprise a metallic can or cover. In other examples, such as where encapsulant 1650 fully covers device lateral surface 973 and device surface 972 of electronic device 970, compartment shield 1690 can be one or more wires wirebonded as a wire cage to substrate bottom surface 912 from one side to a different side of electronic device 970. There can be examples, however, where compartment shield 1690 can be like compartment shield 990, having compartment lateral barrier 991 and compartment bottom barrier 992 of different or non-continuous materials.

Semiconductor package 1600 can be assembled through various stages of assembly, including the initial stages of assembly shown in FIG. 10A-10C. FIGS. 17A-17C illustrate various later stages of assembly subsequent to those of FIGS. 10A-C and leading to semiconductor package 1600 (FIG. 16).

FIG. 17A describes a later stage of assembly for semiconductor package 1600 (FIG. 16). External interconnect 1480 is coupled and comprises interconnect inner portion 1481 proximate substrate 910, and interconnect distal portion 1482 distal substrate 910. Compartment shield 1690 is also shown coupled to substrate bottom surface 912 around electronic device 970, but there can be implementations where compartment shield 1690 can be attached at a later stage if desired.

FIG. 17B describes a subsequent stage of assembly, similar to that of FIG. 11D, but for semiconductor package 1600 (FIG. 16). Primary tape 1190 is shown attached, with its primary adhesive sealed to substrate bottom surface 912 of substrate 910, and to external interconnect 1480. Primary tape 1190 comprises primary tape portion 1191 adhered under unit portion 1011, and primary tape portion 1192 adhered under unit portion 1012. External interconnect 1480 and electronic device 970 protrude into primary tape 1190 such that both are fully embedded within its primary adhesive.

Subsequent to attachment of primary tape 1190, singulation along the dotted lines shown in FIG. 17B, through encapsulant 940, through substrate 910, and through primary tape 1190, can separate unit portions 1011 and 1012 from each other. Singulation defines substrate perimeter edge 914 of unit portion 1011 at the junction of substrate bottom surface 912 and substrate lateral surface 913. Primary tape portion 1191 remains attached to unit portion 1011 after singulation, with its primary adhesive still hermetically sealed to the bottom of encapsulant bottom surface 1452 and to encapsulant perimeter edge 1454.

FIG. 17C presents a subsequent stage of assembly, similar to that of FIG. 11E, but for semiconductor package 1600 (FIG. 16). Unit portions 1011 and 1012 are attached to a secondary adhesive of secondary tape 1195. Secondary tape 1195 can be supported by a carrier structure, and unit portions 1011 and 1012, along with corresponding primary tape portions 1191 and 1192, can be pick & placed adjacent to each other on secondary tape 1195 such that the bottom of each of primary tape portion 1191 and 1192 is sealed against the secondary adhesive of secondary tape 1195. Secondary tape 1195 is exposed at a gap that separates primary tape portions 1191 from 1192, and unit portions 1011 from 1012.

With the pick & place operation complete, EMI shield layer 1160 is applied. In the present example, EMI shield layer 1160 is applied as a continuous coating that comprises EMI shield 1660, EMI shied 1660', and remainder EMI shield 1163. EMI shield 1660 covers unit portion 1011, including encapsulant top surface 942, encapsulant lateral surface 943, and substrate lateral surface 913. EMI shield 1660' covers corresponding elements of unit portion 1012. Remainder EMI shield 1163 covers a sidewall of primary tape portion 1191, a sidewall of primary tape portion 1192, and secondary tape 1195. In the present example, secondary tape 1195 is covered by remainder EMI shield 1163 wherever exposed from primary tape portions 1191 or 1192, including over the gap that separates primary tape portions 1191 from 1192.

Such an arrangement provides benefits similar to those described above with respect to FIG. 11E, such that the thickness of EMI shield layer 1160 remains substantially constant at substrate perimeter edge 914 and across the interface with the primary adhesive of primary tape portion 1191.

In particular, because the sidewall of primary tape portion 1191 is coplanar with substrate lateral surface 913, EMI shield layer 1160 does not bend at substrate perimeter edge 914 but rather continues in a substantially straight plane from substrate lateral surface 913 to the sidewall of primary tape portion 1191. Without such bend, which would normally happen if the interface between primary tape 1190 and substrate lateral surface 913 were instead at a right angle, EMI shield layer 1160 does not accumulate or bulge adjacent substrate perimeter edge 914. Accordingly, the thickness of EMI shield layer 1160 remains substantially constant at substrate perimeter edge 914 and across the interface with the primary adhesive of primary tape portion 1191.

With EMI shield layer 1160 applied as shown in FIG. 17C, unit portion 1011 can be pulled from primary tape portion 1191, thus revealing substrate bottom surface 912 and external interconnect 1480, and bringing EMI shield 1660 along to yield semiconductor package 11600 (FIG. 16). During such removal, primary tape portion 1191 remains attached to secondary tape 1195, and EMI shield layer 1160 ruptures precisely along its interface with the primary adhesive of primary tape portion 1191 to thereby separate EMI shield 1660 from remainder EMI shield 1163. Unit portion 1012 can be similarly pulled from primary tape portion 1192, such that remainder EMI shield 1163 remains attached to primary tape portions 1191 and 1192, and to secondary tape 1195. In some implementations, compartment shield 1690 can be applied after removal of unit portion 1011 from primary tape portion 1191.

The characteristics of primary tape 1190 and secondary tape 1195 remain as described above with respect to FIG. 11E to achieve the constant thickness and controlled rupturing of EMI shield layer 1160, thus permitting increased and consistent coverage of substrate lateral surface 913. Accordingly, no more than an exposed height of 0 to 50 μm, measured vertically from substrate bottom surface 912 and along substrate lateral surface 913, is exposed from EMI shield 1660. This avoids issues where EMI shield layer 1160 ruptures past substrate perimeter edge 914, leaving a dangling portion of EMI shield 1660, and also avoids issues where EMI shield layer 1160 ruptures too far above substrate perimeter edge 914, leaving substrate lateral surface 913 excessively exposed from EMI shield 1660.

FIG. 18 illustrates a cross-section view of semiconductor package 1800 according to one example. Semiconductor package 1800 and its elements can be similar to any one or more of the other semiconductor packages or their corresponding elements described herein, and characteristics of semiconductor package 1800 are further described below. For example, semiconductor package 1800 can be related to semiconductor package 900 described above, comprising substrate 910, electronic devices 920, 9201, 9202, and 970, passive components 931, 932, and 933, and encapsulant 940, along with corresponding portions and parts of each, and amongst other corresponding features or elements described above with respect to semiconductor package 900. There can be embodiments where semiconductor package 1800 can comprise different combinations of such elements. The manner construction for features of semiconductor package 1800 also can be similar to that for corresponding features of one or more of the other semiconductor packages described herein.

Semiconductor package 1800 comprises electronic device 1875, which is coupled between electronic device 970 and substrate 910. Electronic device 1875 can be similar to electronic device 970, as shown in FIG. 18, but there can also be examples where electronic device 1875 can be similar to, for instance, passive device 933. Electronic device 1875 is coupled to device surface 971 of electronic device 970, using flipchip bumps in the present example.

Semiconductor package 1800 also comprises electronic device 1876, which is coupled between electronic device 970 and substrate 910. Electronic device 1875 can be similar to electronic device 1875, but it is coupled instead to substrate bottom surface 912 in the present example. There also can be examples where electronic device 1875 and/or 1876 are omitted.

Semiconductor package 1800 also comprises external interconnect 1480, which is presented as a solder ball bump in the present example. As described above, external interconnect 1480 can be similar to external interconnect 980, including any of the interconnect options described with respect to external interconnect 980 or any of the other external interconnects described herein. For instance, semiconductor package 1800 comprises external interconnect 1880, also similar to external interconnect 980, but presented as a metallic post with solder tip in accordance with one of the interconnect options described for external interconnect 980.

Semiconductor package 1800 further comprises EMI shield 1460, compartment shield 990, and encapsulant 1850, which can be similar to one or more of the corresponding bottom encapsulants described above. There can be other examples where one or more of such elements may be omitted or replaced. For instance, one example can omit encapsulant 1850, and/or EMI shield 1460 can instead be replaced with a shield similar to EMI shield 1660 (FIG. 16-17). The same or other examples can omit compartment shield 990, or can replace compartment shield 990 with a compartment shield similar to compartment shield 1690 (FIG. 16-17).

Figure 19:
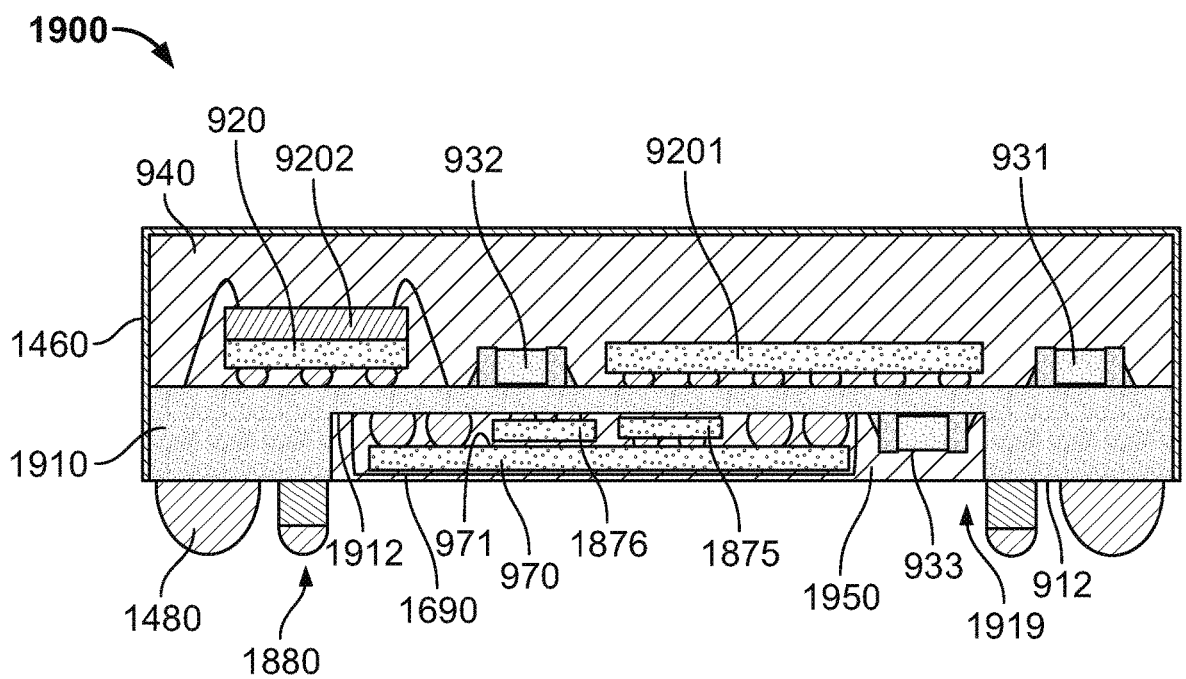
FIG. 19 illustrates a cross-section view of a semiconductor package according to one example.

FIG. 19 illustrates a cross-section view of semiconductor package 1900 according to one example. Semiconductor package 1900 is similar to semiconductor package 1800 (FIG. 18), but comprises substrate 1910 instead. Substrate 1910 can be similar to substrate 910, but comprises substrate cavity 1919 into which one or more elements can be coupled to further decrease the height of package 1900. Substrate bottom section 1912 of substrate 1910 defines a base of substrate cavity 1919, and can be considered a portion of substrate bottom surface 912. In the present example, electronic devices 970, 1875, 1876, and passive component 933 are inserted into substrate cavity 1919, but there can be examples where one or more need not be inserted. There can be examples where at least a portion of one or more of such inserted components can protrude outside substrate cavity 1919. Substrate cavity 1919 is at least partially filled by encapsulant 1950, which can be similar to encapsulant 1850 but extends only under substrate bottom section 1912. Encapsulant 1950 at least partially encapsulates the elements inserted into substrate cavity 1919, but there can be embodiments where encapsulant 1950 can be omitted. Semiconductor package 1900 also is shown with compartment shield 1690 in substrate cavity 1919, but there can be examples where compartment shield 1690 can be omitted or replaced with a compartment shield similar to compartment shield 990.

Figure 20:
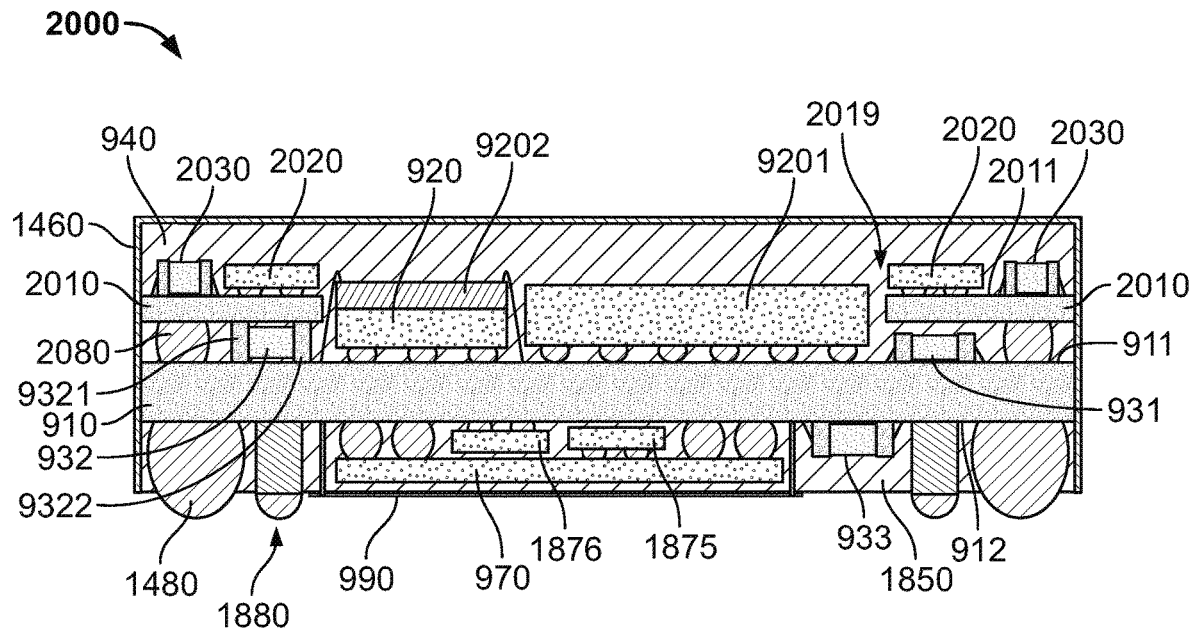
FIG. 20 illustrates a cross-section view of a semiconductor package according to one example.

FIG. 20 illustrates a cross-section view of semiconductor package 2000 according to one example. Semiconductor package 2000 is similar to semiconductor package 1800 (FIG. 18), but comprises substrate 2010 coupled to substrate top surface 911 of substrate 910. Substrate 2010 can be similar to substrate 910, but comprises substrate aperture 2019 that extends throughout a thickness of substrate 2010 and that at least partially bounds a portion of one or more elements of semiconductor package 2000. For instance, electronic devices 920, 9201, and 9202 are bounded within substrate aperture 2019, and can thus protrude through it away from substrate 910 further than the bottom surface of substrate 2010. Substrate top surface 2011 of substrate 2010 can be used for coupling further elements of semiconductor package 2000, such as electronic devices 2020, which can be similar to electronic device 920, or passive components 2030, which can be similar to passive component 931, 932, or 933. In the present example, substrate 2010 is coupled to substrate 910 through interconnect 2080, which can be similar to interconnect 1480 or to one or more of the interconnects described herein. Passive component 932 is shown between substrate 910 and substrate 2010, and in the present example includes terminals 9321 and 9322 that each contact both the top of substrate 910 and the bottom of substrate 2010. Terminal 9321 and/or terminal 9322 of passive component 932 can thus be used as interconnects, similar to, in combination with, and/or instead of interconnect 2080, to transmit signals or voltages between substrate 910 and substrate 2010.

Figure 21:
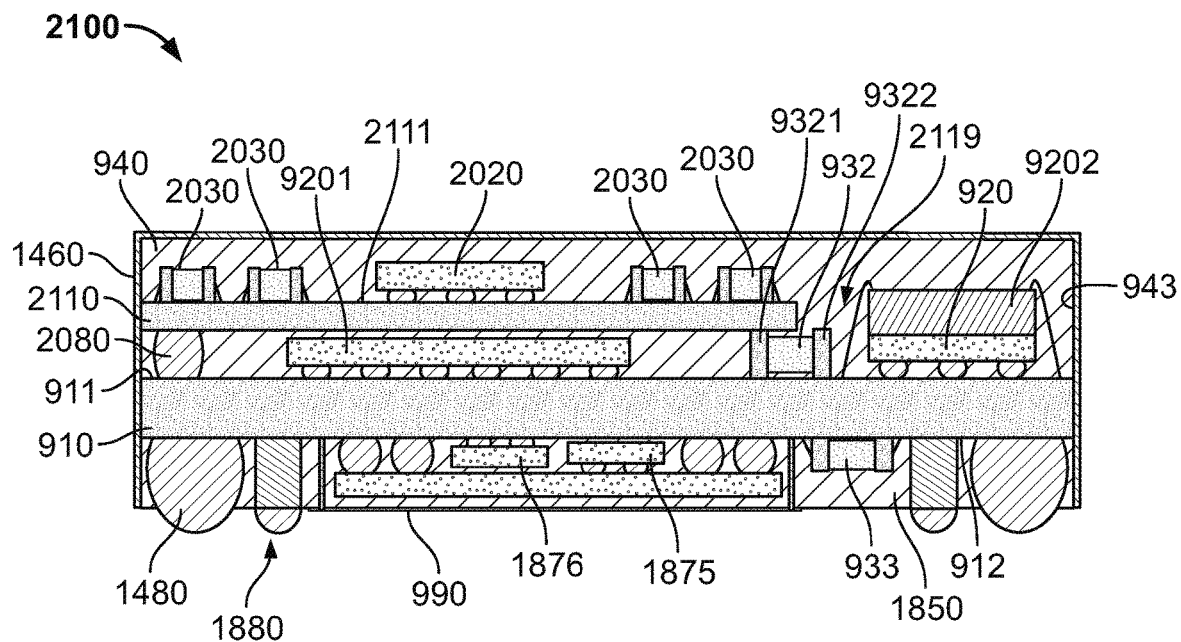
FIG. 21 illustrates a cross-section view of a semiconductor package according to one example.

FIG. 21 illustrates a cross-section view of semiconductor package 2100 according to one example. Semiconductor package 2100 is similar to semiconductor package 2000 (FIG. 20), but comprises substrate 2110 coupled to substrate top surface 911 of substrate 910. Substrate 2110 can be similar to substrate 910, but leaves substrate gap 2119 open above substrate 910, from a lateral surface of substrate 2110 to encapsulant lateral surface 943. Substrate gap 2119 can at least partially bound a portion of one or more elements of semiconductor package 2100. For instance, electronic devices 920 and 9202 are bounded within substrate gap 2119, and can thus protrude through it away from substrate 910 further than the bottom surface of substrate 2110. Substrate top surface 2111 of substrate 2110 can be used for coupling further elements of semiconductor package 2100, such as electronic devices 2020 or passive components 2030. In the present example, substrate 2110 is coupled to substrate 910 through interconnect 2080. Passive component 932 is shown between substrate 910 and substrate 2110, where at least terminal 9321 of passive component 932 contacts both the top of substrate 910 and the bottom of substrate 2110. Thus, at least terminal 9321 of passive component 932 can be used as interconnect, similar to, in combination with, and/or instead of interconnect 2080, to transmit signals or voltages between substrate 910 and substrate 2110.

Figure 22A:
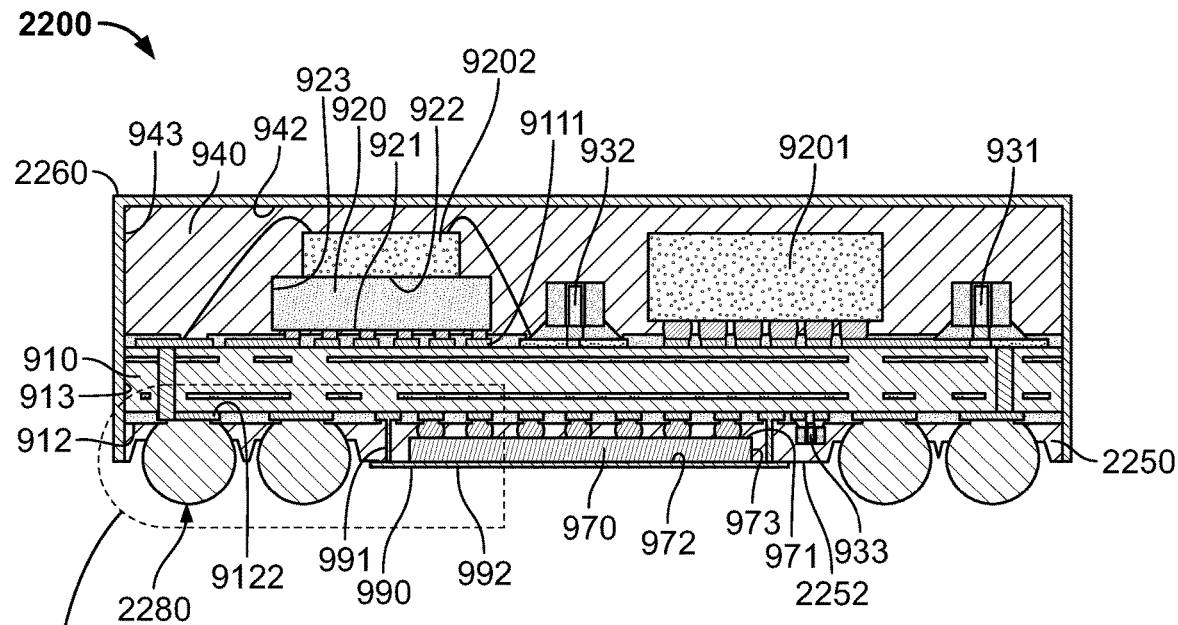
FIG. 22A illustrates a cross-section view of a semiconductor package according to one example.
Figure 22B:
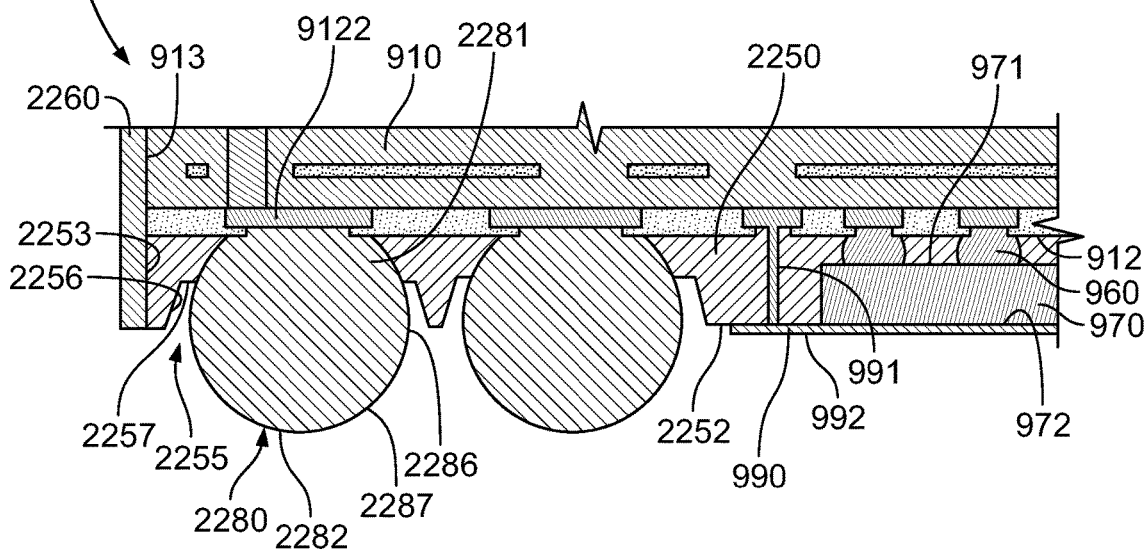
FIG. 22B illustrates a magnified portion of the semiconductor package from FIG. 22A.

FIG. 22A illustrates a cross-section view of semiconductor package 2200 according to one example. FIG. 22B illustrates a magnified portion of semiconductor package 2200 from FIG. 22A. Semiconductor package 2200 and its elements can be similar to any one or more of the other semiconductor packages or their corresponding elements described herein, and characteristics of semiconductor package 2200 are further described below. For example, semiconductor package 2200 can be related to semiconductor package 900, comprising substrate 910, electronic devices 920, 9201, 9202, and 970, passive components 931, 932, and 933, and encapsulant 940, along with corresponding portions and parts of each, and amongst other corresponding features or elements of any of the semiconductor packages herein described. There can be embodiments where semiconductor package 2200 can comprise different combinations of such elements.

Semiconductor package 2200 also comprises external interconnect 2280 coupled to substrate bottom second pad 9122, which can also be referred as an interconnect pad. Interconnect 2280 comprises interconnect inner portion 2281 and interconnect distal portion 2282, which can be correspondingly similar to external interconnect 980, interconnect inner portion 981 and interconnect distal portion 982 described above. Furthermore, semiconductor package 2200 comprises encapsulant 2250 that can be similar to encapsulant 950 and its respective elements and portions described above. Interconnect 2280 comprises interconnect protruded section 2287 that protrudes past encapsulant bottom surface 2252.

Encapsulant 2250 is shown at FIG. 22 encapsulating substrate bottom surface 912, along with any components coupled to it, including electronic device 970 and passive component 933. In the present example, encapsulant 2250 is shown covering lateral surfaces of both electronic device 970 and passive component 933, and the bottom surface of passive component 933, while leaving the bottom surface of electronic device 970 exposed. In some examples, the encapsulant 2250 can also leave the bottom surface of passive component 933 exposed as well. Encapsulant 2250 also bounds external interconnect 2280, leaving distal portion 2282 of external interconnect 2280 exposed encapsulant 2250, and leaving interconnect protruded section 2287 protruded from encapsulant bottom surface 2252.

FIG. 22 includes a magnified view that presents details of external interconnect 2280, encapsulant 2250, and electronic device 970 relative to each other. In the present example, encapsulant bottom surface 2252 is coplanar with device bottom surface 972 of electronic device 970. Encapsulant 2250 also comprises via 2255 that bounds interconnect 2280. Via 2255 comprises via wall 2256 and via ledge 2257 in the present example, but there can be other instances where via ledge 2257 can be omitted such that the inner end of via wall 2256 would contact interconnect 2280.

FIG. 22 further shows electromagnetic interference (EMI) shield 2260, which is similar to EMI shield 960 described above. EMI shield 2260 covers encapsulant top surface 942 and encapsulant lateral surface 943 of encapsulant 940, and substrate lateral surface 913 of substrate 910. EMI shield 2260 also covers encapsulant lateral surface 2253 of encapsulant 2250 in the present example, and leaves at least a portion of encapsulant bottom surface 2252 exposed such that EMI shield 2260 remains spaced apart from external interconnect 2280.

Semiconductor package 2200 also comprises in the present example compartment shield 990 with compartment lateral barrier 991 and compartment bottom barrier 992, which as previously described can be an EMI shield configured to provide EMI protection within a compartment area encompassing one or more components, such as electronic device 970. Because device bottom surface 972 of electronic device 970 is exposed in the present example, compartment bottom barrier 992 can be formed on and/or can contact such exposed device bottom surface 972. In other examples, a dielectric layer different than encapsulant 2250 can be provided on the exposed device surface 972, and compartment bottom barrier 992 can then be formed on such dielectric layer.

Semiconductor package 2200 can be assembled through various stages of assembly, including the initial stages of assembly shown in FIG. 10A-10C. FIGS. 23A-23E illustrate various later stages of assembly subsequent to those of FIGS. 10A-C and leading to semiconductor package 2200 (FIG. 22).

Figure 23A:
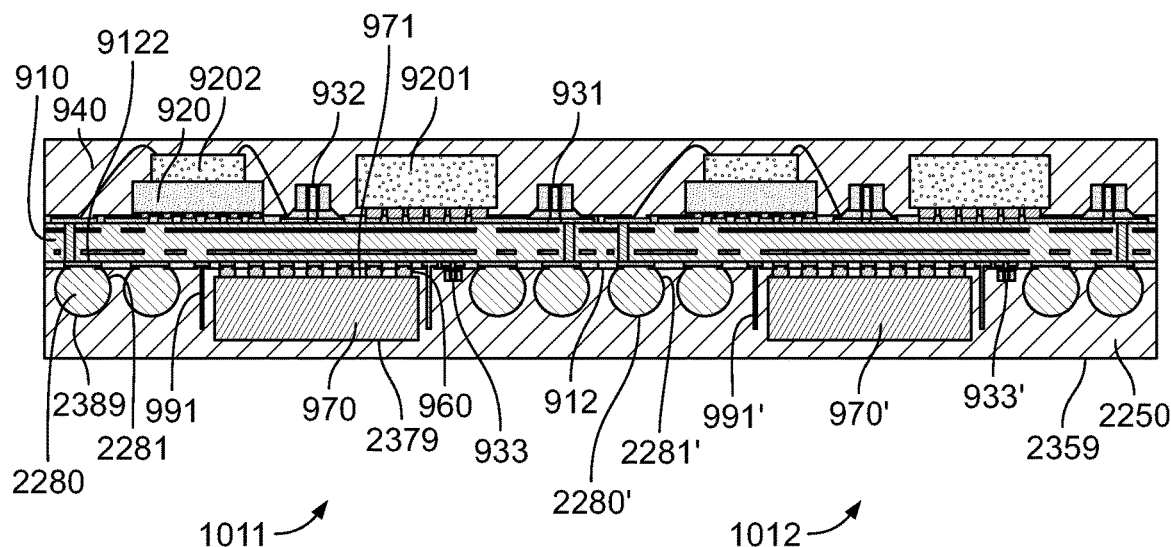
FIGS. 23A-23E illustrate various later semiconductor package assembly leading to the semiconductor package of FIG. 22.

FIG. 23A describes a stage of assembly that can be similar to that of FIG. 13A, but for semiconductor package 2200 (FIG. 22). Interconnect inner portion 2281 of external interconnect 2280 is attached to substrate bottom surface 912 at unit portion 1011, and interconnect inner portion 2281' is attached to substrate bottom surface 912 at unit portion 1012. FIG. 23A also presents encapsulant 2250 applied across and between unit portion 1011 and unit portion 1012 to encapsulate substrate bottom surface 912 and all elements coupled to it, including electronic devices 970 and 970', passive components 933 and 933', and interconnect inner portions 2281 and 2281'. FIG. 23A further presents compartment lateral barriers 991 and 991' attached to substrate bottom surface 912 adjacent a periphery of respective electronic devices 970 and 970' and encapsulated by encapsulant 2250.

In the present example, electronic device 970 comprises a device initial thickness, measured from device surface 971 to device initial bottom 2379, when initially coupled to substrate bottom surface 912. Such device initial thickness is greater than the device final thickness of electronic device 970 shown in FIG. 22 (measured from device surface 971 to device surface 972). As will be further explained below, such device initial thickness will be later reduced to permit minimization of the overall thickness of semiconductor package 2200. Accordingly, electronic device 970 can be more safely handled and processed, with its larger and more structurally robust device initial thickness, prior to and during coupling to substrate bottom surface 912. This reduces the risk of damage, breakage, and/or yield loss that could ensue if electronic device 970 were instead similarly handled and processed with the thinner and less structurally resilient device final thickness. In some examples, the device initial thickness or electronic device 970 can be between 125 µm to 175 µm, such as approximately 150 µm. In the same or other examples, the device initial thickness can comprise a thickness of a semiconductor wafer on which electronic device 970 was formed. Electronic device 970 can be coupled to substrate 910 via respective bumps that can define a bump gap, between device surface 971 and substrate bottom surface 912, of between 30 µm to 50 µm, such as approximately 40 µm.

Encapsulant 2250 is applied to fully encapsulate interconnect 2280, electronic device 970, and passive component 933. Encapsulant initial bottom 2359 thus extends past, and has a greater height (measured from substrate bottom surface 912), than interconnect initial bottom 2389 and than device initial bottom 2379. Once attached to substrate bottom second pad 9122, the initial height of interconnect 2280 measured at interconnect initial bottom 2389, can be between 140 µm to 170 µm, such as approximately 150 µm. The height of device initial bottom 2379, which is defined by bumps and the device initial thickness of electronic device 970, can be between 165 µm to 215 µm, such as approximately 190 µm. Accordingly, the height of device initial bottom 2379 can be greater than the height of interconnect initial bottom 2389.

Figure 23B:
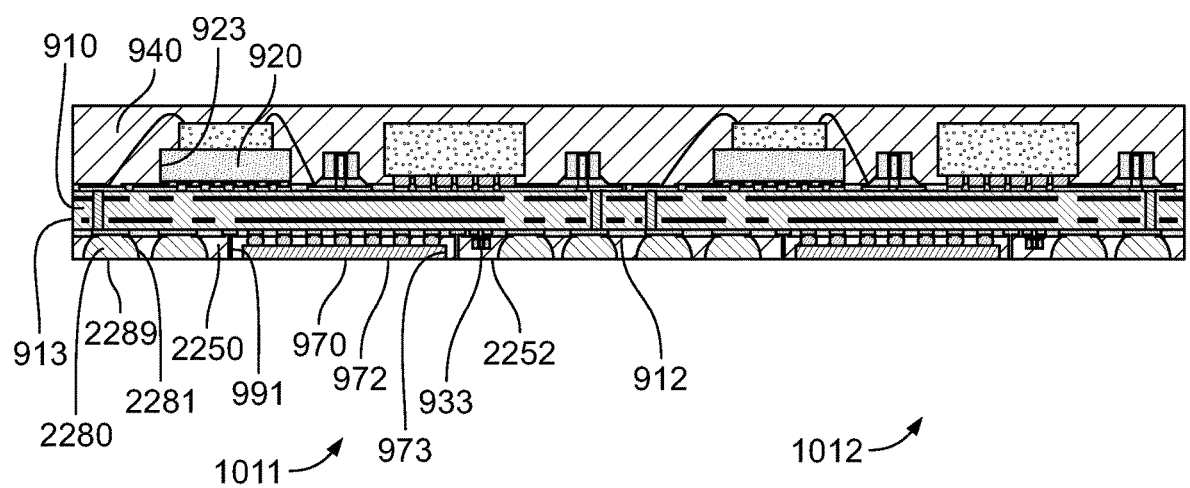

FIG. 23B describes a subsequent stage of assembly that can be similar to that of FIG. 13B, but for semiconductor package 2200 (FIG. 22). Encapsulant 2250 is partially removed or thinned to expose the bottom of interconnect inner portion 2281 of interconnect 2280, and device bottom surface 972 of electronic device 970. The thinning or planarization process reduces the thickness of encapsulant 2250, of interconnect 2280, and of electronic device 970, until encapsulant bottom surface 2252, interconnect intermediate surface 2289, and device bottom surface 972 are revealed at the desired minimal height and coplanar to each other. In some implementations, the planarization can involve a mechanical grinding process and/or one or more etching stages. In the present example, the planarization also reveals the bottom of compartment lateral barrier 991.

Electronic device 970 can thus be thinned to its device final thickness during the thinning process while supported by substrate 910 and encapsulated by encapsulant 2250, thereby permitting enhanced minimization of the height of device bottom surface 972 relative to substrate bottom surface 912. Such enhanced height minimization would not be practical or feasible without unacceptable risk of damage if instead electronic device 970 had to be pre-thinned to the same extent before being handled and coupled to substrate bottom surface 912.

In some examples, after the thinning process, the height of device bottom surface 972, of encapsulant bottom surface 2252, and of interconnect intermediate surface 2289, can be between 90 µm to 110 µm, such as approximately 100 µm. In the same or other examples, after the thinning process, the device final thickness of electronic device 970 is minimized such that its device lateral surface 973 can be between 50 µm to 65 µm, such as approximately 60 µm. Compared to the device initial thickness, such device final thickness represents a thickness reduction of at least 60% and even up to 71% without compromising the integrity of electronic device 970. Such thinning process can permit the device final thickness of electronic device 970 to be safely minimized to, for instance, at most twice the height of the bump gap defined by bumps. In the same or other examples, such thinning process can permit electronic device 970 to be safely minimized to such an extent that device lateral surface 923 of electronic device 920 can be at least approximately 1.6 times vertically greater than device lateral surface 973 of electronic device 970. In the same or other examples, such thinning process can permit electronic device 970 to be safely minimized to such an extent that that substrate lateral surface 913 can be vertically at least approximately 2 times greater than device lateral surface 973.

Figure 23C:
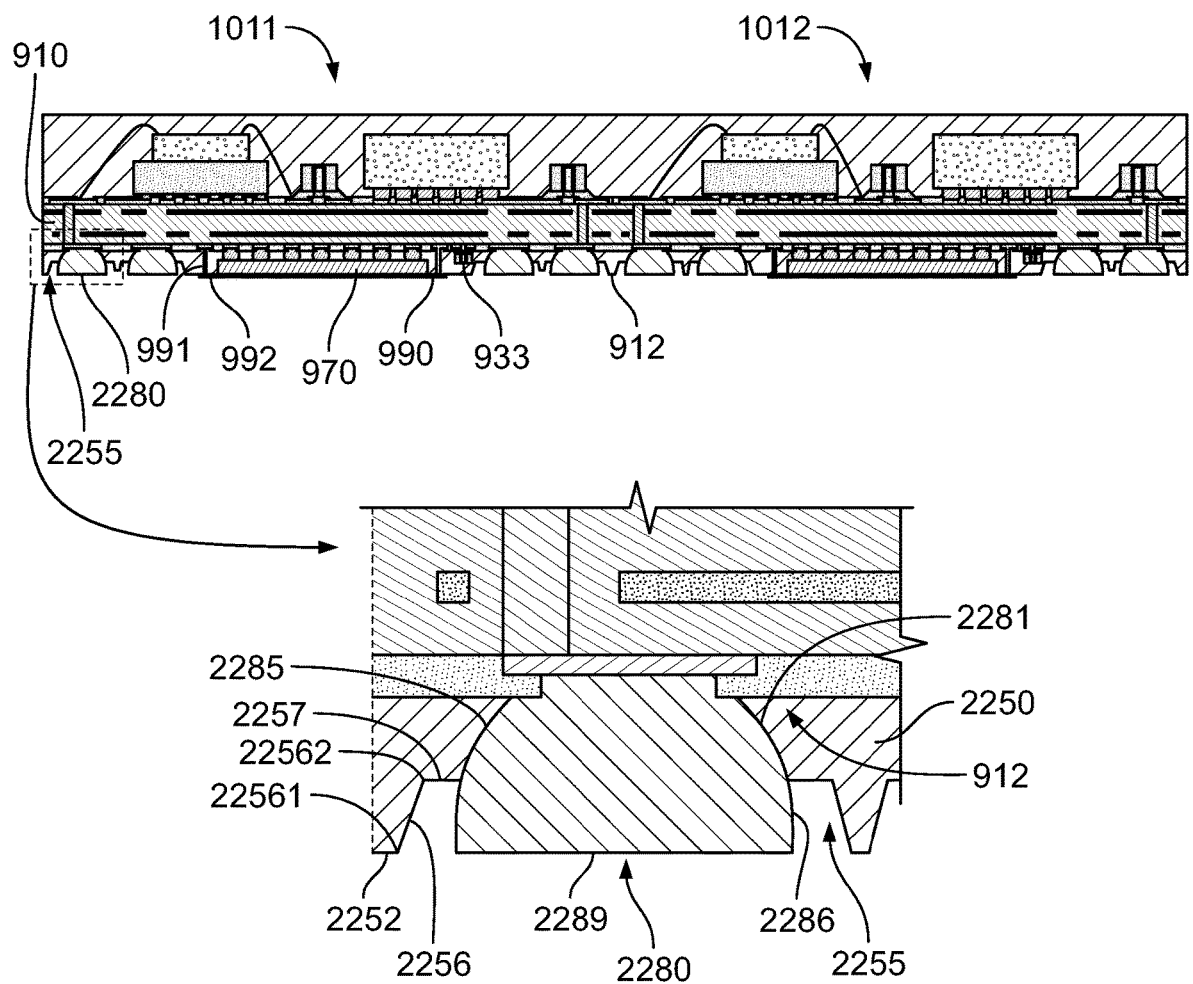

FIG. 23C presents a subsequent stage of assembly that can be similar to that of FIG. 11B, but for semiconductor package 2200 (FIG. 22). Via 2255 is formed into encapsulant bottom surface 2252, and extends towards substrate bottom surface 912. In some examples, via 2255 can be formed by laser ablation, by mechanical ablation, and/or by etching ablation into encapsulant 2250. Via wall 2256 is thus formed extending from encapsulant bottom surface 2252 towards substrate bottom surface 912, where via wall 2256 defines a volume that bounds interconnect bounded section 2286 of interconnect 2280. In the present example, via wall 2256 remains separated from interconnect bounded section 2286 after the ablation.

As can also be seen in the present example, the ablation can define the diameter of via wall opening 22561 to be greater than the diameter of via wall base 22562. Furthermore, in the present example via wall 2256 does not extend all the way to substrate bottom surface 912. Instead, the ablation can define via ledge 2257 that extends from interconnect 2280 to via wall base 2252, where via ledge 2257 defines a via ledge plane that can be substantially parallel to encapsulant bottom surface 2252. Thus, interconnect 2280 can comprise interconnect encapsulated section 2285 that is encapsulated in contact with encapsulant 2250 between the via ledge plane and substrate bottom surface 912.

Compartment bottom barrier 992 is shown applied after the planarization process, covering the area under electronic device 970 and in contact with the revealed bottoms of compartment lateral barrier 991. In some examples, a layer of dielectric material can also be applied to lie between the area under electronic device 970 and compartment bottom barrier 992. The application of compartment bottom barrier can be carried out at a later stage instead if desired. In other examples, compartment shield 990 and/or compartment bottom barrier 992 can be omitted.

Figure 23D:
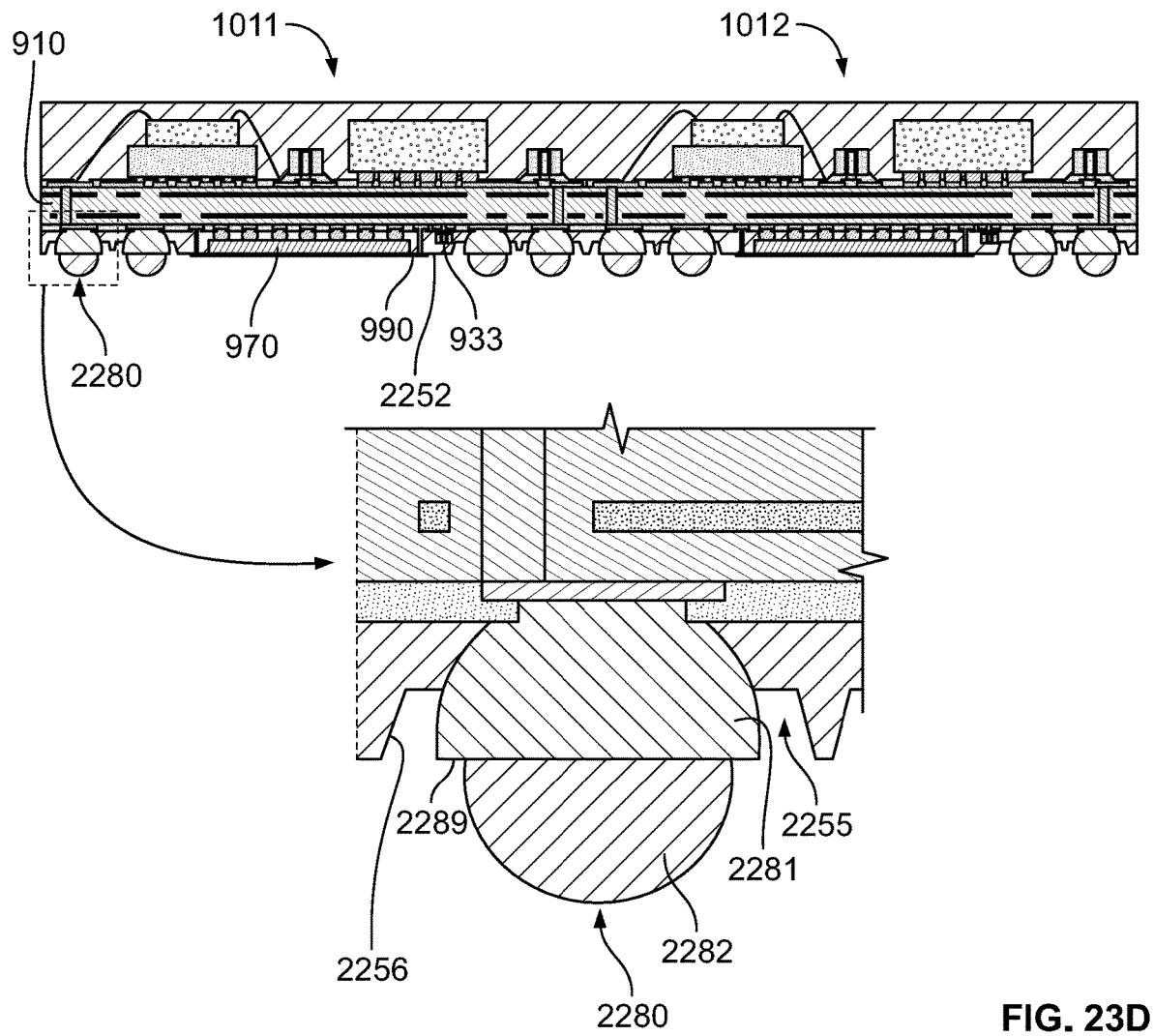

FIG. 23D presents a subsequent stage of assembly that can be similar to that of FIG. 13C, but for semiconductor package 2200 (FIG. 22). Interconnect distal portion 2282 is coupled to interconnect intermediate surface 2289 of interconnect inner portion 2281 as exposed by the process of FIGS. 23B-C, and thus protrudes further than encapsulant bottom surface 2252. In some examples, interconnect distal portion 2282 can be applied using a solder drop or ball drop process, a screen-printing process, or a plating process. In the same or other examples, interconnect distal portion 2282 can be at least partially reflowed once attached.

In the present example, interconnect inner portion 2281 comprises a volume greater than a volume of interconnect distal portion 2282, such that the perimeter of interconnect distal portion 2282 is bounded within the area of interconnect intermediate surface 2289. Accordingly, the material of interconnect distal portion 2282 tends not to overflow into via 2255, such that separation between via wall 2256 and interconnect bounded section 2286 remains.

Figure 23E:
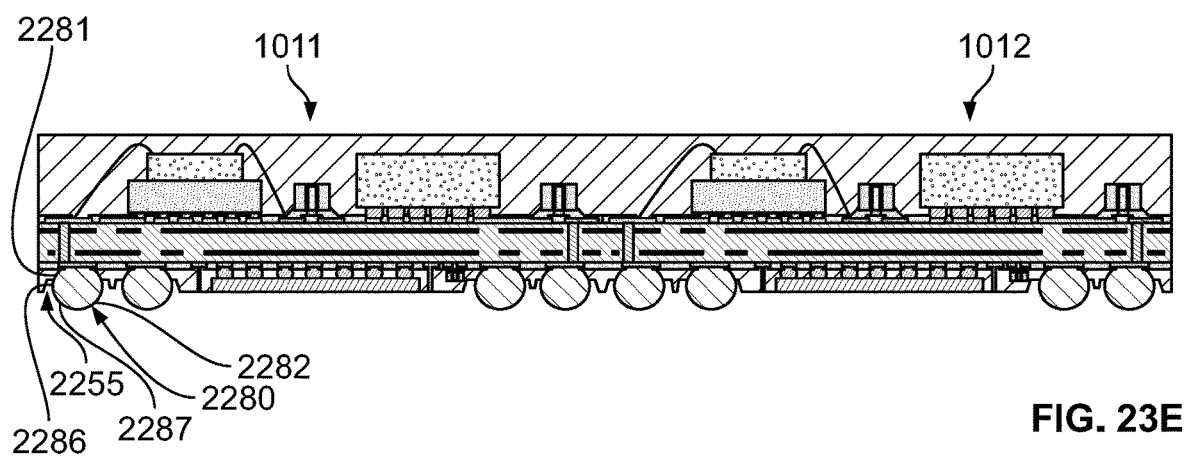

FIG. 23E presents a subsequent stage of assembly for semiconductor package 2200 (FIG. 22). Interconnect inner portion 2281 and interconnect distal portion 2282 are shown reflowed with each other, with their respective volumes combined to define a final interconnect volume and height of interconnect 2280, where interconnect protruded section 2287 protrudes past encapsulant bottom surface 2252 by at least 50 μm for proper clearance when connecting to external substrates or devices. In particular, interconnect distal portion 2282 applied in FIG. 23D can be configured such that, when reflowed with interconnect inner portion 2281 in FIG. 23E, the final volume and/or height of interconnect 2280 can be substantially the same or similar, within 5%, of the initial volume and/or height of interconnect 2280 originally applied in FIG. 23A.

During the reflow process, the separation between via wall 2256 and interconnect bounded section 2286 permits interconnect inner portion 2281 and interconnect distal portion 2282 to reflow freely with each other. This feature reduces stiction that would otherwise deform or limit the final shape and height of interconnect 2280, and limits any "blow up" or eruption of the material of interconnect 2280 that would tend to eject by pressure when constrained by what would otherwise be a narrower aperture in encapsulant bottom surface 2252. Such feature also permits a tighter pitch to be achieved between adjacent interconnects 2280. For example, less than half of the initial height of interconnect 2280 can be thinned in FIG. 23B, leaving at least half of its initial volume and height still encapsulated, because later in FIG. 23C via 2255 expands the narrow encapsulant aperture that could otherwise create said blow up problems. Accordingly, a smaller interconnect diameter can initially be used when interconnect 2280 is applied in FIG. 23A, leading to tighter interconnect pitch. Nevertheless, if desired, larger initial diameter interconnects 2280 can be used, and/or such interconnects can be thinned in FIG. 23B by more than half of the initial height of interconnect 2280, while still benefiting from the reduction in stiction.

Further stages of assembly can be carried out to yield package 2200 as shown in FIG. 22, by forming EMI shield 2260 in a process similar to, for example, any of those described above for any of the EMI shields described herein, such as with respect to FIGS. 11D-11E for EMI shield 960.

The discussion herein included numerous illustrative figures that showed various portions of an electronic package assembly and method of manufacturing thereof. For illustrative clarity, such figures did not show all aspects of each example assembly. Any of the example assemblies and/or methods provided herein may share any or all characteristics with any or all other assemblies and/or methods provided herein.

In summary, various aspects of this disclosure provide a semiconductor package and a method of manufacturing a semiconductor package. As a non-limiting example, various aspects of this disclosure provide a semiconductor package, and method of manufacturing thereof, that comprises shielding on multiple sides thereof. While the foregoing has been described with reference to certain aspects and examples, it will be understood by those skilled in the art that various changes may be made and equivalents may be substituted without departing from the scope of the disclosure. In addition, many modifications may be made to adapt a particular situation or material to the teachings of the disclosure without departing from its scope. For example, to provide sufficient volume to encapsulate the respective protruded portions of interconnect 980 (FIG. 9, 11), interconnect 1280 (FIG. 12, 13), or interconnect 1480 (FIG. 14-21) within the primary adhesive of primary tape 1190, the thickness of such primary adhesive can be varied as needed to be greater than such protruded interconnect portions and often greater than the thickness of the base layer of primary tape 1190. Because the secondary adhesive of secondary tape 1195 does not encapsulate such different interconnects, its thickness need not vary across different examples and/or can remain thinner than the thickness of the primary adhesive of primary tape 1190.

In light of the above, it is intended that the disclosure not be limited to the particular example(s) disclosed, but that the disclosure will include all examples falling within the scope of the appended claims.

The invention claimed is:

1. A method of manufacture comprising:
   providing a substrate having:
      a substrate top surface having a substrate top first pad and a substrate top second pad,
      a substrate bottom surface having a substrate third pad and a substrate interconnect pad, and
      a substrate lateral surface;
   providing a first device on the substrate top surface and coupled to the substrate top first pad, the first device comprising:
      a first device bottom surface facing the substrate top surface,
      a first device lateral surface, and
      a first device top surface facing away from the substrate top surface;
   providing a second device component coupled to the substrate top second pad;

providing a first encapsulant to encapsulate the substrate top surface, the first device, and the second device, the first encapsulant having:
a first encapsulant top surface, and
a first encapsulant lateral surface;
attaching a third device to the substrate third pad on the substrate bottom surface, the third device comprising:
a third device top surface facing the substrate bottom surface,
a third device lateral surface, and
a third device bottom surface facing away from the substrate bottom surface;
providing a first interconnect on the substrate bottom surface and coupled to the substrate interconnect pad, the first interconnect comprising an interconnect protruded section and providing external interface to the semiconductor package;
and
applying a second encapsulant to encapsulate the substrate bottom surface and at least partially the third device and the first interconnect, the second encapsulant comprising:
a second encapsulant bottom surface, and
a second encapsulant lateral surface;
wherein:
the interconnect protruded section protrudes past the second encapsulant bottom surface;
at least one of the first, second, or third devices is an electronic device; and
at least one of the first, second, or third devices is a passive component.

2. The method of claim 1, wherein:
the third device is a thinned device, with its third device bottom surface planarized, such that the first device lateral surface is at least 1.6 times vertically greater than the third device lateral surface.

3. The method of claim 1, wherein:
attaching the third device comprises:
attaching the third device having a third device initial bottom;
providing the first interconnect comprises:
providing the first interconnect having a first interconnect initial bottom;
providing the second encapsulant comprises:
providing the second encapsulant having a second encapsulant initial bottom;
wherein a height of the second encapsulant initial bottom is:
greater than a height of the third device initial bottom; and
greater than a height of the first interconnect initial bottom.

4. The method of claim 3, wherein:
the height of the third device initial bottom is greater than the height of the first interconnect initial bottom.

5. The method of claim 1, comprising:
thinning the third device, the first interconnect, and the second encapsulant to reveal, coplanar to each other:
the third device bottom surface;
a first interconnect intermediate surface; and
the second encapsulant bottom surface.

6. The method of claim 1, comprising:
thinning the first interconnect and the second encapsulant to reveal, coplanar to each other:
a first interconnect intermediate surface; and
the second encapsulant bottom surface.

7. The method of claim 6, comprising:
attaching a first interconnect distal portion to the first interconnect intermediate surface,
wherein the first interconnect comprises a first interconnect inner portion bounded by the second encapsulant between the first interconnect intermediate surface and the substrate.

8. The method of claim 7, comprising:
reflowing the first interconnect inner portion and the first interconnect distal portion together to define the first interconnect, such that the first interconnect protruded section protrudes past the second encapsulant bottom surface by at least 50 μm.

9. The method of claim 8, wherein:
prior to the thinning, the first interconnect comprises a first interconnect initial height; and
after the reflowing, a combined final height of the first interconnect inner portion and of the first interconnect distal portion is within 5% of the first interconnect initial height.

10. The method of claim 7, wherein:
a volume of the first interconnect inner portion is greater than a volume of the first interconnect distal portion.

11. The method of claim 1, comprising:
thinning the first interconnect and the second encapsulant coplanar to each other; and
ablating into the second encapsulant after the thinning, comprising:
forming a via wall that extends from the second encapsulant bottom surface towards the substrate bottom surface and defines a volume that bounds an interconnect bounded section of the first interconnect:
wherein the via wall is spaced apart from the interconnect bounded section.

12. The method of claim 11, wherein:
a diameter defined by an opening of the via wall is greater than a diameter defined by a base of the via wall.

13. The method of claim 11, wherein:
the ablating into the second encapsulant comprises:
forming a via ledge that extends from the first interconnect to the via wall and defines a via ledge plane substantially parallel to the encapsulant bottom surface;
and
the first interconnect comprises:
an interconnect encapsulated section in contact with the second encapsulant and extending between the via ledge plane and the substrate bottom surface.

14. The method of claim 1, wherein:
the third device is a thinned device, with its third device bottom surface planarized, such that the third device lateral surface is up to approximately 60 μm vertically.

15. The method of claim 1, wherein:
the third device is a thinned device, with its third device bottom surface planarized, such that the substrate lateral surface is vertically at least 2 times the third device lateral surface.

16. The method of claim 1, wherein:
a bump couples the third device to the substrate bottom surface and defines a bump gap between the third device top surface and the substrate bottom surface; and
the third device is a thinned device, with its third device bottom surface planarized, such that the third device lateral surface is vertically at most twice the bump gap.

17. A method of manufacture comprising:
providing a substrate having
  a substrate top surface having a substrate top first pad and a substrate top second pad,
  a substrate bottom surface having a substrate third pad and a substrate interconnect pad, and
  a substrate lateral surface;
providing a first device on the substrate top surface and coupled to the substrate top first pad, the first device comprising:
  a first device bottom surface facing the substrate top surface,
  a first device lateral surface, and
  a first device top surface facing away from the substrate top surface;
providing a second device component coupled to the substrate top second pad;
providing a first encapsulant that encapsulates the substrate top surface, the first device, and the second device,
the first encapsulant having:
  a first encapsulant top surface, and
  a first encapsulant lateral surface;
providing a third device on the substrate bottom surface and coupled to the substrate third pad, the third device comprising:
  a third device top surface facing the substrate bottom surface,
  a third device lateral surface, and
  a third device bottom surface facing away from the substrate bottom surface;
providing a first interconnect on the substrate bottom surface and coupled to the substrate interconnect pad, the first interconnect comprising an interconnect protruded section and providing external interface to the semiconductor package;
providing a second encapsulant that encapsulates the substrate bottom surface and at least partially the third device and the first interconnect, the second encapsulant comprising:
  a second encapsulant bottom surface, and
  a second encapsulant lateral surface;
and
providing a first electromagnetic interference (EMI) shield that bounds at least:
  the first encapsulant top surface,
  the first encapsulant lateral surface, and
  the substrate lateral surface;
wherein:
  the third device bottom surface is exposed from the second encapsulant;
  the interconnect protruded section protrudes past the second encapsulant bottom surface;
  at least one of the first, second, or third devices is an electronic device; and
  at least one of the first, second, or third devices is a passive component.

18. The method of claim 17, further comprising:
providing a bottom electromagnetic interference (EMI) shield that:
  surrounds the third device lateral surface;
  extends through the second encapsulant, from the substrate bottom surface toward the second encapsulant bottom surface; and
  is exclusive of sheet metal.

19. The method of claim 1, further comprising providing a first electromagnetic interference (EMI) shield that bounds at least:
  a portion of the first encapsulant top surface, and
  a portion of the first encapsulant lateral surface.

20. The method of claim 1, wherein the third device bottom surface is exposed from the second encapsulant.

* * * * *